(12) United States Patent
Koldiaev

(10) Patent No.: US 8,189,376 B2
(45) Date of Patent: May 29, 2012

(54) INTEGRATED CIRCUIT HAVING MEMORY CELLS INCLUDING GATE MATERIAL HAVING HIGH WORK FUNCTION, AND METHOD OF MANUFACTURING SAME

(75) Inventor: Viktor Koldiaev, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 202 days.

(21) Appl. No.: 12/363,841

(22) Filed: Feb. 2, 2009

(65) Prior Publication Data

US 2009/0200612 A1 Aug. 13, 2009

Related U.S. Application Data

(60) Provisional application No. 61/065,025, filed on Feb. 8, 2008.

(51) Int. Cl.
*G11C 11/34* (2006.01)
*H01L 27/12* (2006.01)

(52) U.S. Cl. ............ 365/174; 438/149; 365/72; 257/347

(58) Field of Classification Search .................... 365/174
See application file for complete search history.

(56) References Cited

U.S. PATENT DOCUMENTS

| | | |
|---|---|---|
| 3,439,214 A | 4/1969 | Kabell |
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |

(Continued)

FOREIGN PATENT DOCUMENTS

CA 272437 7/1927

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — N Drew Richards
*Assistant Examiner* — Peter Bradford
(74) *Attorney, Agent, or Firm* — Wilmer Cutler Pickering Hale and Dorr LLP

(57) ABSTRACT

An integrated circuit device (e.g., a logic or memory device) having a memory section including a plurality of memory cells, wherein each memory cell thereof includes at least one n-channel transistor having a gate, gate dielectric and first, second and body regions, wherein the gate of the at least one n-channel transistor of each memory cell includes one or more gate materials, disposed on or over the gate dielectric material. The one or more gate materials may include a semiconductor material having one or more acceptor-type doping species disposed therein. The integrated circuit device may further include a logic section including at least one n-channel transistor having a gate, gate dielectric and first, second and body regions, wherein the gate of the n-channel transistor of the logic section may include a gate semiconductor material disposed on or over the gate dielectric material.

38 Claims, 98 Drawing Sheets

U.S. PATENT DOCUMENTS

| | | |
|---|---|---|
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidaka et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,721 B1 * | 10/2003 | Iijima et al. ............... 438/398 |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |

| Patent | Date | Inventor |
|---|---|---|
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0146867 A1* | 10/2002 | Salvatore ............... 438/149 |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1* | 1/2005 | Fazan ............... 257/59 |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2005/0280104 A1* | 12/2005 | Li ............... 257/406 |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0176101 A1* | 8/2006 | Mizuno et al. ............... 327/535 |
| 2006/0223248 A1* | 10/2006 | Venugopal et al. ............ 438/197 |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0052043 A1* | 3/2007 | Cha et al. ............... 257/412 |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida |
| 2008/0037358 A1* | 2/2008 | Yabuuchi et al. ........ 365/230.06 |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Deml et al. |
| 2008/0165577 A1 | 7/2008 | Fazan et al. |
| 2008/0224140 A1* | 9/2008 | Tokunaga et al. ............... 257/57 |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |

| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06, International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. On El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multifunctional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, SAME.

Fisch, Z-Ram® Ultra-Dense Memory for 90nm and Below, 2006, Hot Chips.

Fossum et al., New Insights on Capacitorless Floating Body DRAM Cells, 2007, IEEE EDL.

Fujita, Array Architecture of Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless It DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. On El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces, Responsible for Junction Leakage, ICSI, May 19, 2009.

Lončar et al., "One of Application of SOI Memory Cell—Memory Array", IEEE Proc. 22nd International Conference on Microelectronics (MIEL 2000), vol. 2, NIS, Serbia, May 14-17, 2000, pp. 455-458.

Lu et al., A Novel Two-Transistor Floating Body/Gate Cell for Low Power Nanoscale Embedded DRAM, 2008, IEEE Trans. On El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMO Devices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid-State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi Mosfets by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562 µm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Sailing et al., Reliability of Thyristor Based Memory Cells, 2009, IRPS.

Sasaki et al., Charge Pumping in SOS-MOS Transistors, 1981, IEEE Trans. On El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. On El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1t DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

* cited by examiner

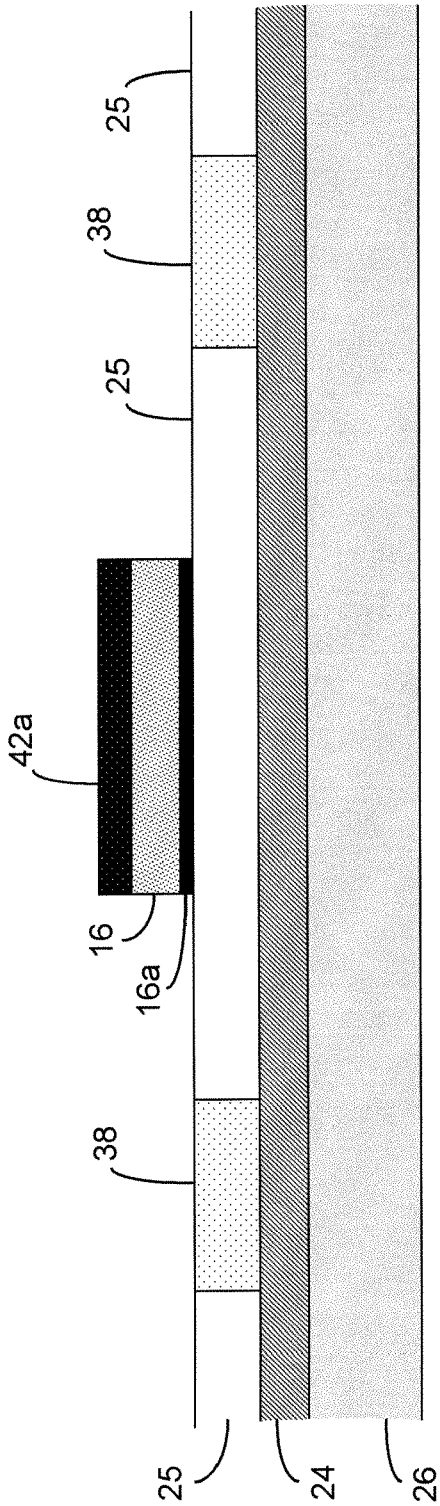
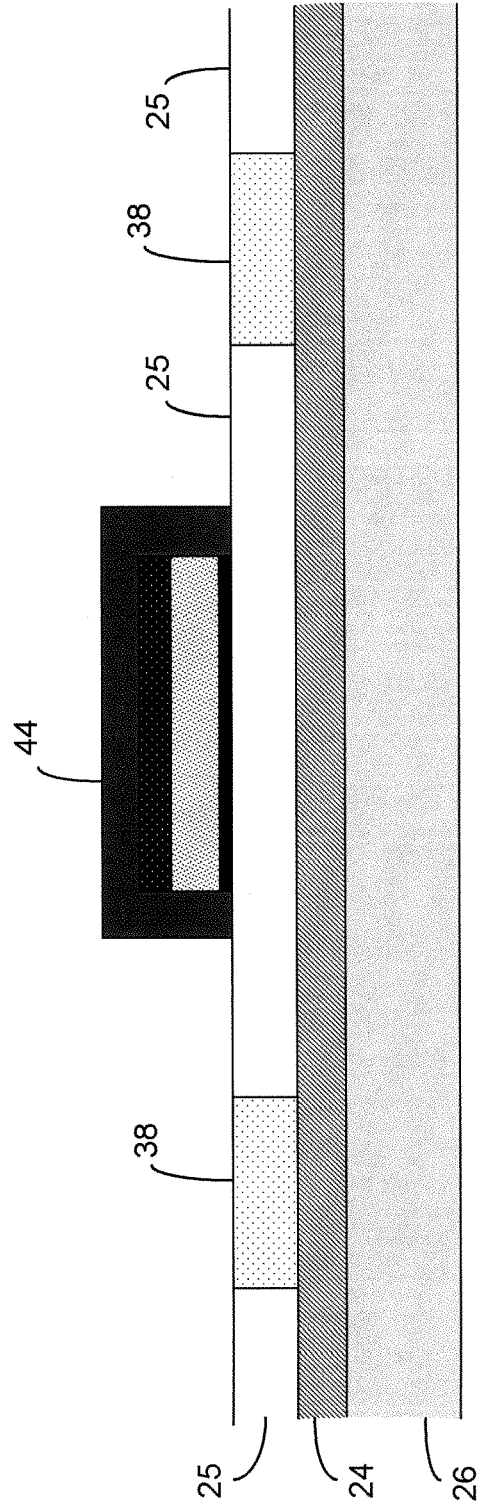

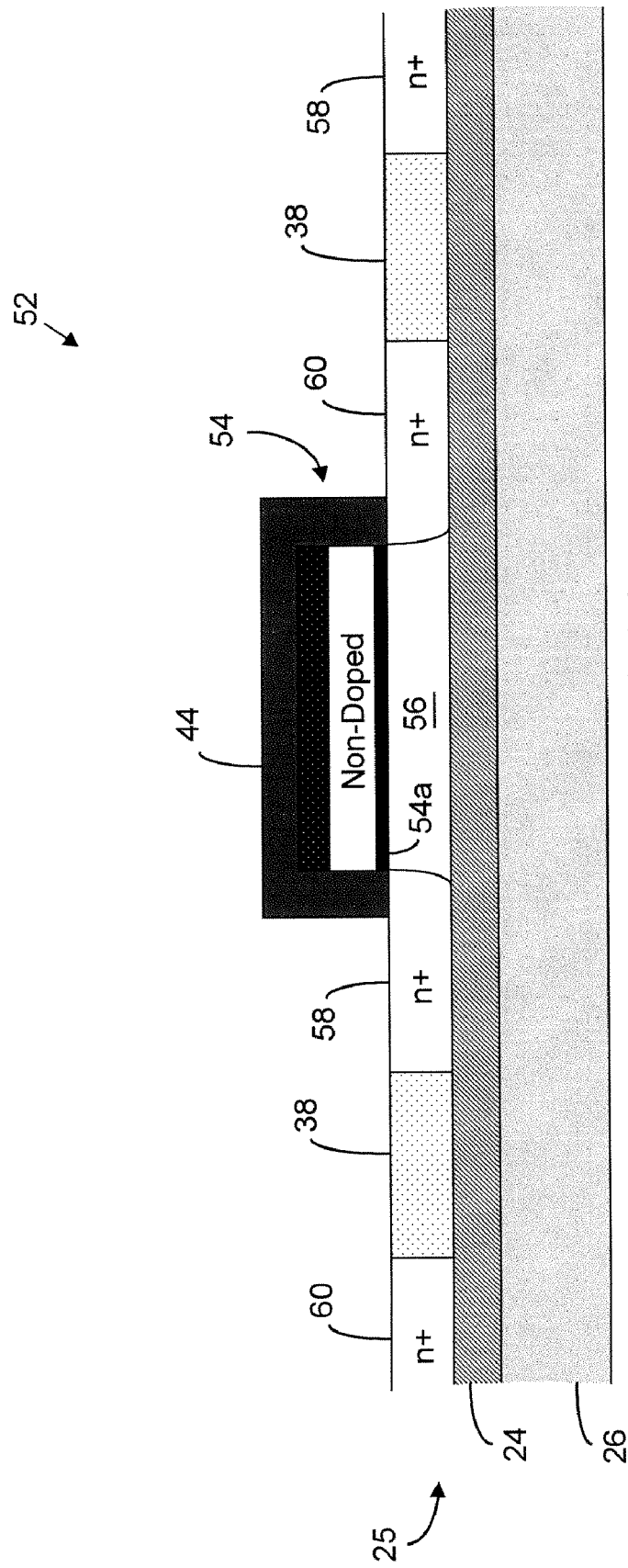

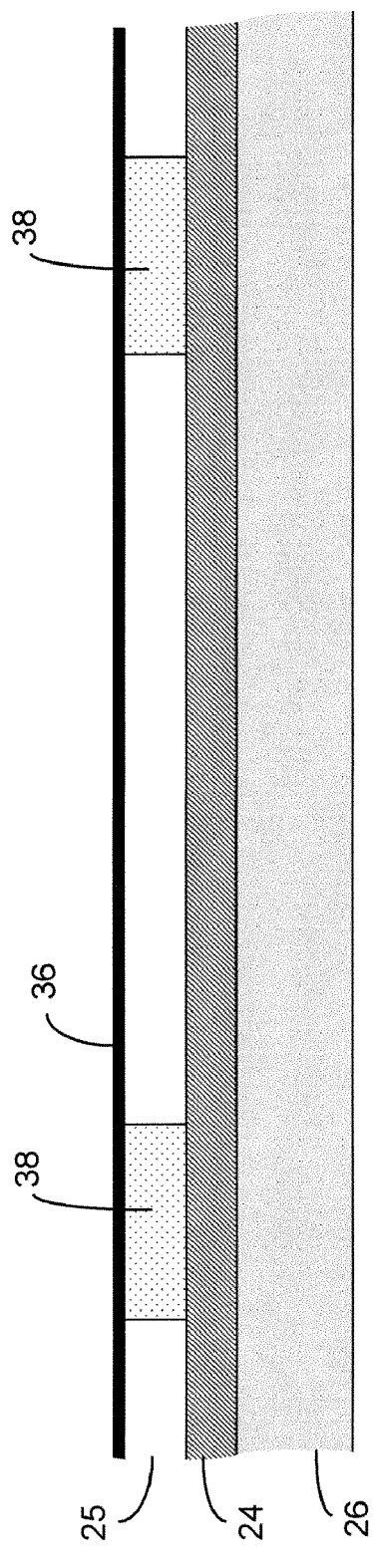
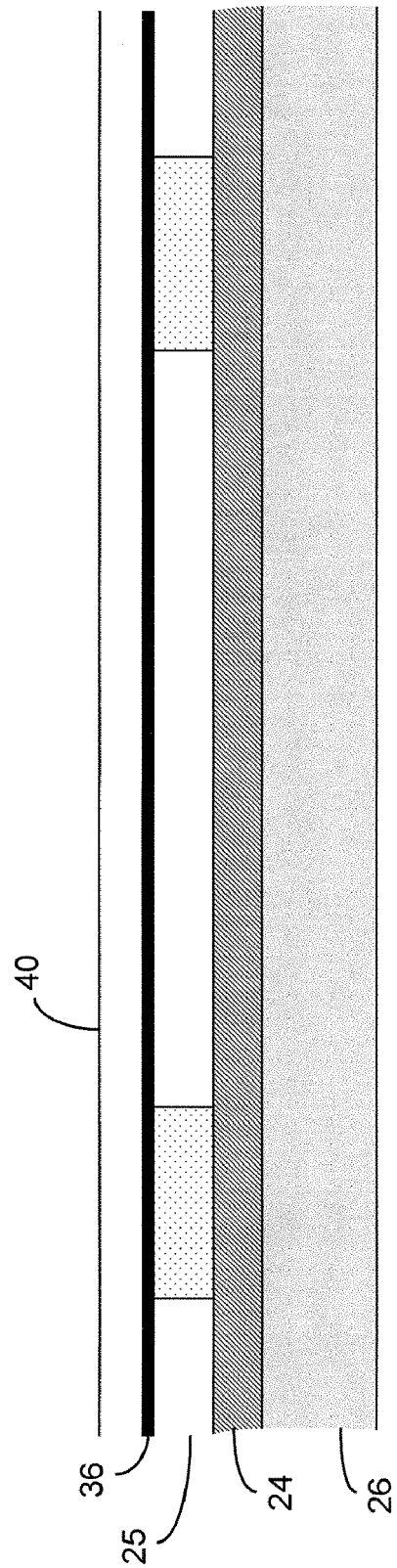

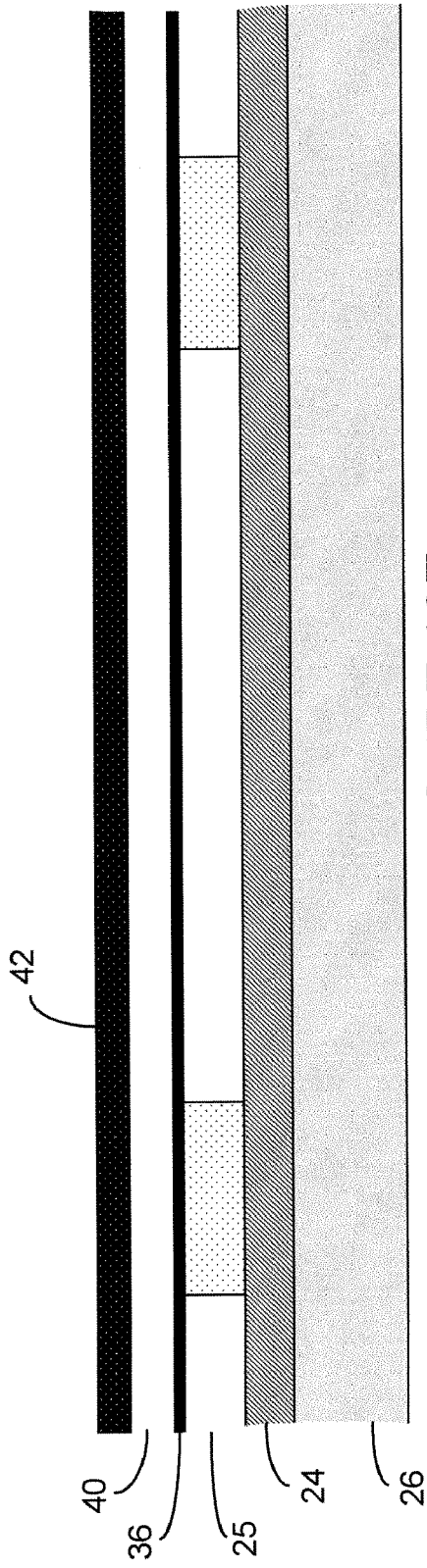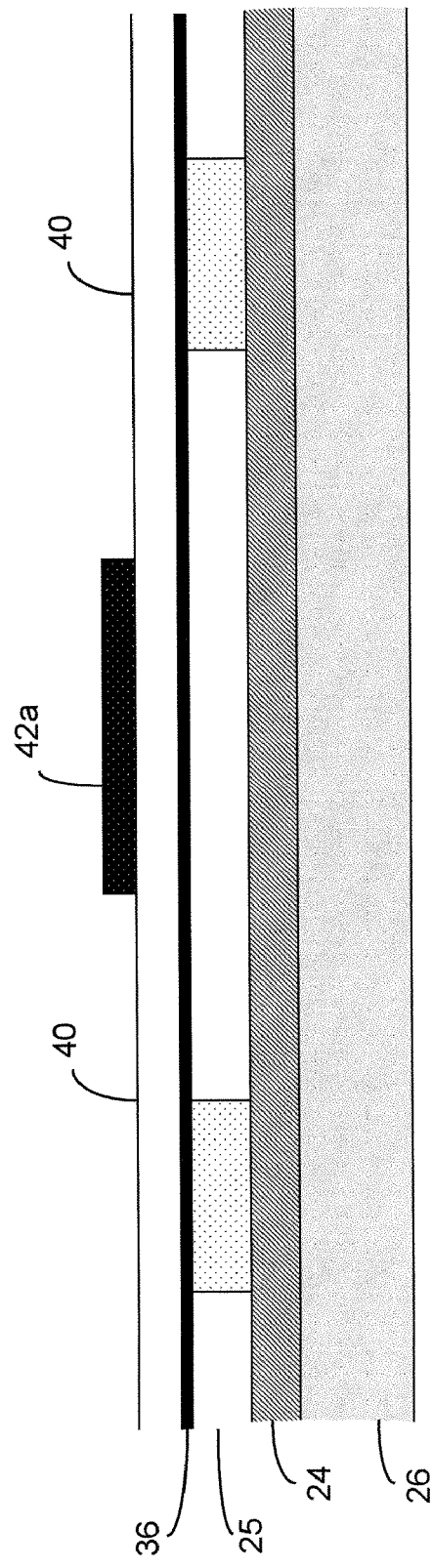

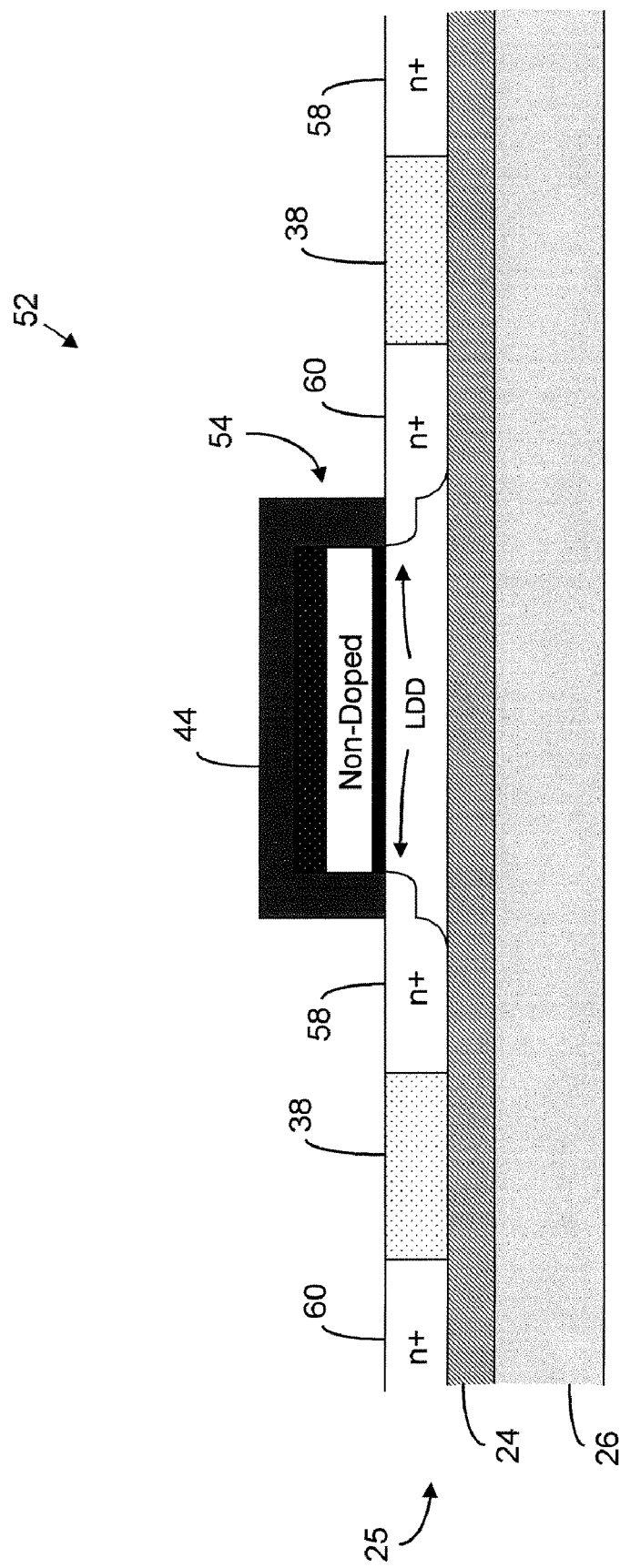

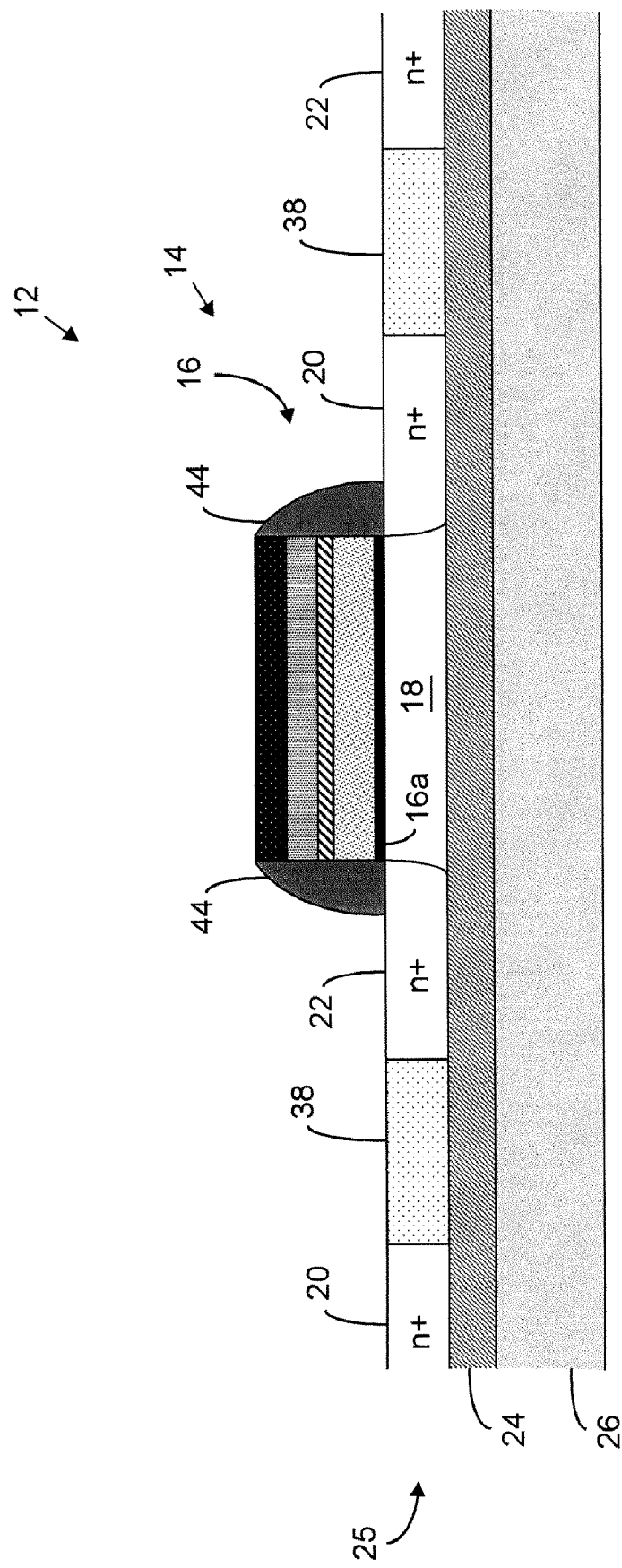

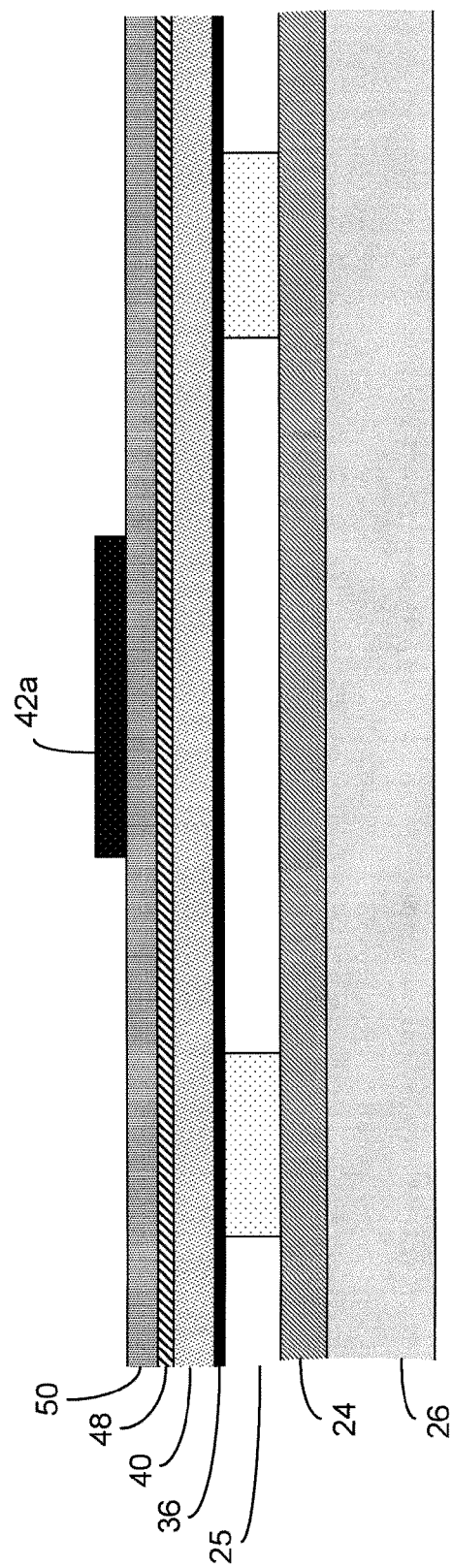

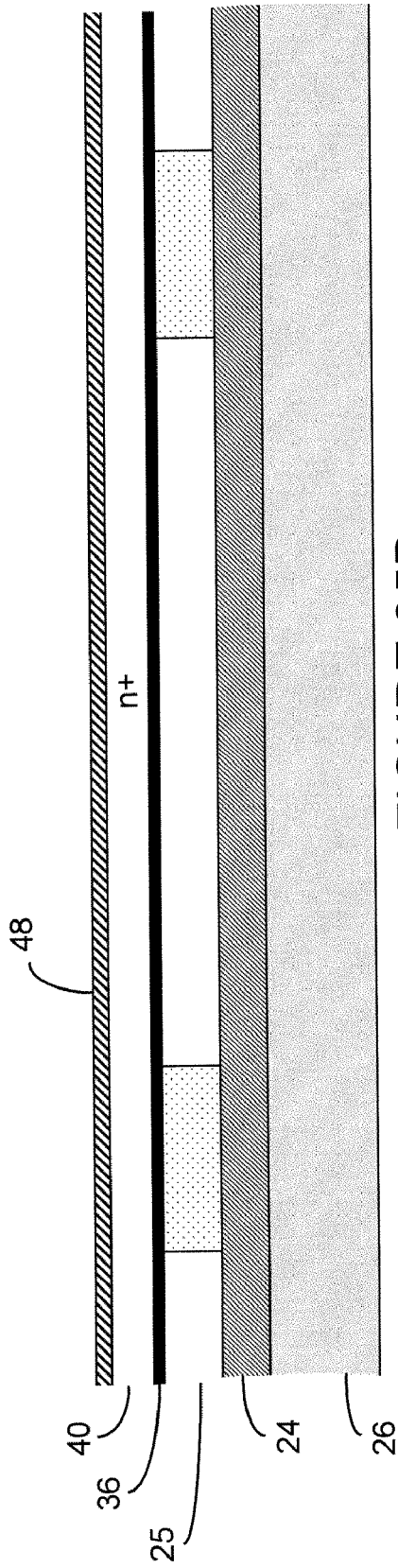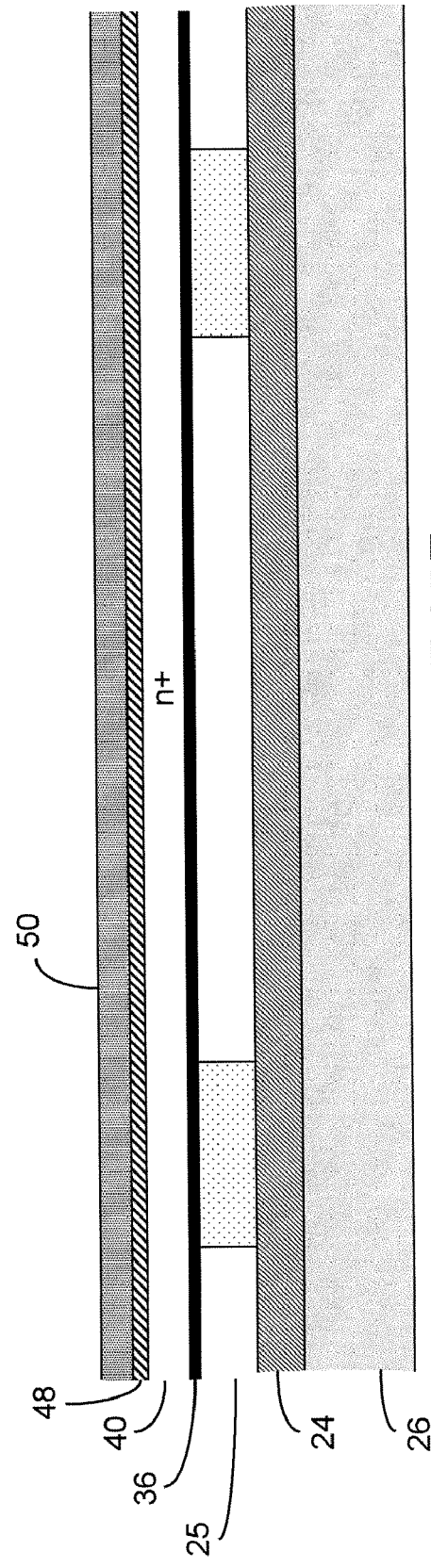

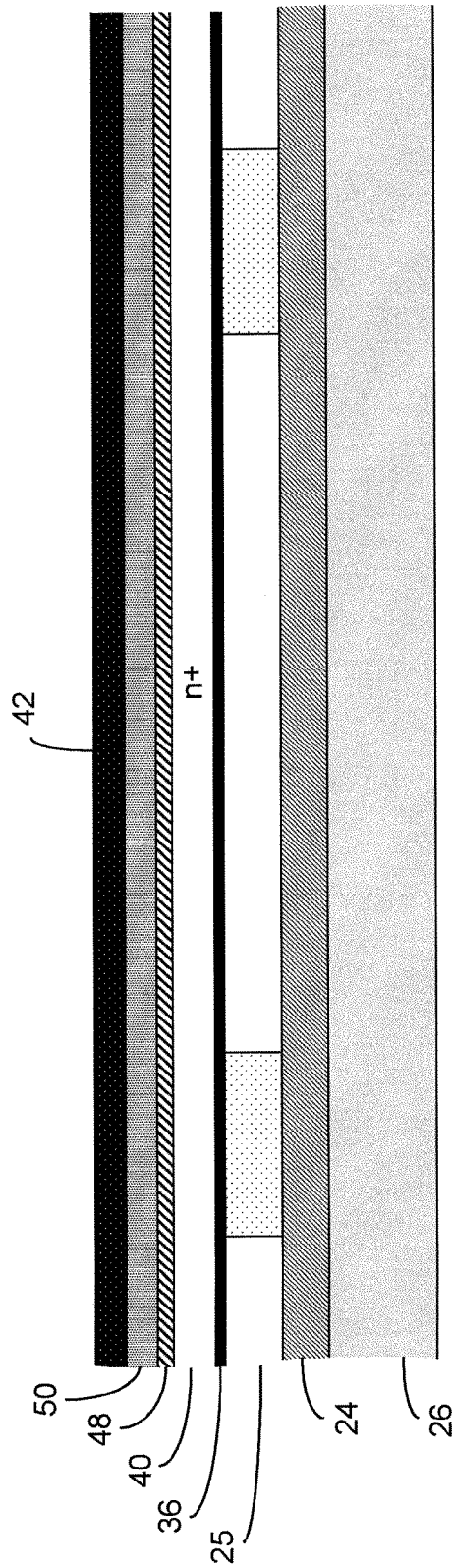
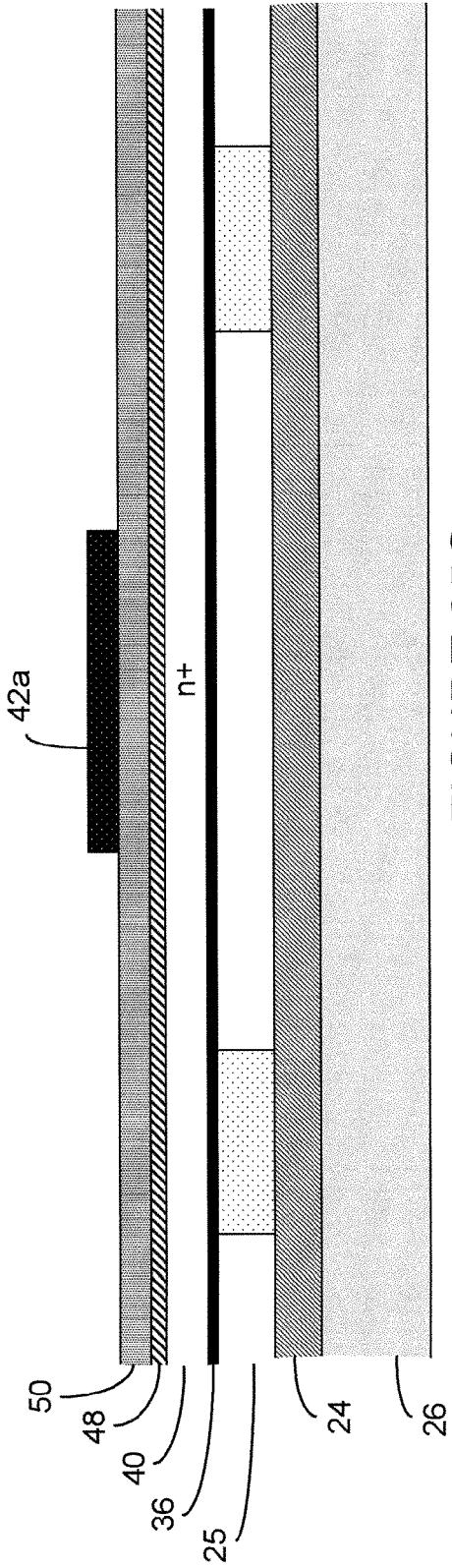
FIGURE 25F
FIGURE 25G

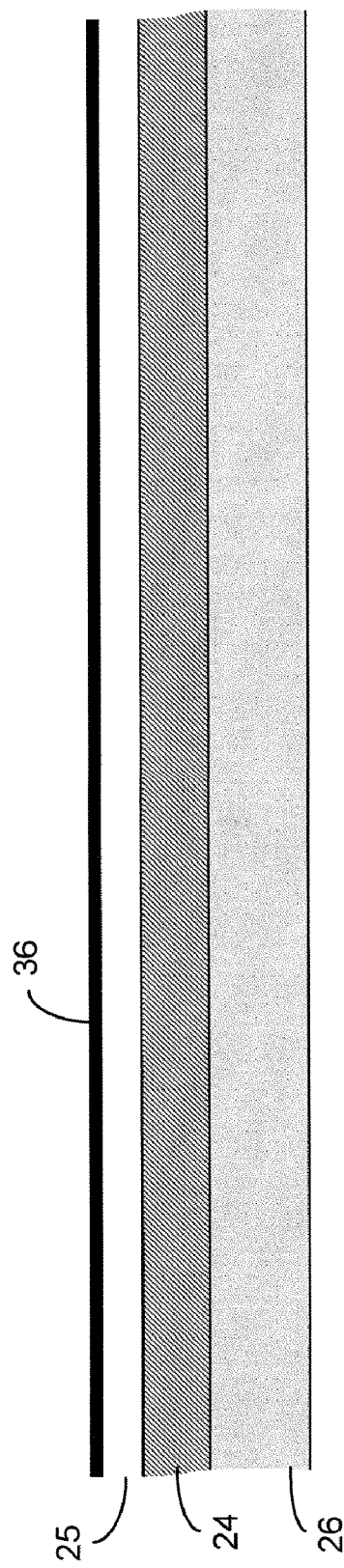
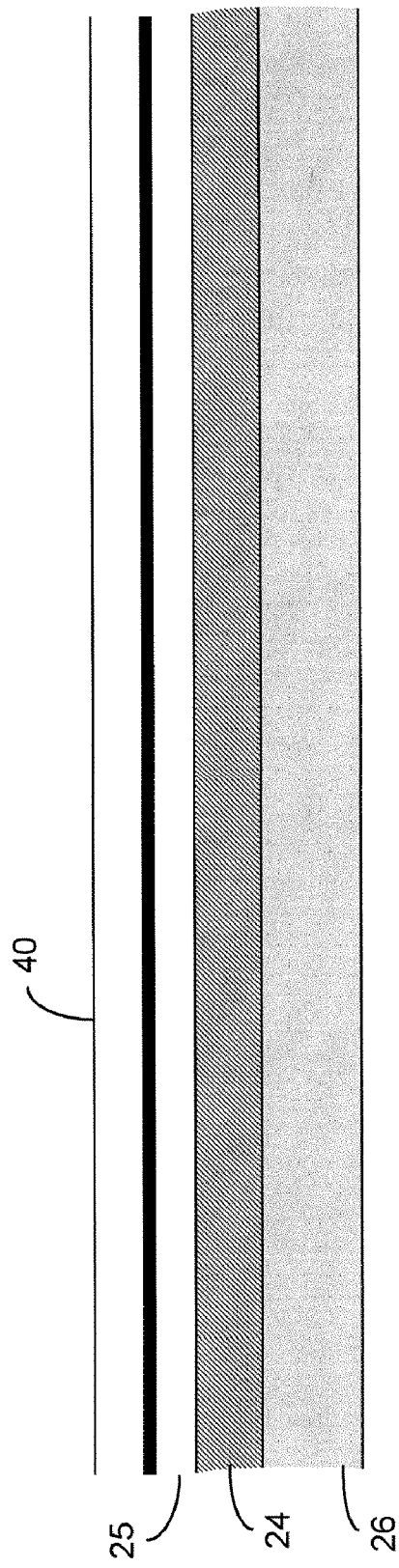
FIGURE 29A
FIGURE 29B

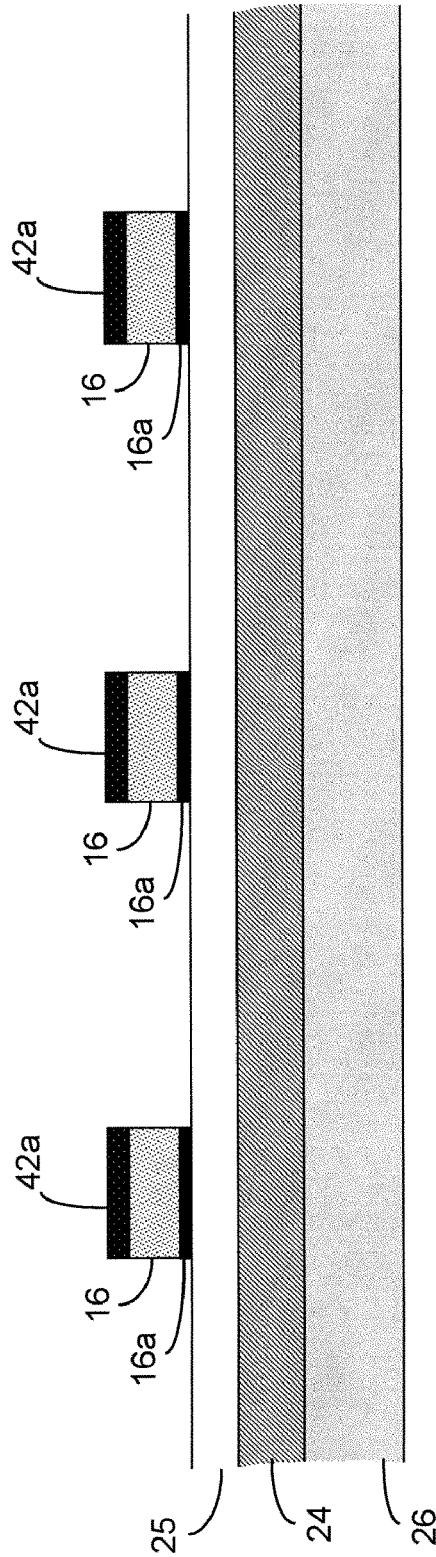
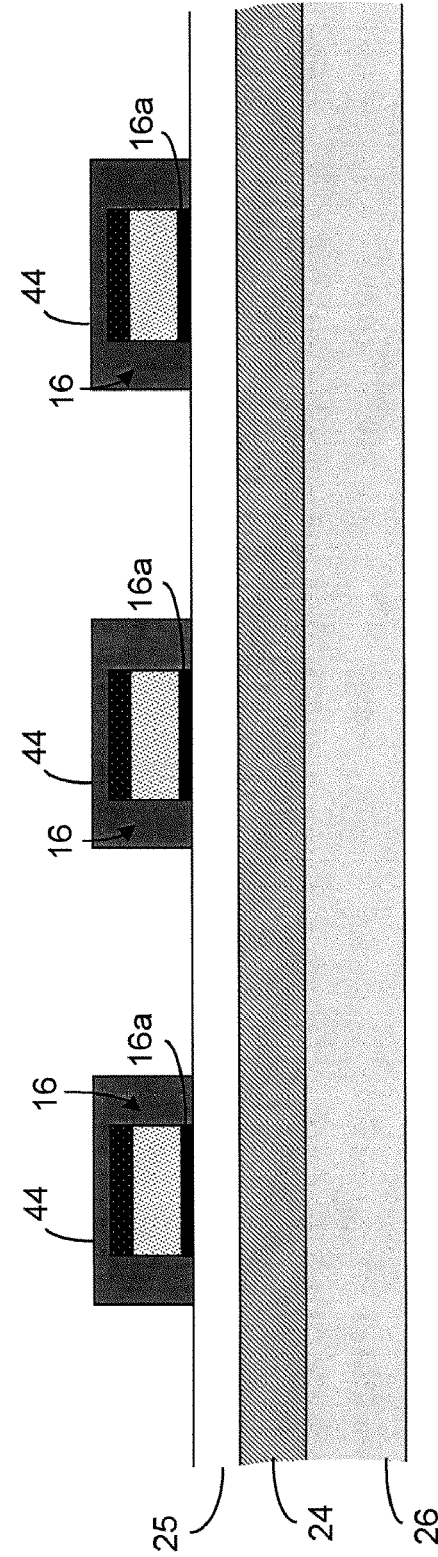
FIGURE 29F
FIGURE 29G

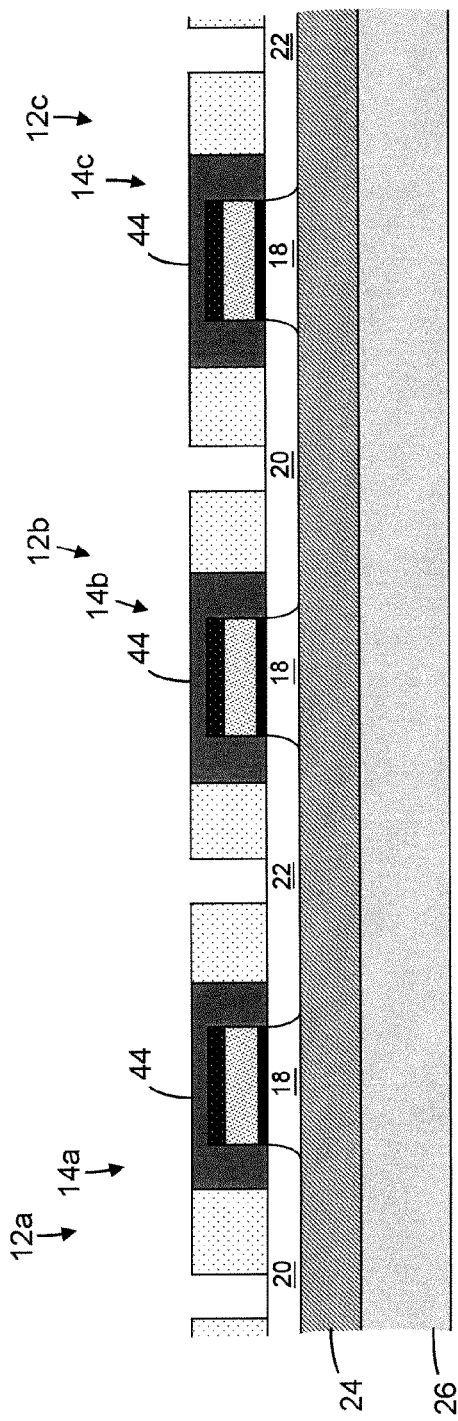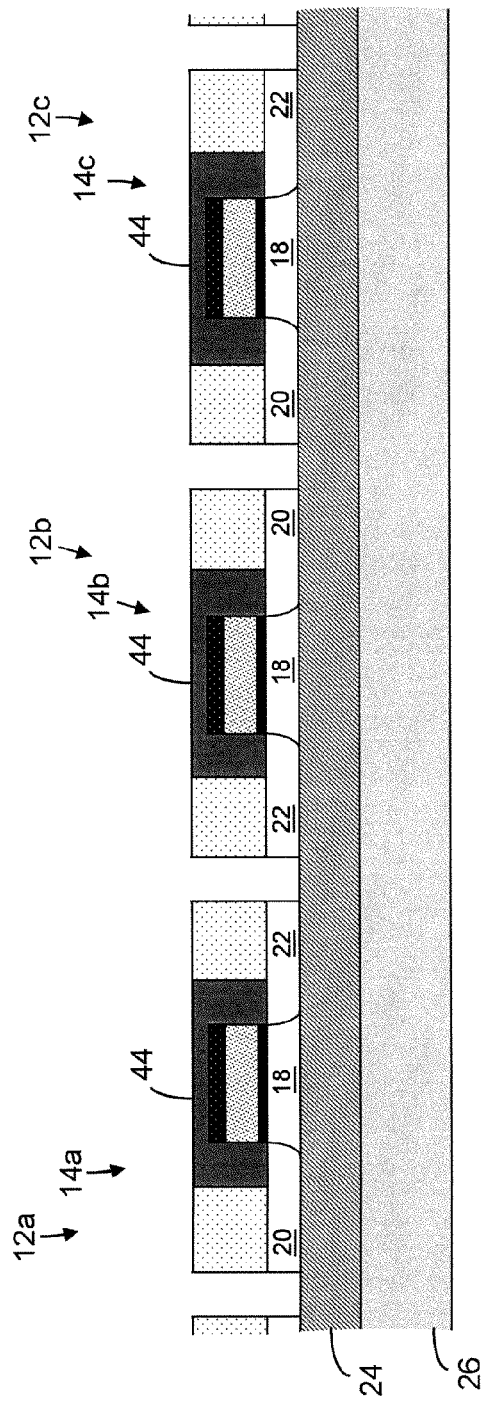
FIGURE 29K
FIGURE 29L

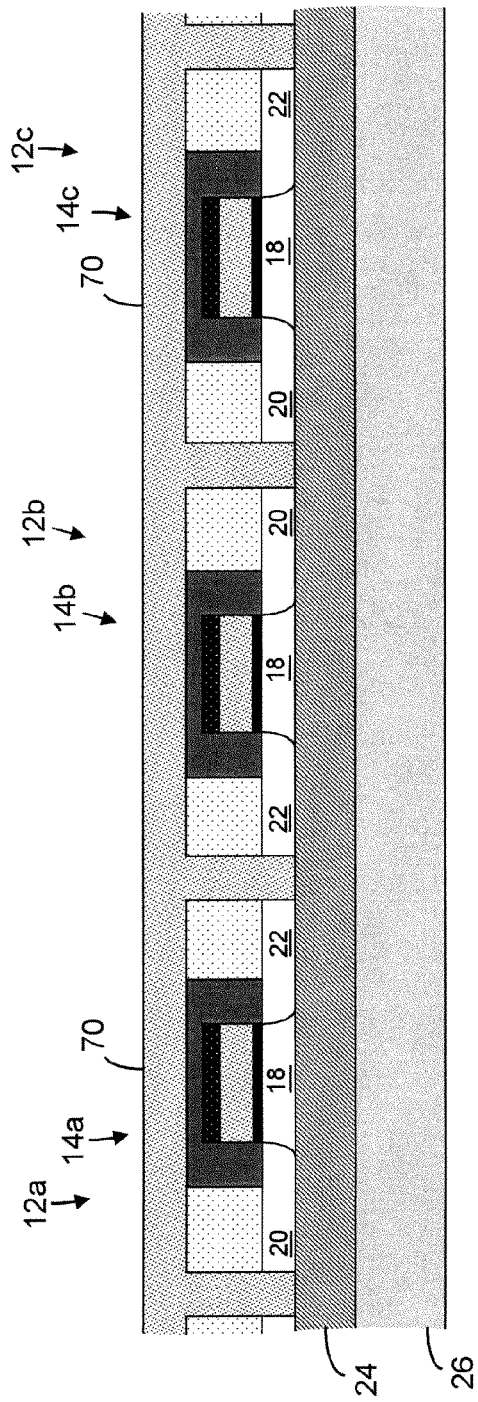
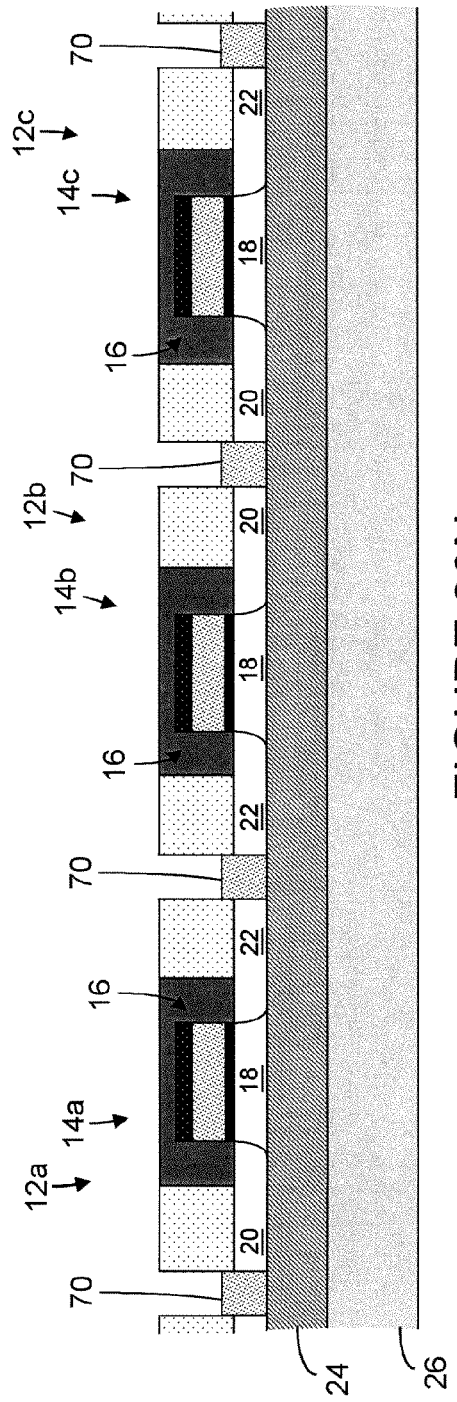
FIGURE 29M
FIGURE 29N

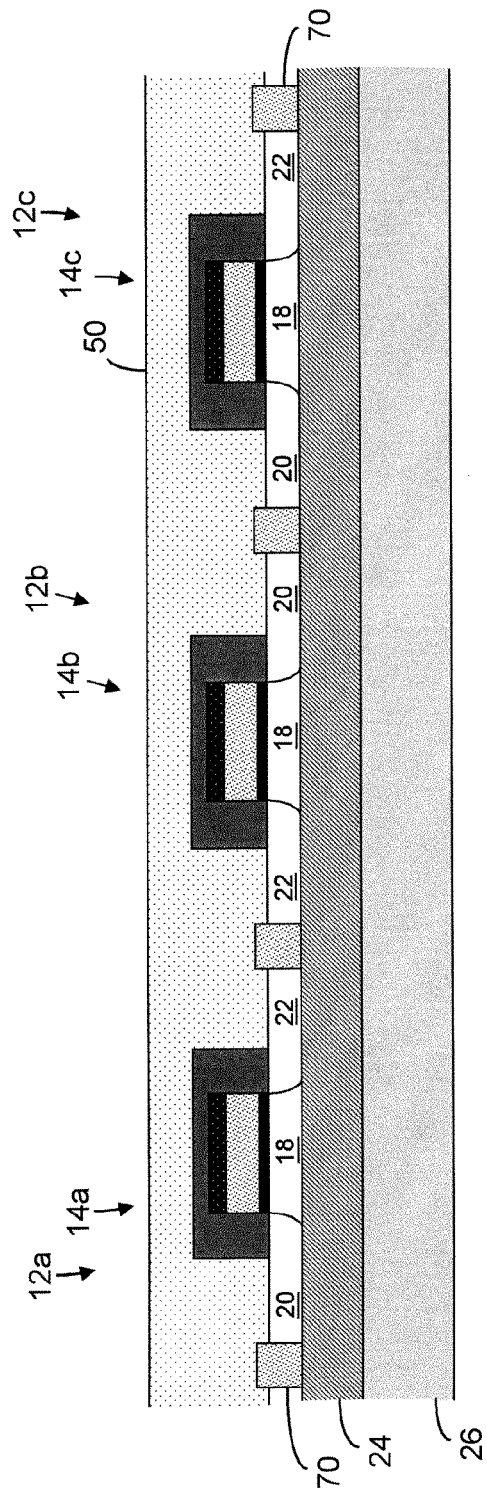
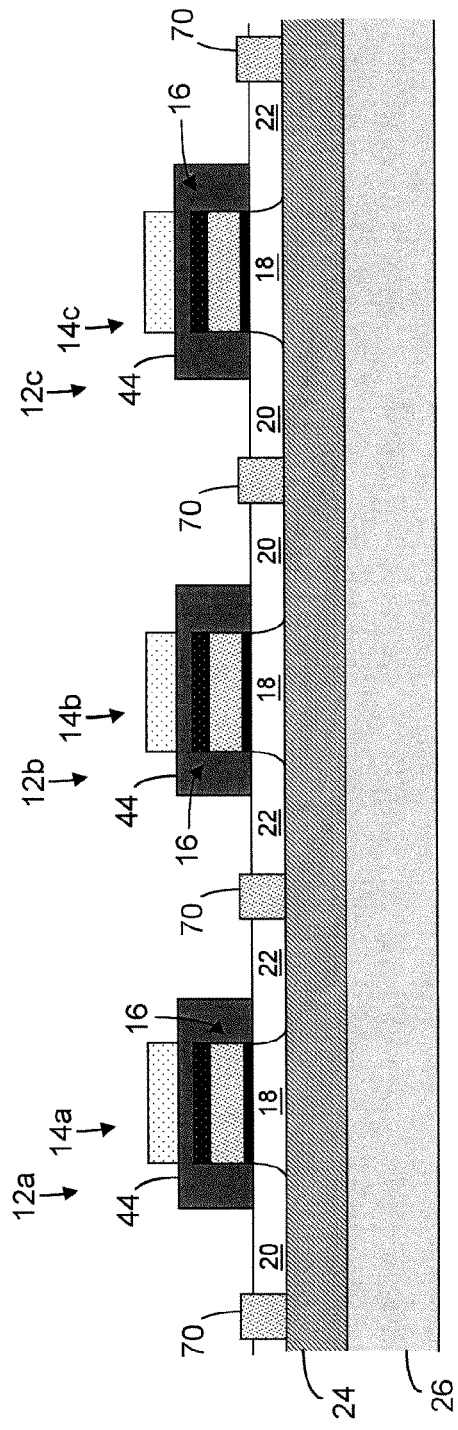
FIGURE 29O
FIGURE 29P

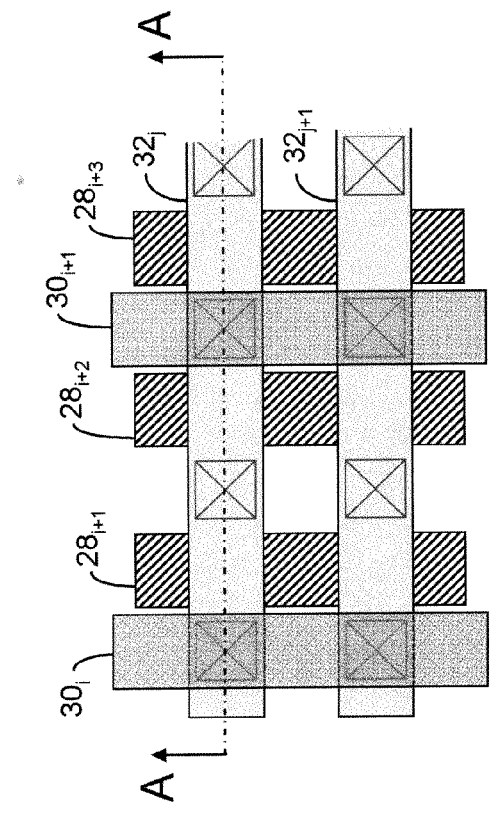
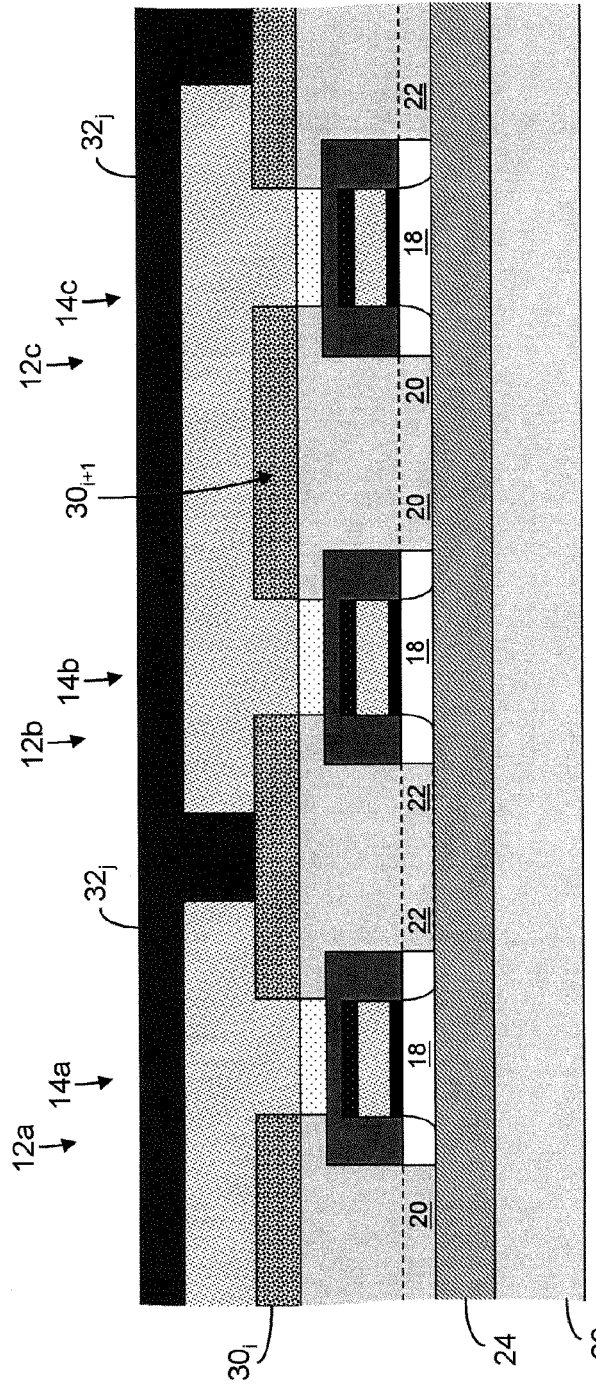
FIGURE 33A
FIGURE 33B

INTEGRATED CIRCUIT HAVING MEMORY CELLS INCLUDING GATE MATERIAL HAVING HIGH WORK FUNCTION, AND METHOD OF MANUFACTURING SAME

RELATED APPLICATION

This application claims priority to U.S. Provisional Application Ser. No. 61/065,025, entitled "Integrated Circuit Having Memory Cells Including Gate Material Having High Work Function, and Method of Manufacturing Same", filed Feb. 8, 2008; the contents of this provisional application are incorporated by reference herein in their entirety.

INTRODUCTION

The present inventions relate to a memory cell, array, architecture and device, and techniques for reading, controlling and/or operating such cell and device; and more particularly, in one aspect, to a semiconductor dynamic random access memory ("DRAM") cell, array, architecture and/or device wherein the memory cell includes a transistor having an electrically floating body in which an electrical charge is stored.

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD), fully depleted (FD) devices, multiple gate devices (for example, double or triple gate), and Fin-FET.

One type of dynamic random access memory cell is based on, among other things, the electrically floating body effect of SOI transistors. (See, for example, U.S. Pat. No. 6,969,662, incorporated herein by reference). In this regard, the dynamic random access memory cell may consist of a PD or a FD SOI transistor (or transistor formed in bulk material/substrate) having a channel, which is interposed between the body and the gate dielectric. The body region of the transistor is electrically floating in view of the insulation layer (or non-conductive region, for example, in a bulk-type material/substrate) disposed beneath the body region. The state of memory cell is determined by the concentration or amount of charge within the body region of the SOI transistor.

With reference to FIGS. 1A, 1B and 1C, in one embodiment, semiconductor DRAM array 10 includes a plurality of memory cells 12 each consisting of an n-channel transistor 14 having gate 16 (typically an n+ doped polycrystalline silicon material), body region 18, which is electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into or read from a selected memory cell by applying suitable control signals to a selected word line(s) 28, a selected source line(s) 30 and/or a selected bit line(s) 32. In response, charge carriers are accumulated in or emitted and/or ejected from electrically floating body region 18 wherein the data states are defined by the amount of carriers within electrically floating body region 18. Notably, the entire contents of the '662 Patent, including, for example, the features, attributes, architectures, configurations, materials, techniques and advantages described and illustrated therein, are incorporated by reference herein.

As mentioned above, memory cell 12 of DRAM array 10 operates by accumulating in or emitting/ejecting majority carriers (electrons or holes) 34 from body region 18 of, for example, n-channel transistors. (See, FIGS. 2A and 2B). In this regard, accumulating majority carriers (in this example, "holes") 34 in body region 18 of memory cells 12 via, for example, impact ionization near source region 20 and/or drain region 22, is representative of a logic high or "1" data state. (See, FIG. 2A). Emitting or ejecting majority carriers 34 from body region 18 via, for example, forward biasing the source/body junction and/or the drain/body junction, is representative of a logic low or "0" data state. (See, FIG. 2B).

Notably, for at least the purposes of this discussion, a logic high or State "1" corresponds to an increased concentration of majority carriers in the body region relative to an unprogrammed device and/or a device that is programmed with a logic low or State "0". In contrast, a logic low or State "0" corresponds to a reduced concentration of majority carriers in the body region relative to an unprogrammed device and/or a device that is programmed with logic high or State "1".

Conventional reading is performed by applying a small drain bias and a gate bias above the transistor threshold voltage. The sensed drain current is determined by the charge stored in the floating body giving a possibility to distinguish between the states "1" and "0". A floating body memory device has two different current states corresponding to the two different logical states: "1" and "0".

In one conventional technique, the memory cell is read by applying a small bias to the drain of the transistor as well as a gate bias which is above the threshold voltage of the transistor. In this regard, in the context of memory cells employing n-type transistors, a positive voltage is applied to one or more word lines 28 to enable the reading of the memory cells associated with such word lines. The amount of drain current is determined and/or affected by the charge stored in the electrically floating body region of the transistor. As such, conventional reading techniques sense the amount of the channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

In short, conventional writing programming techniques for memory cells having an n-channel transistor often provide an excess of majority carriers by channel impact ionization (see, FIG. 3A) or by band-to-band tunneling (gate-induced drain leakage "GIDL") (see, FIG. 3B). The majority carriers may be removed via drain side hole removal (see, FIG. 4A), source side hole removal (see, FIG. 4B), or drain and source hole removal, for example, using the back gate pulsing (see, FIG. 4C).

Further, FIG. 5 illustrates the conventional reading technique. In one embodiment, the state of the memory cell may be determined by sensing the amount of the channel current provided/generated in response to the application of a predetermined voltage on the gate of the transistor of the memory cell.

The memory cell 12 having electrically floating body transistor 14 may be programmed/read using other techniques including techniques that may, for example, provide lower power consumption relative to conventional techniques. For example, memory cell 12 may be programmed, read and/or controlled using the techniques and circuitry described and illustrated in Okhonin et al., U.S. Patent Application Publication No. 2007/0058427 ("Memory Cell and Memory Cell Array Having an Electrically Floating Body Transistor, and Methods of Operating Same", U.S. Non-Provisional patent application Ser. No. 11/509,188, filed on Aug. 24, 2006 (hereinafter "the '188 Application")), which is incorporated by reference herein. In one aspect, the '188 Application is directed to programming, reading and/or control methods which allow low power memory programming and provide larger memory programming window (both relative to at least the conventional programming techniques).

With reference to FIG. 6, in one embodiment, the '188 Application employs memory cell 12 having electrically floating body transistor 14. The electrically floating body transistor 14, in addition to the MOS transistor, includes an intrinsic bipolar transistor (including, under certain circumstances, a significant intrinsic bipolar current). In this illustrative exemplary embodiment, electrically floating body transistor 14 is an n-channel transistor having gate 16 (typically an n+ doped polycrystalline silicon material), body region 18, which is electrically floating, source region 20 and drain region 22, wherein the body region 18 is disposed between source region 20 and drain region 22. In an n-channel transistor, the majority carriers are "holes".

With reference to FIG. 7, in one embodiment, the '188 Application employs, writes or programs a logic "1" or logic high using control signals (having predetermined voltages, for example, Vg=0V, Vs=3V, and Vd=0V) which are applied to gate 16, source region 20 and drain region 22 (respectively) of transistor 14 of memory cell 12. Such control signals induce or cause impact ionization and/or the avalanche multiplication phenomenon. (See, FIG. 7). The predetermined voltages of the control signals, in contrast to the conventional method program or write logic "1" in the transistor of the memory cell via impact ionization and/or avalanche multiplication in the electrically floating body. In one embodiment, it is preferred that the bipolar transistor current responsible for impact ionization and/or avalanche multiplication in the floating body is initiated and/or induced by a control pulse which is applied to gate 16. Such a pulse may induce the channel impact ionization which increases the floating body potential and turns on the bipolar current. An advantage of the described method is that larger amount of the excess majority carriers is generated compared to other techniques.

Further, with reference to FIG. 8, when writing or programming logic "0" in transistor 14 of memory cell 12, in one embodiment of the '188 Application, the control signals (having predetermined voltages (for example, Vg=0.5V, Vs=3V and Vd=0.5V) are different and, in at least one embodiment, higher than a holding voltage (if applicable)) are applied to gate 16, source region 20 and drain region 22 (respectively) of transistor 14 of memory cell 12. Such control signals induce or provide removal of majority carriers from the electrically floating body of transistor 14. In one embodiment, the majority carriers are removed, eliminated or ejected from body region 18 through source region 20 and drain region 22. (See, FIG. 8). In this embodiment, writing or programming memory cell 12 with logic "0" may again consume lower power relative to conventional techniques.

When memory cell 12 is implemented in a memory cell array configuration, it may be advantageous to implement a "holding" operation for certain memory cells 12 when programming one or more other memory cells 12 of the memory cell array to enhance the data retention characteristics of such certain memory cells 12. The transistor 14 of memory cell 12 may be placed in a "holding" state via application of control signals (having predetermined voltages) that are applied to gate 16 and source region 20 and drain region 22 of transistor 14 of memory cell 12. In combination, such control signals provide, cause and/or induce majority carrier accumulation in an area that is close to the interface between gate dielectric 16a and electrically floating body region 18. (See, FIG. 9). In this embodiment, it may be preferable to apply a negative voltage to gate 16 where transistor 14 is an n-channel transistor.

With reference to FIG. 10, in one embodiment of the '188 Application, the data state of memory cell 12 may be read and/or determined by applying control signals (having predetermined voltages, for example, Vg=−0.5V, Vs=3V and Vd=0V) to gate 16 and source region 20 and drain region 22 of transistor 14. Such signals, in combination, induce and/or cause the bipolar transistor current in those memory cells 12 storing a logic state "1". For those memory cells that are programmed to a logic state "0", such control signals do not induce and/or cause a considerable, substantial or sufficiently measurable bipolar transistor current in the cells programmed to "0" state. (See, the '188 Application, which, as noted above, is incorporated by reference).

The reading may be performed using negative or positive voltages applied to word lines 28. As such, transistors 14 of device 10 are periodically pulsed between a positive gate bias, which (1) drives majority carriers (holes for n-channel transistors) away from the interface between gate insulator 32 and body region 18 of transistor 14 and (2) causes minority carriers (electrons for n-channel transistors) to flow from source region 20 and drain region 22 into a channel formed below gate 16, and the negative gate bias, which causes majority carriers (holes for n-channel transistors) to accumulate in or near the interface between gate 16 and body region 18 of transistor 14.

Notably, the illustrated/exemplary voltage levels to implement the write and read operations, with respect to the '188 Application are merely exemplary. The indicated voltage levels may be relative or absolute. Alternatively, the voltages indicated may be relative in that each voltage level, for example, may be increased or decreased by a given voltage amount (for example, each voltage may be increased or decreased by 0.25, 0.5, 1.0 and 2.0 volts) whether one or more of the voltages (for example, the source, drain or gate voltages) become or are positive and negative.

SUMMARY OF CERTAIN ASPECTS OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principle aspect, certain of the present inventions are directed to a method of manufacture of an integrated circuit device (for example, a logic or memory device) including (i) a memory section including a plurality of memory cells, wherein each memory cell thereof includes at least one n-channel transistor having a gate, gate dielectric and first, second and body regions, and (ii) a logic section including a plurality of n-channel transistors having a gate, gate dielectric and first, second and body regions. The method of this aspect of the invention comprises depositing a gate dielectric material on or above a semiconductor substrate, depositing a gate semiconductor material (for example, a silicon material) on or over the gate dielectric material, implanting or introducing one or more acceptor-type doping species into at least portions of the gate semiconductor material (concurrently with and/or after the deposition of the gate semiconductor material) within the memory section. The method further includes forming the gate of the n-channel transistors of the plurality of memory cells of the memory section from at least the gate semiconductor material having one or more acceptor-type doping species implanted or introduced therein, wherein the gates of the n-channel transistors of the plurality of memory cells include work functions based at least partially on a work function of one or more materials comprising such gates. Moreover, the method includes forming the gates of the n-channel transistors of the logic section from at least the gate semiconductor material within the logic section, wherein the gates of the n-channel transistors of the logic section include work functions based at least partially on a work function of one or more materials comprising the gates of the n-channel transistors of the logic section, and wherein the work functions of the gates of the n-channel transistors of the plurality of memory cells of the memory section are greater than the work functions of the gates of the plurality of n-channel transistors of the logic section.

In one embodiment, the method of manufacture further includes forming a mask on or over the gate semiconductor material within the logic section before implanting or introducing one or more acceptor-type doping species into at least portions of the gate semiconductor material in the memory section. The method may also includes implanting or introducing one or more donor-type doping species into at least portions of the gate semiconductor material in the logic section after forming the gates of the n-channel transistors of the logic section. In one embodiment, the method of manufacture includes providing a work function of the gates of the n-channel transistors of the plurality of memory cells of the memory section which are greater than or equal to 4 eV.

In another principal aspect, the present inventions are directed to a method of manufacture of an integrated circuit device (for example, a logic or memory device) including (i) a memory section including a plurality of memory cells, wherein each memory cell thereof includes at least one n-channel transistor having a gate, gate dielectric and first, second and body regions, and (ii) a logic section including a plurality of n-channel transistors having a gate, gate dielectric and first, second and body regions. The method of this aspect of the invention comprises depositing a gate dielectric material on or above a semiconductor substrate, depositing a gate semiconductor material (for example, a silicon material) on or over the gate dielectric material, implanting or introducing (concurrently with and/or after the deposition of the gate semiconductor material) one or more acceptor-type doping species into at least portions of the gate semiconductor material within the memory section. The method of this aspect further includes depositing a first material (for example, barrier-type material such as titanium nitride, tantalum nitride or tungsten nitride) on or above the gate semiconductor material having one or more acceptor-type doping species implanted or introduced therein, and depositing a second material (for example, metal material such as a copper, chromium, gold, silver, molybdenum, platinum, palladium, tungsten or titanium, a metal stack, complex metal, conducting alloy and/or complex metal stack.

Moreover, the method includes forming the gate of the n-channel transistors of the plurality of memory cells of the memory section from: (i) at least the gate semiconductor material having one or more acceptor-type doping species implanted or introduced therein, (ii) the first material and (iii) the second material, wherein the gates of the n-channel transistors of the plurality of memory cells include work functions based at least partially on a work function of the gate semiconductor material having one or more acceptor-type doping species implanted or introduced therein, (ii) the first material and (iii) the second material. In addition, the method includes forming the gates of the n-channel transistors of the logic section from at least the gate semiconductor material within the logic section, wherein the gates of the n-channel transistors of the logic section include work functions based at least partially on a work function of one or more materials comprising such gates.

Notably, the work functions of the gates of the n-channel transistors of the plurality of memory cells of the memory section are greater than the work functions of the gates of the plurality of n-channel transistors of the logic section. In one embodiment, the method of manufacture includes providing a work function of the gates of the n-channel transistors of the plurality of memory cells of the memory section which are greater than or equal to 4 eV.

In one embodiment, the method of manufacture further includes implanting or introducing one or more donor-type doping species into at least portions of the gate semiconductor material in the logic section concurrently with forming the first and second regions of the n-channel transistors of the logic section and/or after forming the gates of the n-channel transistors of the logic section. The method may also include masking the gate semiconductor material within the logic section while implanting or introducing one or more acceptor-type doping species into at least portions of the gate semiconductor material in the memory section.

In another principal aspect, the present inventions are directed to an integrated circuit device (for example, a logic or memory device) comprising a memory section including a plurality of memory cells, wherein each memory cell thereof includes at least one n-channel transistor having a gate, gate dielectric and first, second and body regions, wherein: (i) the body region of each transistor is electrically floating, and (ii) the gate of the at least one n-channel transistor of each memory cell includes: (a) a gate semiconductor material (for example, a silicon material), disposed on or over the gate dielectric material, including one or more acceptor-type doping species disposed therein, and (b) a work function based at least partially on the gate semiconductor material including one or more acceptor-type doping species disposed therein. The integrated circuit of this aspect of the inventions further includes a logic section including at least one n-channel transistor having a gate, gate dielectric and first, second and body regions, wherein the gate of the at least one n-channel transistor of the logic section includes: (i) a gate semiconductor material disposed on or over the gate dielectric material, and (ii) a work function based at least partially on the gate semiconductor material of the at least one n-channel transistor of the logic section.

Notably, the work functions of the gates of the n-channel transistors of the plurality of memory cells of the memory section are greater than the work function of the gate of the at least one n-channel transistor of the logic section. In one embodiment, the work function of the gates of the n-channel transistors of the plurality of memory cells of the memory section are greater than or equal to 4 eV.

In one embodiment, the gate semiconductor material of the gate of the at least one n-channel transistor of the logic section includes one or more donor-type doping species are disposed therein. Indeed, in one embodiment, the gates of the n-channel transistors of the memory cells of the memory section include: a first material on or above the gate semiconductor material having one or more acceptor-type doping species implanted or introduced therein, and a second material on or above the first material. In this embodiment, the gate of the at least one n-channel transistor of the logic section includes: a first material on or above the gate semiconductor material, and a second material on or above the first material.

In one embodiment, the first material is a barrier-type material, for example, titanium nitride, tantalum nitride and/or tungsten nitride. The second material may be a metal material, for example, a copper, chromium, gold, silver, molybdenum, platinum, palladium, tungsten or titanium, a metal stack, complex metal, conducting alloy and/or complex metal stack.

An integrated circuit device (e.g., a logic or memory device) having a memory section including a plurality of memory cells, wherein each memory cell thereof includes at least one n-channel transistor having a gate, gate dielectric and first, second and body regions, wherein the gate of the at least one n-channel transistor of each memory cell includes one or more gate materials, disposed on or over the gate dielectric material. The one or more gate materials may include a semiconductor material having one or more acceptor-type doping species disposed therein. The integrated circuit device further includes a logic section including at least one n-channel transistor having a gate, gate dielectric and first, second and body regions, wherein the gate of the at least one n-channel transistor of the logic section may include a gate semiconductor material disposed on or over the gate dielectric material.

In certain embodiments, the work functions of the gates of the n-channel transistors of the plurality of memory cells of the memory section are greater than the work function of the gate of the at least one n-channel transistor of the logic section. In certain embodiments of the present inventions, the work functions of the transistors of the memory cells of the memory section may be substantially similar or the same as the work functions of the transistors in the logic section. In these embodiments, the gate material of the transistors of the memory cells of the memory section and the transistors of the logic section may be comprised of a mid-gap gate material with a work function of between 4 eV and 5 eV and, in a preferred embodiment, approximately 4.5 eV. Such embodiments may facilitate or simplify process integration.

In another principal aspect, the present inventions are directed to an integrated circuit device (for example, a logic or memory device) comprising a memory section including a plurality of memory cells, wherein each memory cell thereof includes at least one n-channel transistor having a gate, gate dielectric and first, second and body regions, wherein: (i) the body region of each transistor is electrically floating and wherein the data state of the memory cell is stored in the electrically floating body region, and (ii) the gate of the at least one n-channel transistor of each memory cell includes: (a) a gate semiconductor material (for example, a silicon material), disposed on or over the gate dielectric material, and (b) a work function based at least partially on the gate semiconductor material. The integrated circuit of this aspect of the inventions further includes a logic section including at least one n-channel transistor having a gate, gate dielectric and first, second and body regions, wherein the gate of the at least one n-channel transistor of the logic section includes: (i) a gate semiconductor material disposed on or over the gate dielectric material, and (ii) a work function based at least partially on the gate semiconductor material of the at least one n-channel transistor of the logic section.

Here again, the work functions of the gates of the n-channel transistors of the plurality of memory cells of the memory section are greater than the work function of the gate of the at least one n-channel transistor of the logic section. In one embodiment, the work function of the gates of the n-channel transistors of the plurality of memory cells of the memory section are greater than or equal to 4 eV, and preferably greater than or equal to 4.5 eV.

In one embodiment, the gate semiconductor material of the gate of the n-channel transistors of the memory cells of the memory section of this aspect of the inventions include one or more acceptor-type doping species disposed therein.

Again, there are many inventions, and aspects of the inventions, described and illustrated herein. This Summary is not exhaustive of the scope of the present inventions. Indeed, this Summary may not be reflective of or correlate to the inventions protected by the claims in this or in continuation/divisional applications hereof.

Moreover, this Summary is not intended to be limiting of the inventions or the claims (whether the currently presented claims or claims of a divisional/continuation application) and should not be interpreted in that manner. While certain embodiments have been described and/or outlined in this Summary, it should be understood that the present inventions are not limited to such embodiments, description and/or outline, nor are the claims limited in such a manner (which should also not be interpreted as being limited by this Summary).

Indeed, many other aspects, inventions and embodiments, which may be different from and/or similar to, the aspects, inventions and embodiments presented in this Summary, will be apparent from the description, illustrations and claims, which follow. In addition, although various features, attributes and advantages have been described in this Summary and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed and/or illustrated separately herein.

FIGS. 13A-13J illustrate cross-sectional views of an electrically floating body transistor of a memory cell of a portion of a memory cell array of FIGS. 11 and 12 during fabrication of the memory cell array of FIG. 11 at various stages of an exemplary process to manufacture the electrically floating body transistor, according to certain aspects of the present inventions;

FIG. 15 is a cross-sectional view of an electrically floating body transistor in a portion of the logic section of the integrated circuit having a memory cell and/or memory cell array of, for example, FIGS. 11 and 12, illustrating an exemplary embodiment of the present inventions according to at least one aspect of the present inventions;

FIGS. 16A-16J illustrate cross-sectional views of an electrically floating body transistor of the circuitry of the logic section of the integrated circuit including a transistor at various stages of an exemplary process to manufacture such transistor in the circuitry of the logic section of the integrated circuit in relation to the various stages of the exemplary process to manufacture an electrically floating body transistor of a memory cell illustrated in FIGS. 13A-13J, according to certain aspects of the present inventions;

FIGS. 17A-17C are cross-sectional views of an electrically floating body transistor of the circuitry of the logic section of the integrated circuit according to the embodiment of FIG. 16, wherein the source and/or drain regions of the transistor include lightly doped regions (FIG. 17A), halo regions (FIG. 17B) and a combination thereof (FIG. 17C); all source and/or drain regions structures, arrangements and/or configurations/layouts, whether known or unknown (whether conventional or unconventional), are intended to fall within the scope of the present inventions;

FIG. 21 is a cross-sectional view of an electrically floating body transistor of a memory cell of a portion of a memory cell array of FIG. 11 illustrating another exemplary embodiment of the present inventions wherein the gate of the transistor includes a polycide stack, according to at least one aspect of the present inventions;

FIGS. 22A-22L illustrate cross-sectional views of an electrically floating body transistor of a memory cell of a portion of a memory cell array of FIGS. 11 and 21 during fabrication of the memory cell array of FIG. 11 at various stages of an exemplary process to manufacture an electrically floating body transistor of a memory cell, according to certain aspects of the present inventions;

FIGS. 25A-25K illustrate cross-sectional views of an electrically floating body transistor of the circuitry of the logic section of the integrated circuit including one, some or all transistors having a gate comprised of a polycide stack at various stages of an exemplary process to manufacture of a portion of the circuitry of the logic section of the integrated circuit in relation to the various stages of the exemplary process to manufacture an electrically floating body transistor of a memory cell illustrated in FIGS. 22A-22L, according to certain aspects of the present inventions;

FIGS. 27A-27C are block diagram illustrations of an exemplary devices in which the layouts, architectures and/or processes may be implemented wherein FIGS. 27A and 27C are logic devices (having logic circuitry and resident memory) and FIG. 27B is a memory device (being primarily a memory storage device and having logic circuitry and a memory array), according to certain aspects of the present inventions;

FIGS. 29A-29I illustrate cross-sectional views (sectioned along dotted line A-A of FIG. 28B) of the fabrication of a portion of the memory cell array of FIGS. 28A-28C at various stages of an exemplary process that provide the gate structure of the electrically floating body transistor of FIG. 12, according to certain aspects of the present inventions, wherein source and/or drain regions are shared between the electrically floating body transistors of adjacent memory cells;

FIGS. 29J-29U illustrate cross-sectional views (sectioned along dotted line A-A of FIG. 28B) of the fabrication of a portion of the memory cell array of FIGS. 28A-28C at various stages of an exemplary process that provide the gate structure of FIG. 12 and barriers between the drain and source regions of the electrically floating body transistors of adjacent memory cells, according to certain aspects of the present inventions;

FIG. 33A is an exemplary plan view layout (not drawn to scale) of a portion of the memory cell array of FIG. 28A illustrating the common source and common drain transistor of the memory cell and memory cell array architecture, in conjunction with an embodiment of the source/drain regions described and illustrated in U.S. patent application Ser. No. 12/332,413 and U.S. Provisional Application Ser. No. 61/007,103, according to an exemplary embodiment of certain aspects of the present inventions; and FIG. 33B is a cross-sectional view (sectioned along dotted line A-A of FIG. 12) of a portion of memory cell array of FIGS. 28A and 33A illustrating an exemplary embodiment of the present inventions according to at least one aspect of the present inventions wherein the source and drain regions of the transistors of the memory cells comprise a polycrystalline semiconductor material in accordance with the inventions described and/or illustrated in U.S. patent application Ser. No. 12/332,413 and U.S. Provisional Application Ser. No. 61/007,103, for example, polycrystalline silicon.

Figure 1A:
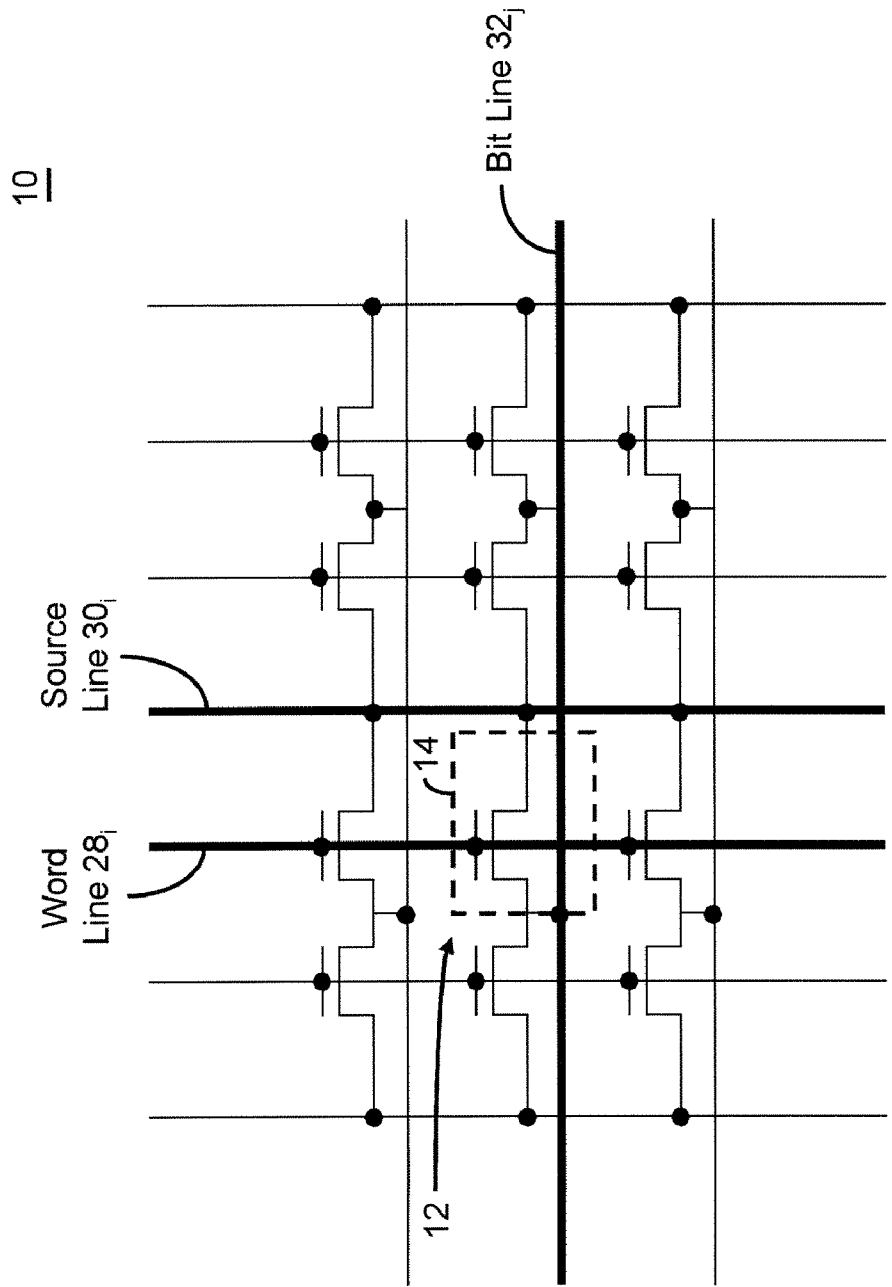
FIG. 1A is a schematic representation of a prior art DRAM array including a plurality of memory cells comprised of one electrically floating body transistor.
Figure 1B:
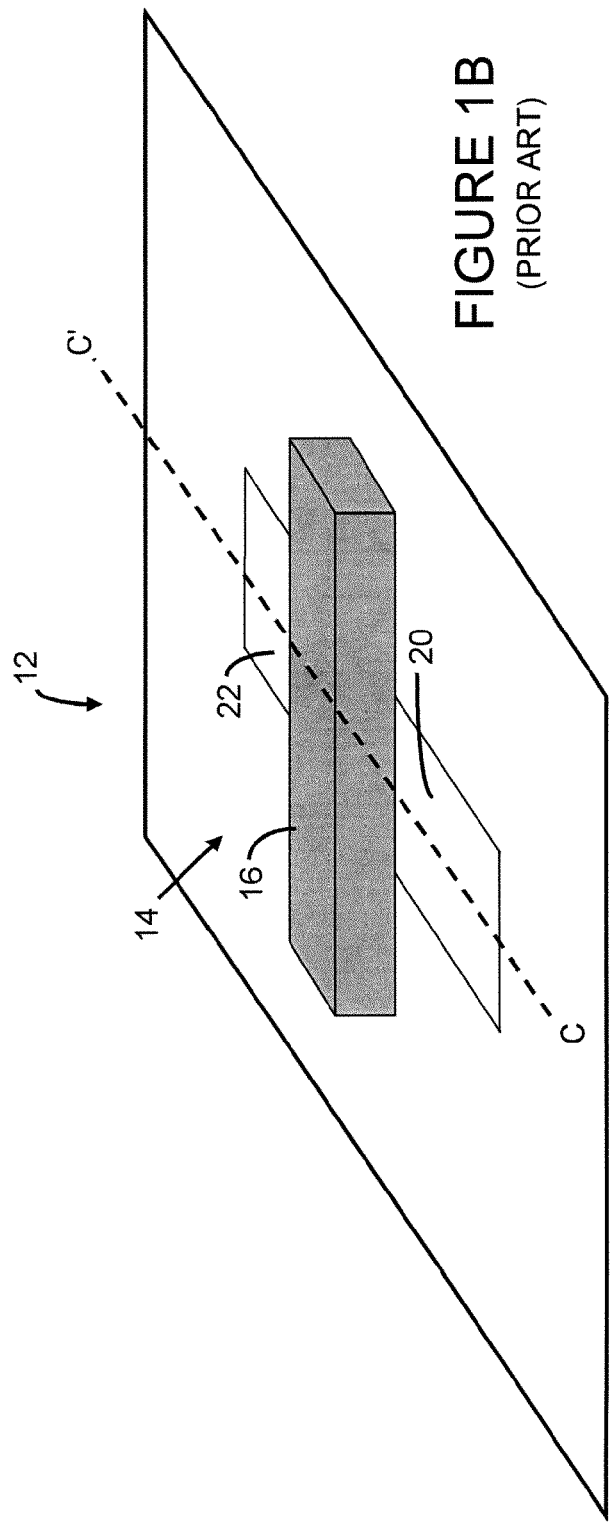
FIG. 1B is a three dimensional view of an exemplary prior art memory cell comprised of one electrically floating body transistor (PD-SOI NMOS)
Figure 1C:
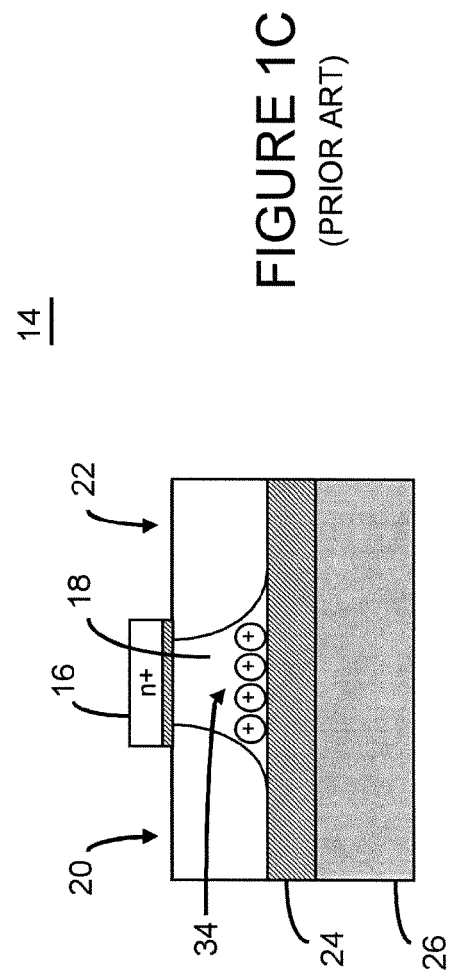
FIG. 1C is a cross-sectional view of the prior art memory cell of FIG. 1B, cross-sectioned along line C-C'.
Figure 2A:
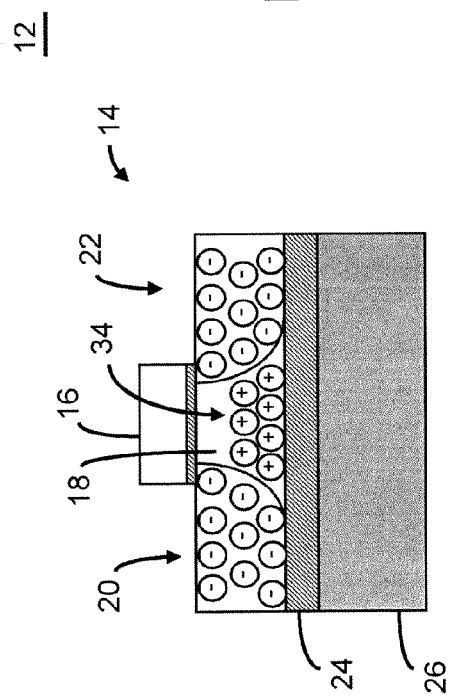
FIGS. 2A and 2B are exemplary schematic illustrations of the charge relationship, for a given data state, of the floating body, source and drain regions of a prior art memory cell comprised of one electrically floating body transistor (PD-SOI NMOS)
Figure 2B:
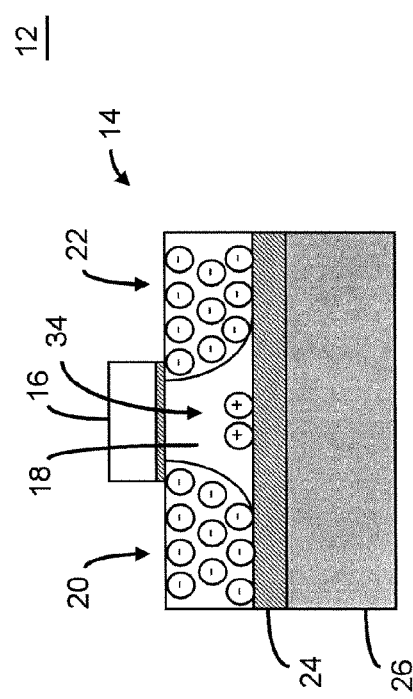
Figure 3A:
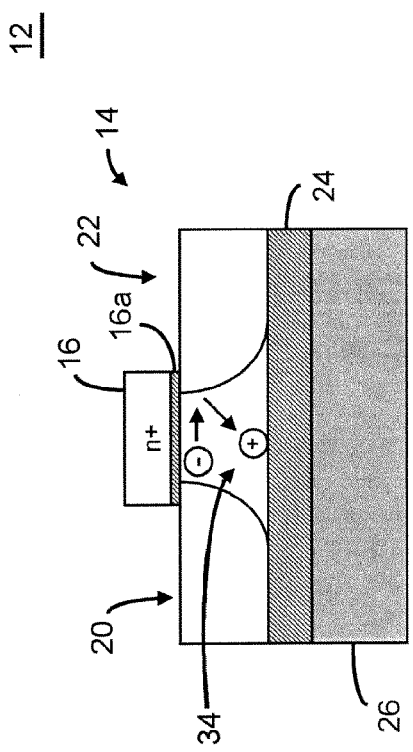
FIGS. 3A and 3B are exemplary schematic and general illustrations of conventional methods to program a memory cell to logic state "1" (i.e., generate or provide an excess of majority carrier in the electrically floating body of the transistor (an n-type channel transistor in this exemplary embodiment) of the memory cell of FIG. 1B; majority carriers in these exemplary embodiments are generated or provided by the channel electron impact ionization (FIG. 3A) and by GIDL or band to band tunneling (FIG. 3B))
Figure 3B:
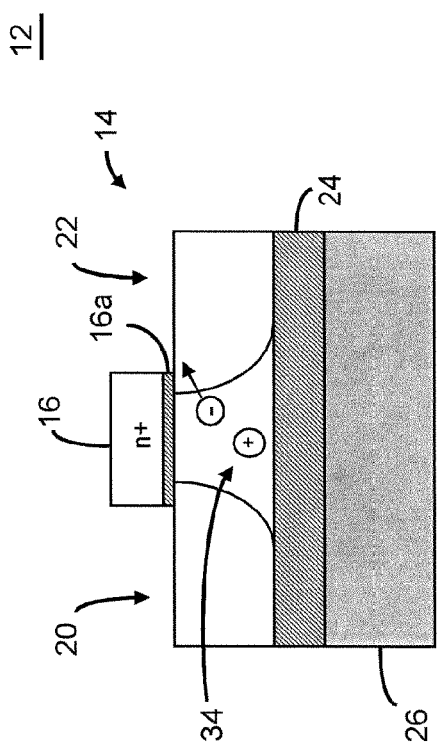
Figure 4A:
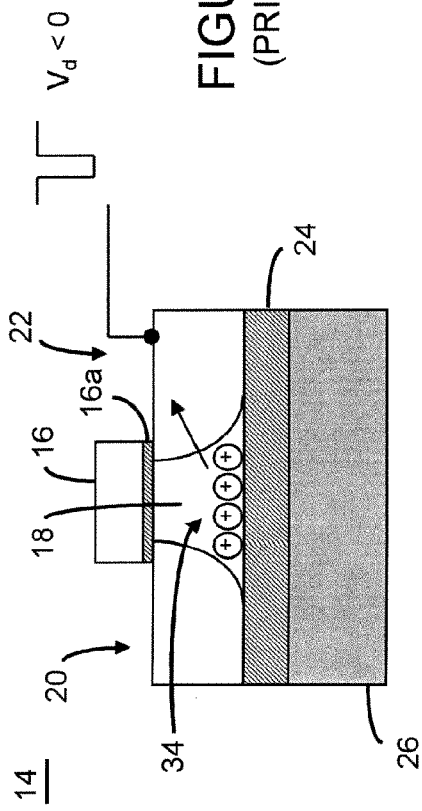
FIGS. 4A-4C are exemplary schematics and general illustrations of conventional methods to program a memory cell to logic state "0" (i.e., provide relatively fewer majority carriers by removing majority carriers from the electrically floating body of the transistor of the memory cell of FIG. 1B; majority carriers may be removed through the drain region/terminal of the transistor (FIG. 4A), the source region/terminal of the transistor (FIG. 4B), and through both drain and source regions/terminals of the transistor by using, for example, the back gate pulses applied to the substrate/backside terminal of the transistor of the memory cell (FIG. 4C))
Figure 4B:
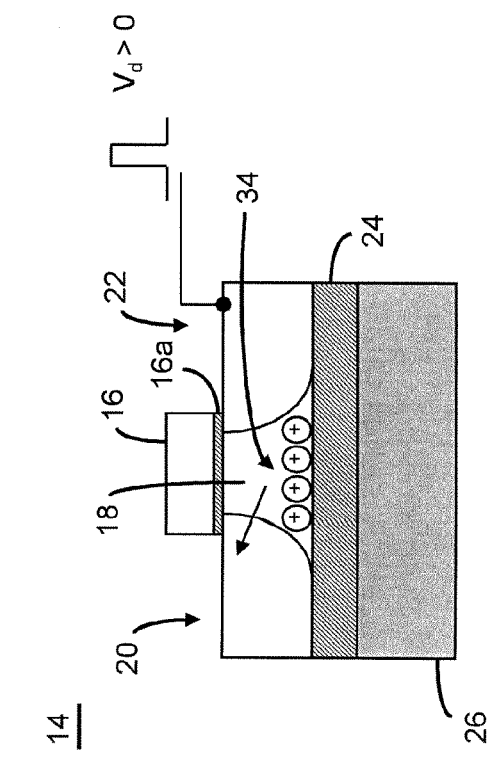
Figure 4C:
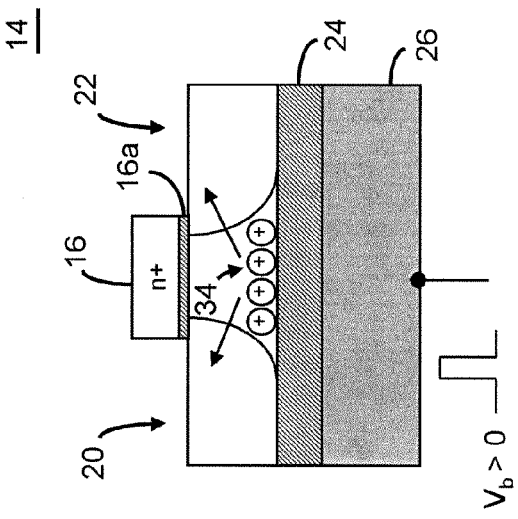
Figure 5:
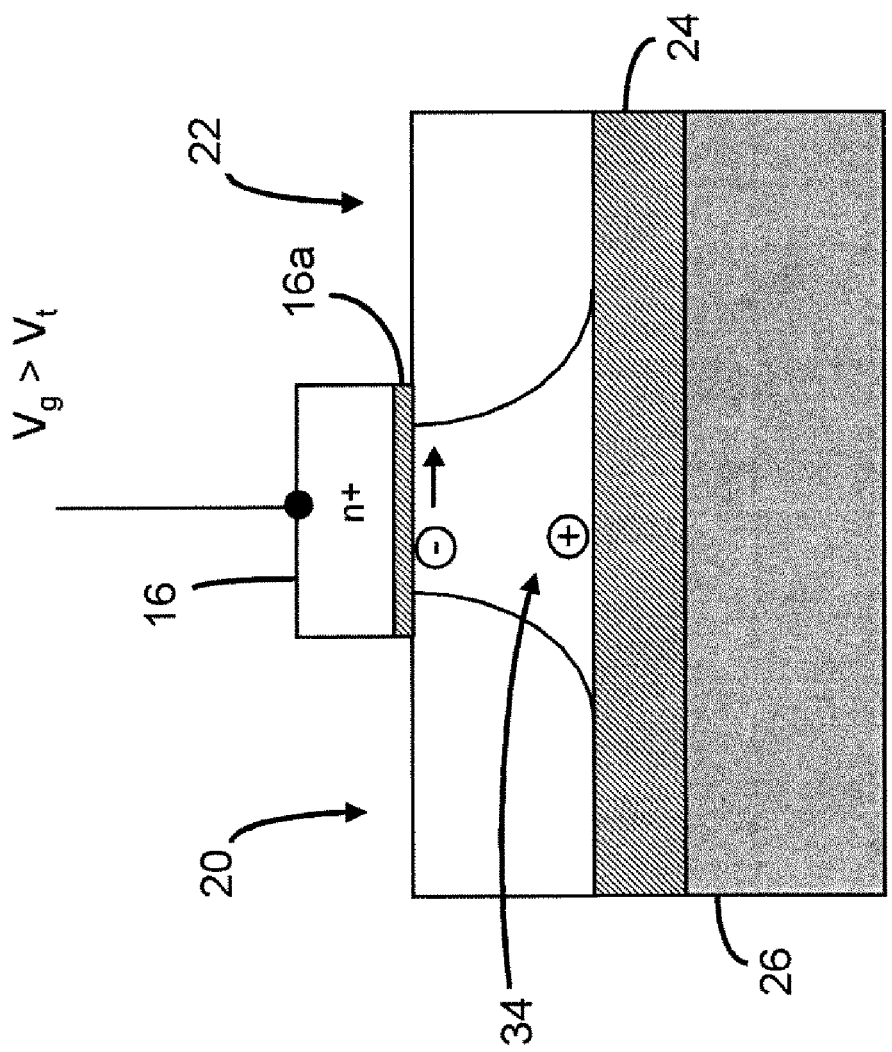
FIG. 5 illustrates an exemplary schematic (and control signal) of a conventional reading technique, the state of the memory cell may be determined by sensing the amount of the channel current provided/generated in response to the application of a predetermined voltage on the gate of the transistor of the memory cell.
Figure 6:
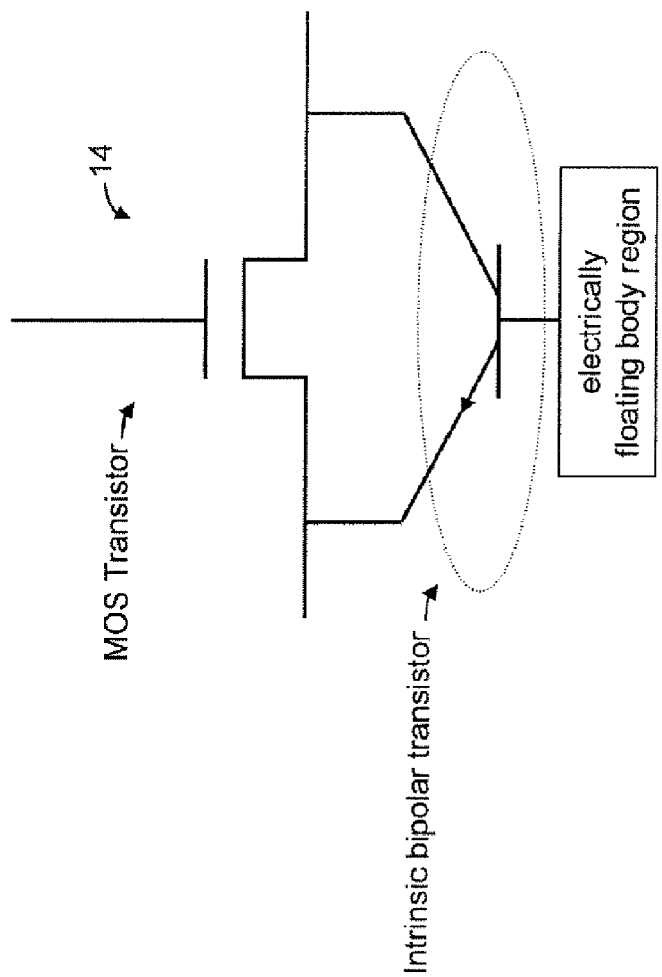
FIG. 6 is a schematic representation of an equivalent electrically floating body memory cell (n-channel) including an intrinsic bipolar transistor in addition to the MOS transistor.
Figure 7:
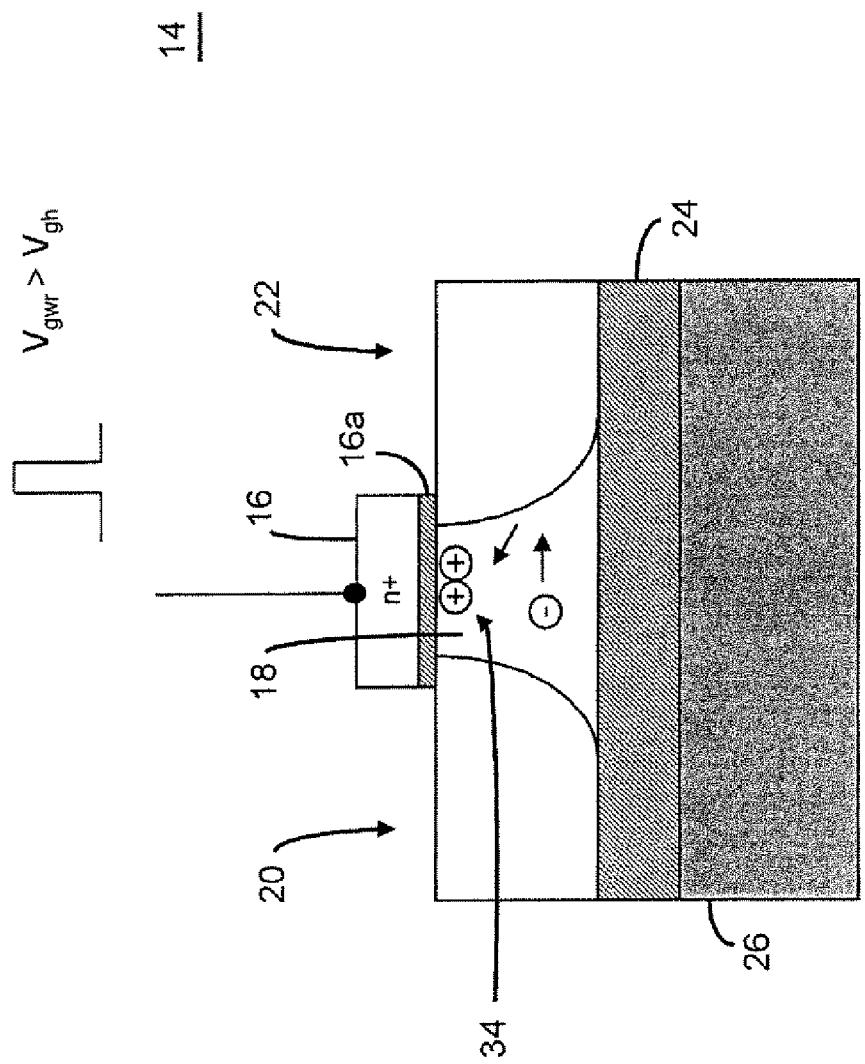
FIG. 7 illustrates an exemplary schematic (and control signal voltage relationship) of an exemplary embodiment of an aspect of the '188 Application of programming a memory cell to logic state "1" by generating, storing and/or providing an excess of majority carriers in the electrically floating body of the transistor of the memory cell.
Figure 8:
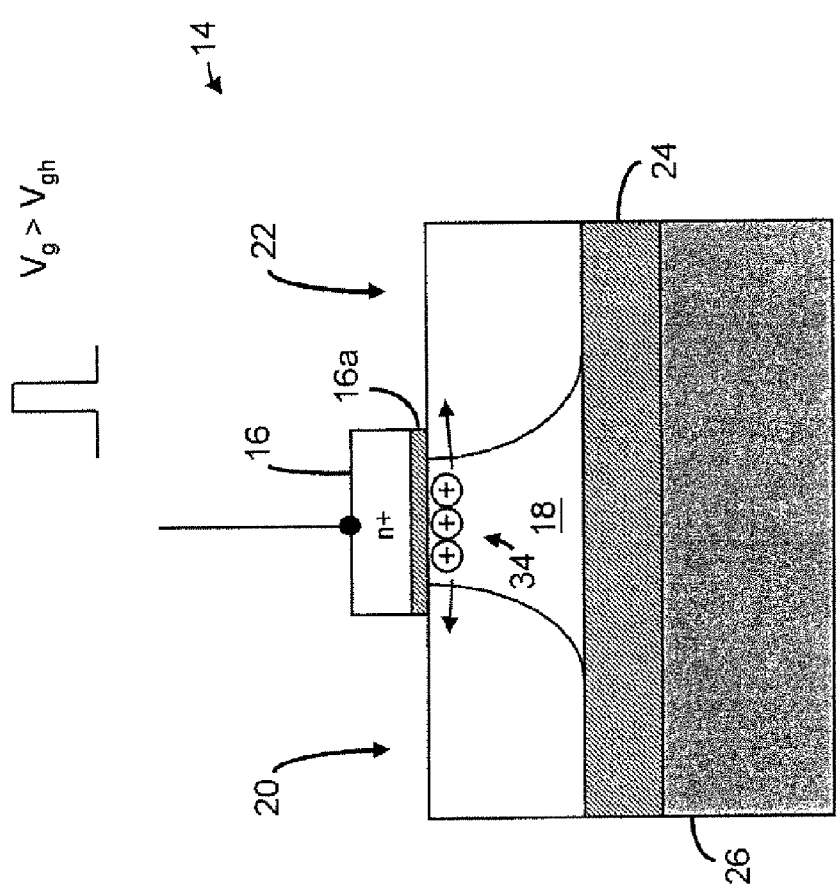
FIG. 8 illustrates an exemplary schematic (and control signals) of an exemplary embodiment of an aspect of the '188 Application of programming a memory cell to a logic state "0" by generating, storing and/or providing relatively fewer majority carriers (as compared to the number of majority carriers in the electrically floating body of the memory cell that is programmed to a logic state "1") in the electrically floating body of the transistor of the memory cell, wherein the majority carriers are removed (write "0") through both drain and source terminals by applying a control signal (for example, a programming pulse) to the gate of the transistor of the memory cell.
Figure 9:
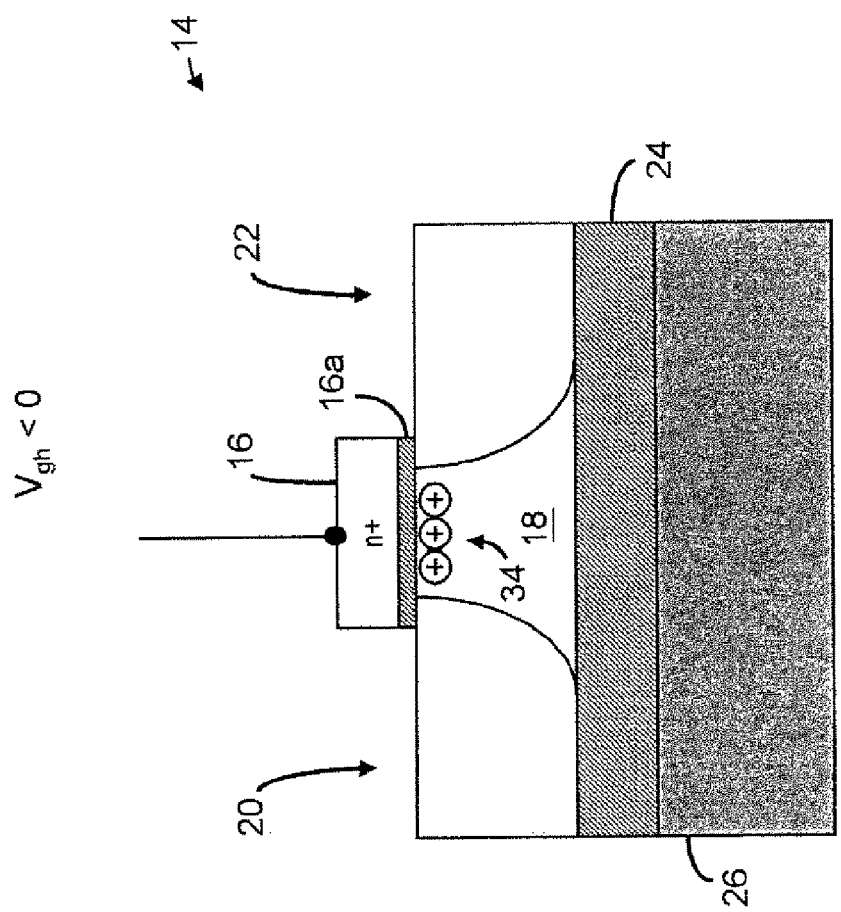
FIG. 9 illustrates an exemplary schematic (and control signals) of an exemplary embodiment of an aspect of the '188 Application of holding or maintaining the data state of a memory cell.
Figure 10:
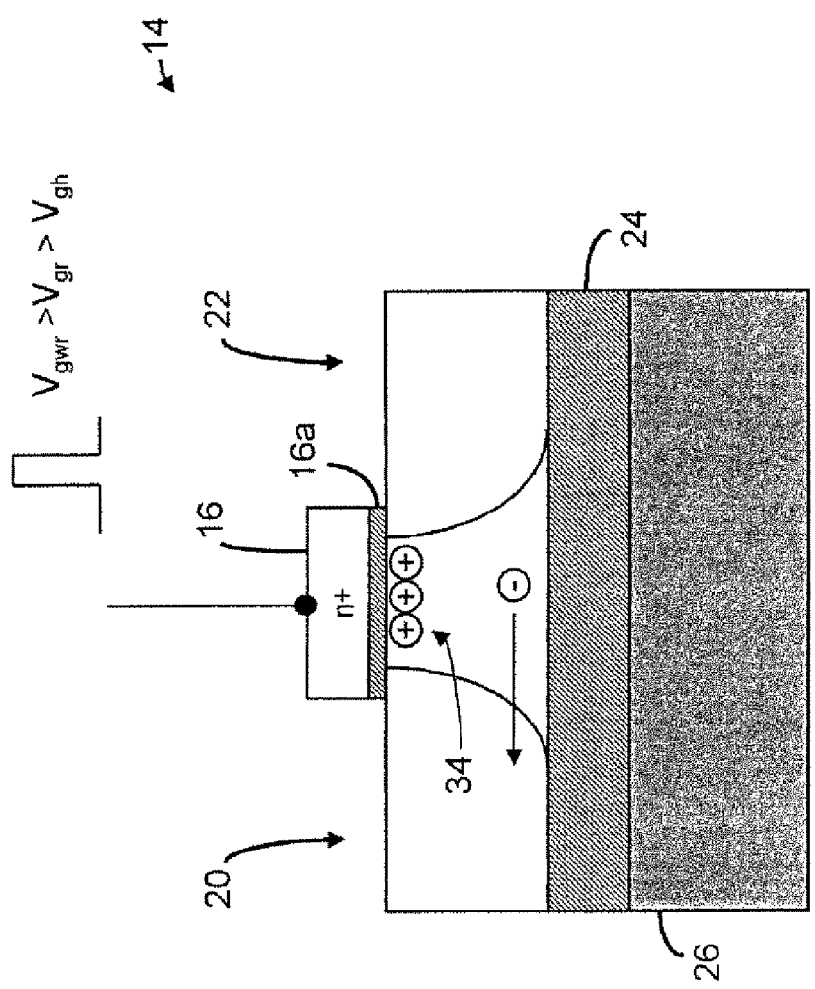
FIG. 10 illustrates an exemplary schematic (and control signals) of an exemplary embodiment of an aspect of the '188 Application of reading the data state of a memory cell by sensing the amount of the current provided/generated in response to an application of a predetermined voltage on the gate of the transistor of the memory cell.

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

There are many inventions described and illustrated herein. In one aspect, the present inventions are directed to a memory cell and/or a memory cell array having a plurality of memory cells wherein each memory cell includes an n-channel electrically floating body transistor having a gate comprising a material including a work function that is higher and/or substantially higher than the work function of n+ doped polycrystalline silicon material. In another aspect, the present inventions are directed to an integrated circuit having logic circuitry and such a memory cell and/or such a memory cell array. The gate may be comprised of one or more materials having electrical characteristics that, alone or in combination, provide a work function which is higher than conventional material(s) (for example, the work function of n+ doped polycrystalline silicon material).

In one embodiment, the gate of an n-channel transistor includes a p+ doped polycrystalline silicon material having electrical characteristics (via, for example, thickness and/or doping concentration thereof) that provide a work function of about 5 eV or higher. Such a configuration may provide one or more of the following advantages (relative to the electrically floating body transistor discussed/illustrated in the Introduction Section): (i) a threshold voltage of the n-channel transistors which reduces the parasitic leakage through the channel (in comparison to conventional configurations), (ii) a reduction of the voltage applied to the gate to write one or more data states, (iii) a significant reduction of the voltage applied to the gate during the hold operation (i.e., the charge or data state retention mode), and/or (iv) a reduction in power dissipation of one or more memory cells as well as the power dissipation of the memory cell array.

In another aspect, the present inventions are directed to methods of manufacturing such memory cell, memory cell arrays and/or integrated circuit. Notably, the memory cell and/or memory cell array may comprise a portion of an integrated circuit device, for example, a logic device (such as, a microcontroller or microprocessor) or a portion of a memory device (such as, a discrete memory).

The present inventions may be implemented in conjunction with any memory cell technology, whether now known or later developed. For example, the memory cells may include one or more transistors having electrically floating body regions (for example, as described in detail in the Introduction), one transistor-one capacitor architectures, electrically floating gate transistors, junction field effect transistors (often referred to as JFETs), or any other memory/transistor technology whether now known or later developed. All such memory technologies are intended to fall within the scope of the present inventions.

Moreover, the present inventions may be implemented in conjunction with any type of memory (including discrete or integrated with logic devices), whether now known or later developed. For example, the memory may be a DRAM, SRAM and/or Flash. All such memories are intended to fall within the scope of the present inventions.

In one embodiment, the memory cell and/or memory cells of the memory cell array includes at least one transistor having an electrically floating body transistor which stores an electrical charge in the electrically floating body region thereof. The amount of charge stored in the in the electrically floating body region correlates to the data state of the memory cell. One type of such memory cell is based on, among other things, a floating body effect of semiconductor on insulator (SOI) transistors. (See, for example, (1) Fazan et al., U.S. Pat. No. 6,969,662, (2) Okhonin et al., U.S. Patent Application Publication No. 2006/0131650 ("Bipolar Reading Technique for a Memory Cell Having an Electrically Floating Body Transistor"), (3) Okhonin et al., U.S. Patent Application Publication No. 2007/0058427 ("Memory Cell and Memory Cell Array Having an Electrically Floating Body Transistor, and Methods of Operating Same"), (4) Okhonin, U.S. Patent Application Publication No. 2007/0138530 ("Electrically Floating Body Memory Cell and Array, and Method of Operating or Controlling Same"), and (5) Okhonin et al., U.S. Patent Application Publication No. 2007/0187775, ("Multi-Bit Memory Cell Having Electrically Floating Body Transistor, and Method of Programming and Reading Same"), all of which are incorporated by reference herein in its entirety). In this regard, the memory cell may consist of a partially depleted (PD) or a fully depleted (FD) SOI transistor or bulk transistor (transistor which formed in or on a bulk material/substrate) having a gate, which is disposed adjacent to the electrically floating body and separated therefrom by a gate dielectric. The PD or FD SOI memory transistors made in the standard planar or any 3D technology may include a single gate or a plurality of gates (for example, double gate, FinFET, planar or vertical DG-MOSFET (DG=Double Gate) or Pillar gate architectures). The body region of the transistor is electrically floating in view of the insulation or non-conductive region, for example, in bulk-type material/substrate, disposed beneath and/or adjacent to the body region. The state of memory cell may be determined by, for example, the concentration or amount of charge contained or stored in the body region of the SOI or bulk transistor.

Figure 11:
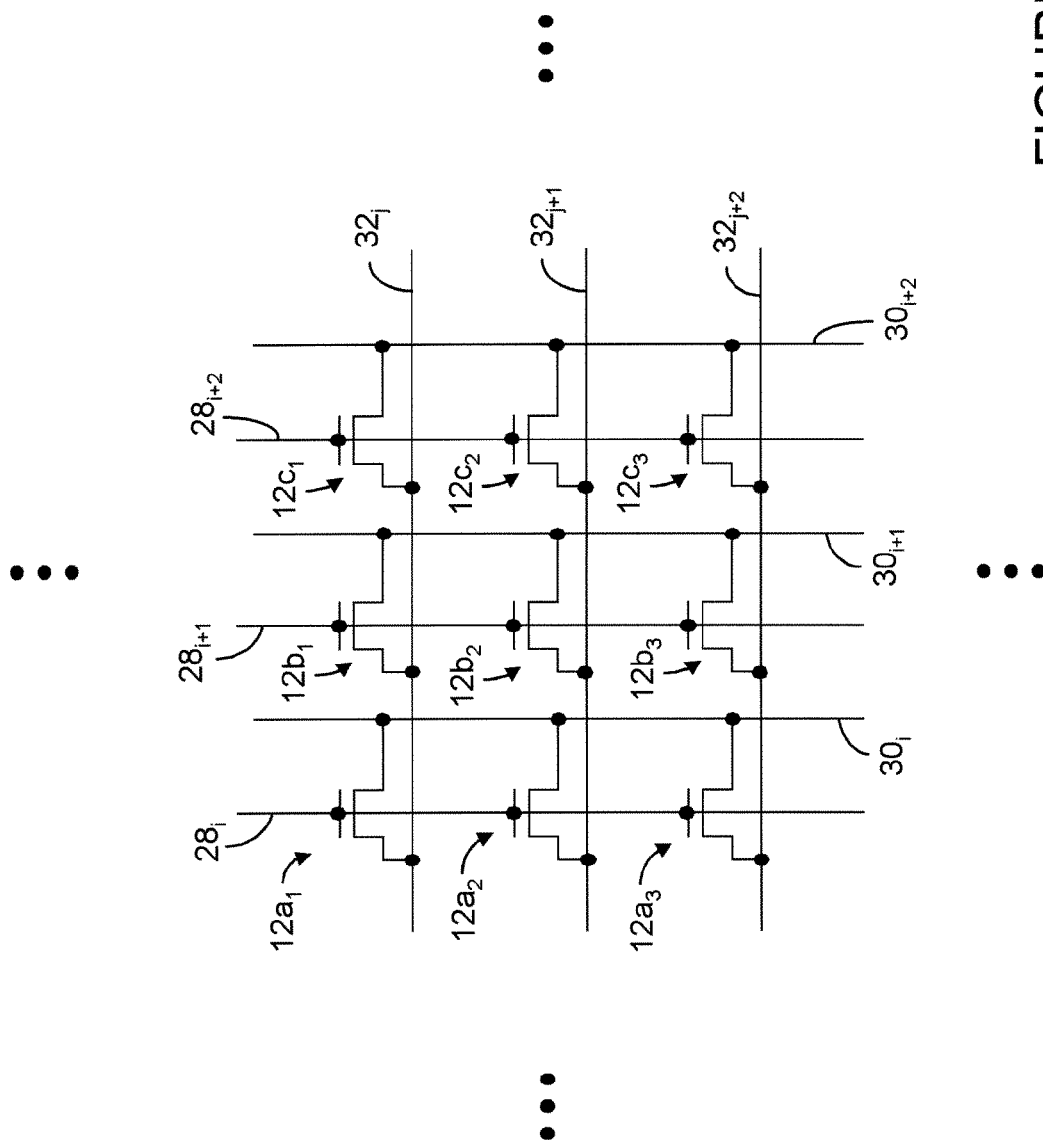
FIG. 11 is a schematic representation of a portion of a memory cell array having a plurality of memory cells, each including an electrically floating body transistor, wherein the memory cell array layout includes memory cells having separated source regions and separated drain regions relative to adjacent memory cells of adjacent rows of memory cells.
Figure 12:
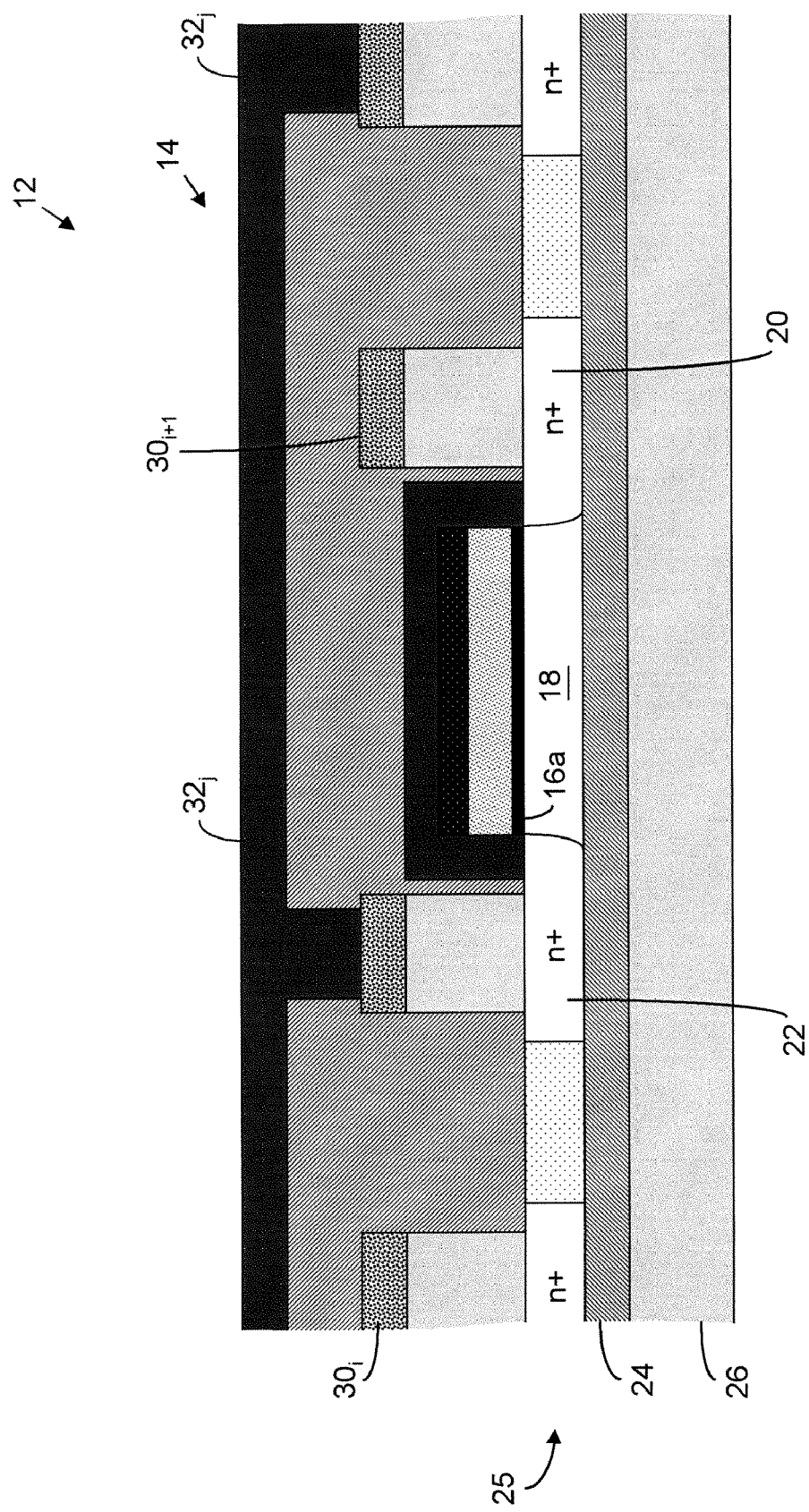
FIG. 12 is a cross-sectional view of an electrically floating body transistor of a memory cell of a portion of a memory cell array of FIG. 11 illustrating an exemplary embodiment of the present inventions according to at least one aspect of the present inventions.
Figure 13A:
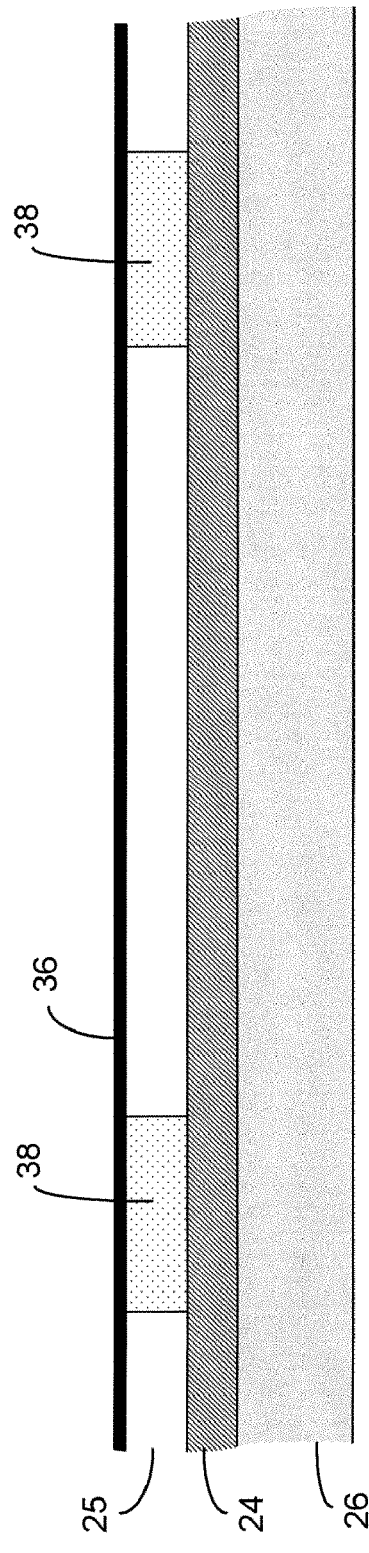

With reference to FIGS. 11, 12 and 13A, in one exemplary embodiment, after the conductivity of semiconductor layer 25 is adjusted to provide suitable or predetermined regions in which n-channel transistors are formed and p-channel transistors are to be formed, the discussion of an exemplary method of manufacturing a memory cell array, including a plurality of memory cells having electrically floating body transistors (as described above), may begin with deposition, growth and/or formation of gate dielectric layer 36 on and over semiconductor layer 25 (for example, silicon-germanium, gallium arsenide, silicon carbide or monocrystalline silicon) using conventional and/or unconventional semiconductor processing techniques. The gate dielectric layer 36 may include one (for example, a silicon dioxide, silicon nitride, or a high dielectric constant material) or more than one material (for example, silicon dioxide and silicon nitride, or other combinations thereof (for example, oxide-nitride-oxide "sandwich" structure) or a high dielectric constant composite material). Notably, gate dielectric layer 36 may be formed using conventional and/or unconventional semiconductor processing techniques (for example, lithographic and etching techniques) to provide the gate dielectric of transistors 14 of memory cells 12. All gate dielectric structures, arrangements and/or materials, whether known or unknown (whether conventional or unconventional), are intended to fall within the scope of the present inventions.

As indicated above, the conductivity of semiconductor layer 25 may be adjusted to provide regions in which n-channel transistors are to be formed and p-channel transistors are to be formed. In this regard, prior to deposition, growth and/or formation of gate dielectric layer 36, p-type dopant ions may be implanted and/or introduced into regions in which n-channel transistors are to be formed and n-type dopant ions may be implanted and/or introduced into regions in which p-channel transistors are to be formed.

Notably, in the illustrative embodiment, isolation regions 38 (for example, shallow trench isolation regions) are formed and/or provided between adjacent transistors prior to deposition, growth and/or formation of gate dielectric layer 36. In other embodiments, adjacent transistors (for example, of adjacent memory cells in adjacent rows of memory cells) share source and/or drain regions and, as such, may or may not include isolation regions 38. All configurations and/or architectures of the memory cell array layout (for example, (i) separated source and/or drain regions of transistors of adjacent memory cells and/or (ii) shared source and/or drain regions of transistors of adjacent memory cells) are intended to fall within the scope of the present inventions.

Figure 13B:
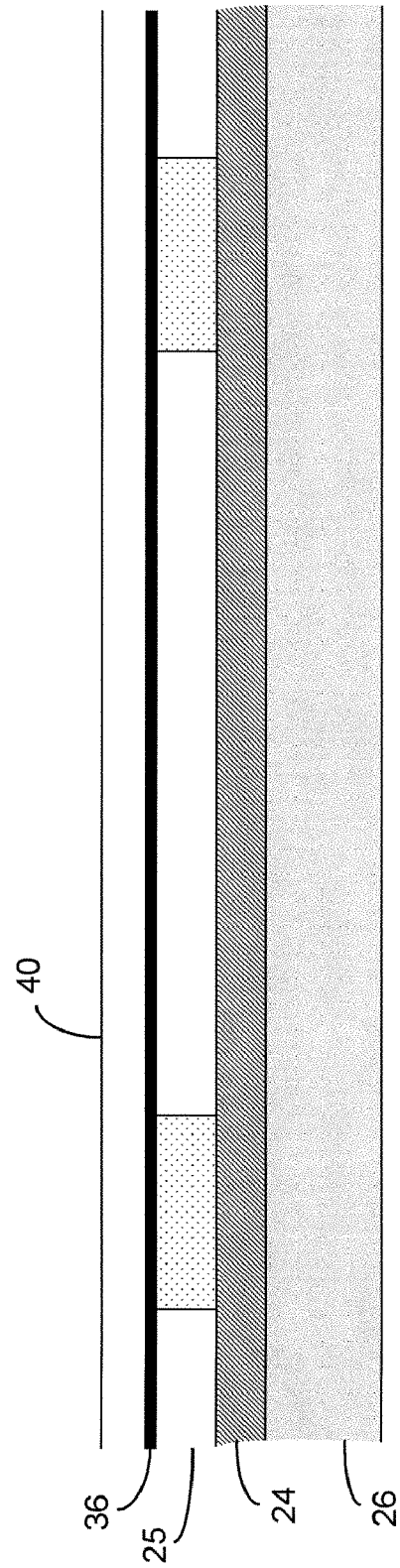

With reference to FIG. 13B, a semiconductor layer 40 is then deposited, grown and/or formed on and over gate dielectric layer 36. The semiconductor layer 40 may include one material (for example, a polycrystalline silicon) as illustrated in FIGS. 12 and 13B or more than one material (for example, a polycrystalline silicon material, barrier material (for example, titanium nitride, tantalum nitride or tungsten nitride), and a metal such as tungsten or molybdenum) as illustrated and discussed below (see, for example, FIG. 21). Notably, semiconductor layer 40 may be formed using conventional and/or unconventional semiconductor processing techniques (for example, lithographic and etching techniques).

Figure 13C:
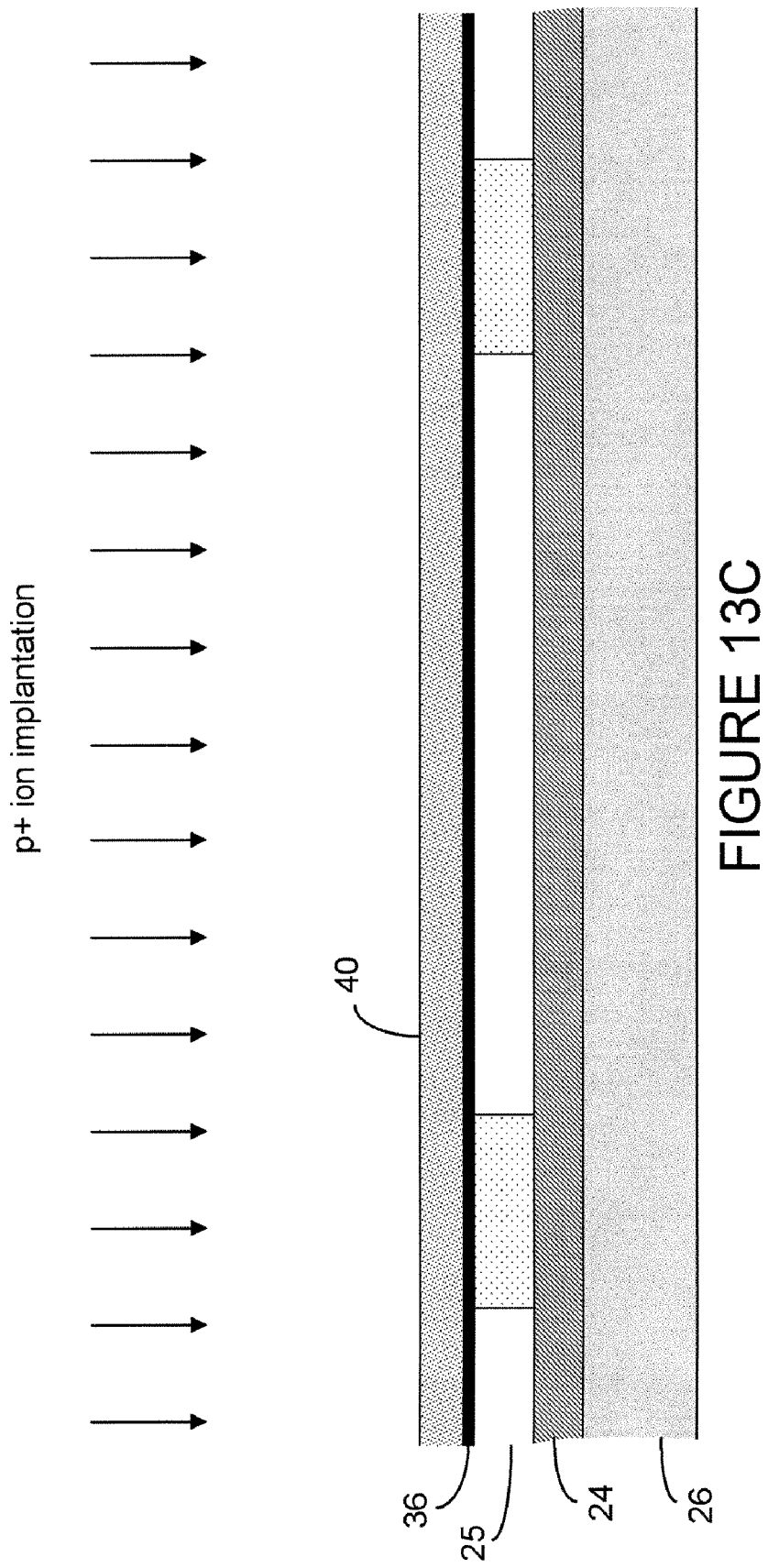

Concurrently with the deposition of semiconductor layer 40, or thereafter—as illustrated in FIG. 13C, a dopant is implanted or introduced into semiconductor layer 40 to increase the work function of the material. In one embodiment, an acceptor type doping species or p-type dopant (such as, for example, boron, gallium, or other element in group 13 of the periodic table as well as compounds (for example, boron difluoride, $BF_2$) having acceptor type characteristics) may be implanted in semiconductor layer 40 (for example, polycrystalline silicon) to increase the work function of the material that will form the gate electrode of the transistors of the memory cells. In this way, the conductivity of semiconductor layer 40 is adjusted such that the negative charge carriers in layer 40 are reduced (relative to, for example, an intrinsic semiconductor material).

Notably, the gate may be comprised of any material (for example, a metal such as palladium (Pd), platinum (Pt), gold (Au), molybdenum nitride (MoN), tungsten nitride (WN), titanium nitride (TiN), iridium (Ir), iridium oxide ($IrO_2$), ruthenium (Ru), ruthenium oxide ($RuO_2$) having a work function greater than n+ polycrystalline silicon (for example, a work function that is greater than 4 eV and/or 5 eV). Indeed, under those circumstances where a material (other than p+ polycrystalline silicon) having a work function that is greater than 4 eV is more readily implemented into the process flow, for example, more easily than p+ polycrystalline silicon, it may be advantageous to employ such material in addition to p+ polycrystalline silicon, or in lieu thereof. Moreover, where such material is a metal or metal compound, such material may provide less polycrystalline depletion effects because it is a metal layer thereby providing a larger gate capacitance and potentially greater reliability and less variability (which may present better or enhanced manufacturability).

Figure 13D:
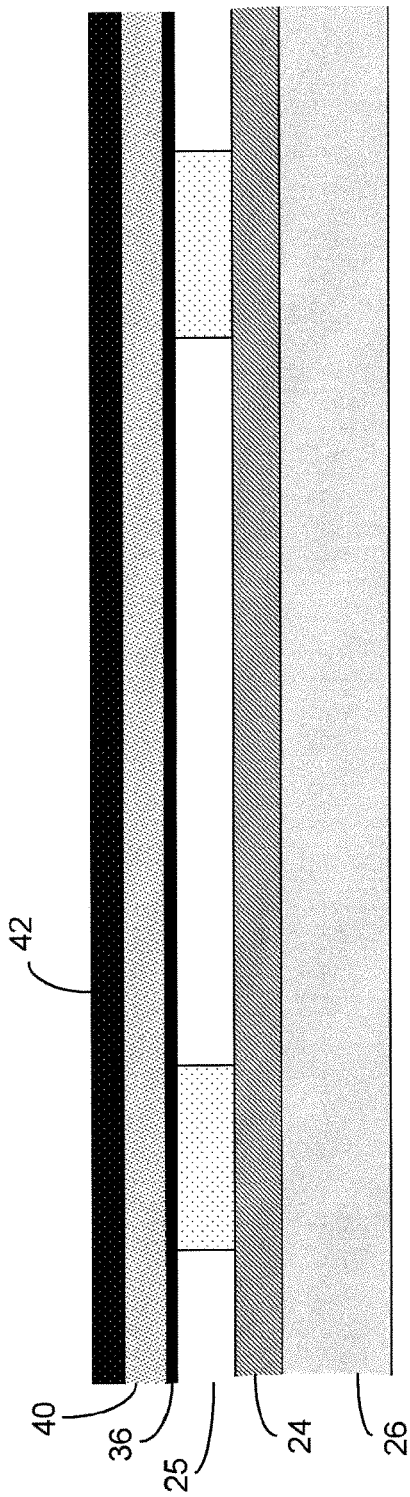
Figure 13E:
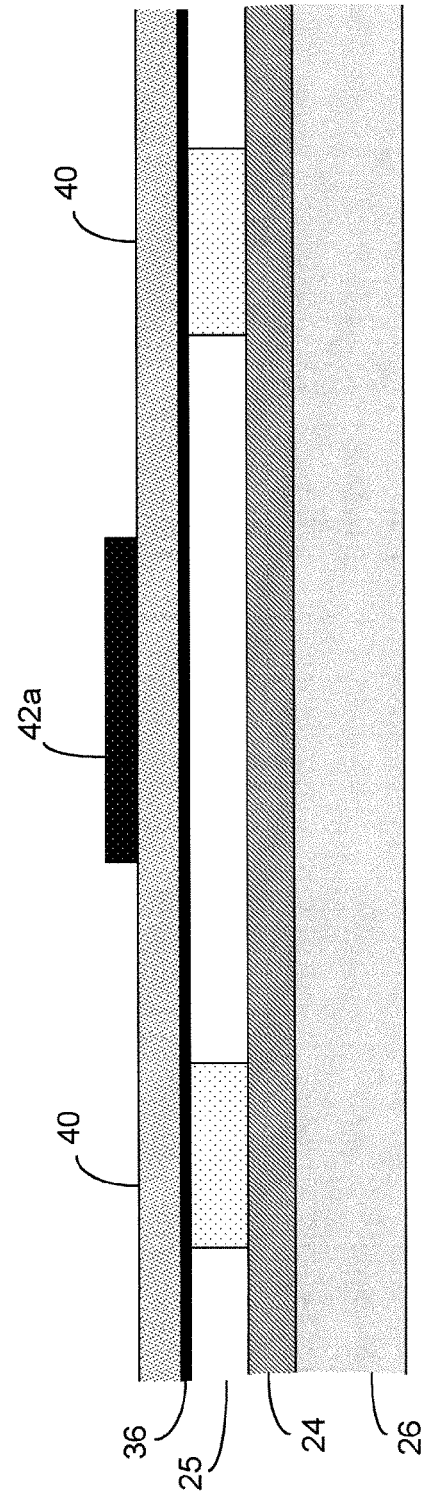

Thereafter, mask material 42 may be deposited, grown and/or provided on or over semiconductor layer 40 (see, FIG. 13D) and gate mask 42a may be formed using, for example, conventional semiconductor processing techniques (see, FIG. 13E). Selected portions of semiconductor layer 40 and gate dielectric material 36 may then be etched, removed and/or patterned to form and/or provide gate 16 and gate dielectric 16a. (See, FIG. 13F). In addition to formation or providing of gate 16 and gate dielectric 16a, selected portions of semiconductor layer 25 are exposed which will provide (after additional processing) the source and drain regions of transistors 14 of memory cells 12. In one embodiment, an anisotropic etch technique is employed to remove selected portions of semiconductor layer 40 and gate dielectric material 36 to form and/or provide gates 16 and gate dielectrics 16a of transistors 14 of memory cells 12.

Figure 13H:
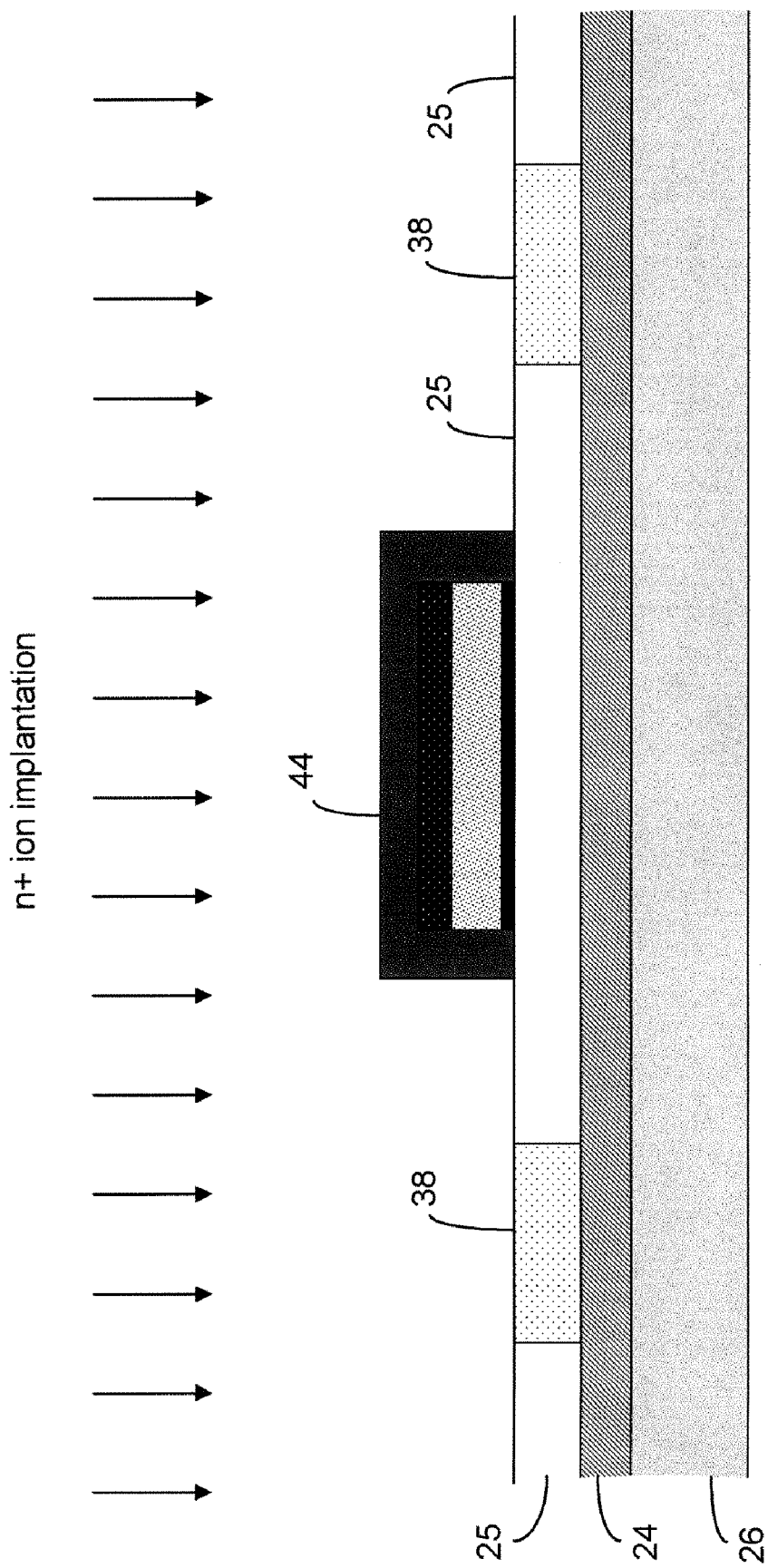
Figure 13I:
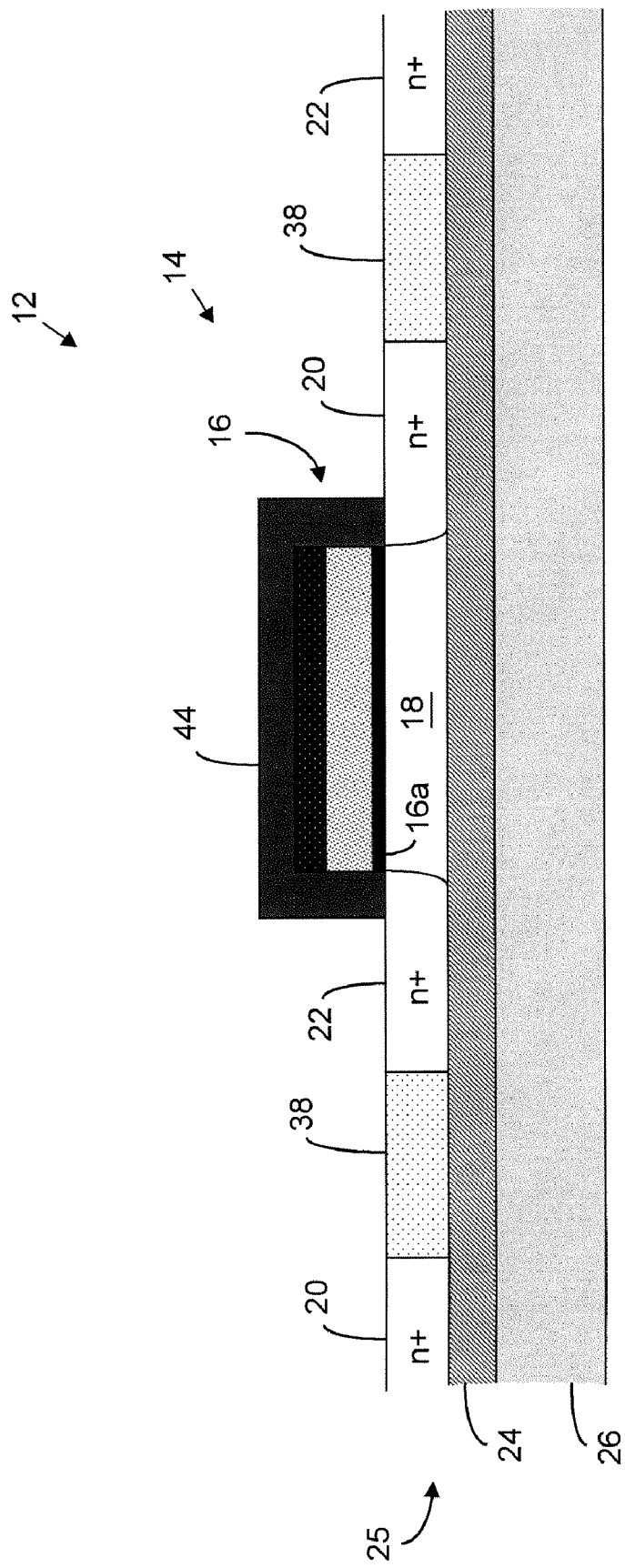

With reference to FIGS. 13G, 13H and 13I, the manufacturing process may continue with the source/drain implantation into semiconductor layer 25 (for example, silicon-germanium, gallium arsenide, silicon carbide or monocrystalline silicon) using conventional and/or unconventional semiconductor processing techniques (for example, doping, implantation and annealing techniques). In this exemplary method, dopant ions (n-type ions such as phosphorus and/or arsenic) are implanted in exposed areas/portions of semiconductor layer 25. The spacer 44 (for example, a silicon nitride and/or a silicon oxide material) may be formed and/or provided using conventional and/or unconventional techniques to provide desired, suitable, predetermined and/or proper relative alignment of body, source and drain regions of the transistors. (See, FIG. 13G). The dopant ions (n-type) may be implanted and/or introduced into "exposed" portions of semiconductor layer 25 (see FIG. 13H) to change the conductivity of such portions of semiconductor layer 25 relative to portions of layer 25 not exposed to implantation (for example, portions beneath gate 16). Notably, in this embodiment, the dopant is introduced into semiconductor layer 25 using gate 16 and associated spacers 44 to provide a self-aligned source/drain regions of the transistor.

With reference to FIG. 13I, after annealing and formation of a lightly doped region (if any) of the source/drain regions (via, for example, an additional dopant implant and/or annealing) before/after the ion implantation or instruction of FIG. 13H, memory cells 12 includes transistors 14 having gate 16 and gate dielectric 16a, which is disposed between gate 16 and body region 18 of transistors 14. The body region 18 is disposed between source region 20 and drain region 22 of transistors 14. In this illustrated embodiment (wherein one of a plurality are illustrated), transistors 14 are disposed on region 24 (for example, insulation region (such as silicon oxide or silicon nitride) or non-conductive region (for example, region of a bulk semiconductor die or wafer)).

Figure 13J:
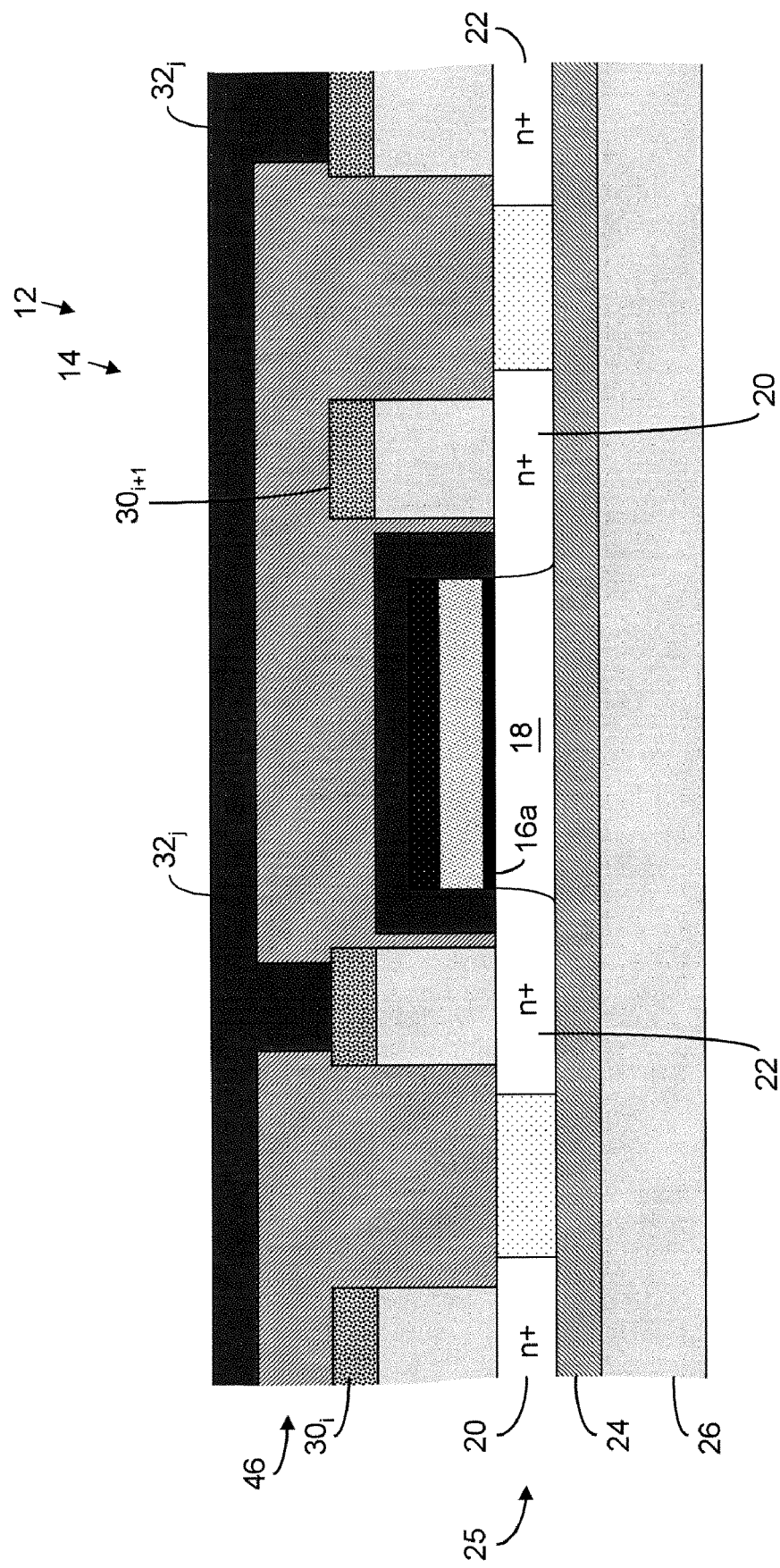

With reference to FIG. 13J, thereafter, one or more insulation and planarization materials 46 may be deposited, grown formed and/or provided (using conventional semiconductor processing techniques), via holes formed in one or more of the insulation and planarization materials 46, and source and bit line contacts deposited, grown and/or formed to facilitate electrical connection to an associated source line 30 and associated bit line 32, respectively. The one or more insulation and planarization materials 46 may include one or more polymers, silicon dioxides and/or silicon nitrides, combinations of silicon dioxides and silicon nitrides in a stack configuration, and/or silicate glass materials (for example, BPSG, PSG and/or BSG)). Indeed, all materials and deposition, formation and/or growth techniques of the one or more insulation and planarization materials 46, whether now known or later developed, are intended to be within the scope of the present inventions.

The source lines 30 and/or bit lines 32 may be formed from a highly conductive material (for example, a metal such as copper, chromium, gold, silver, molybdenum, platinum, palladium, tungsten and/or titanium), metal stacks, complex metals and/or complex metal stacks) and/or a semiconductor material (for example, a silicon or silicon-germanium, whether doped or undoped) which is deposited, grown and/or formed in one or more processes. Notably, although not illustrated or fabricated in this manner in the exemplary embodiments, source line 30 may be fabricated in the same or similar manner as bit line 32 (i.e., the source lines may be connected to associated source regions of transistors of associated memory cells by way of the same or similar material as described above with respect to bit lines 32).

Thereafter (for example, immediately or after additional circuitry and/or conductive layers are deposited, formed or grown), a passivation layer (not illustrated) may be deposited, formed or grown on the exposed surfaces (for example, exposed portions of bit line and/or source line, circuitry and/or conductive layers) to protect and/or insulate integrated circuit device. The passivation layer may include one or more layers including, for example, polymers, a silicon dioxide and/or a silicon nitride. Indeed, passivation layers may include, for example, a combination of silicon dioxide and a silicon nitride in a stack configuration; indeed, all materials and deposition, formation and/or growth techniques, whether now known or later developed, are intended to be within the scope of the present inventions.

Figure 14A:
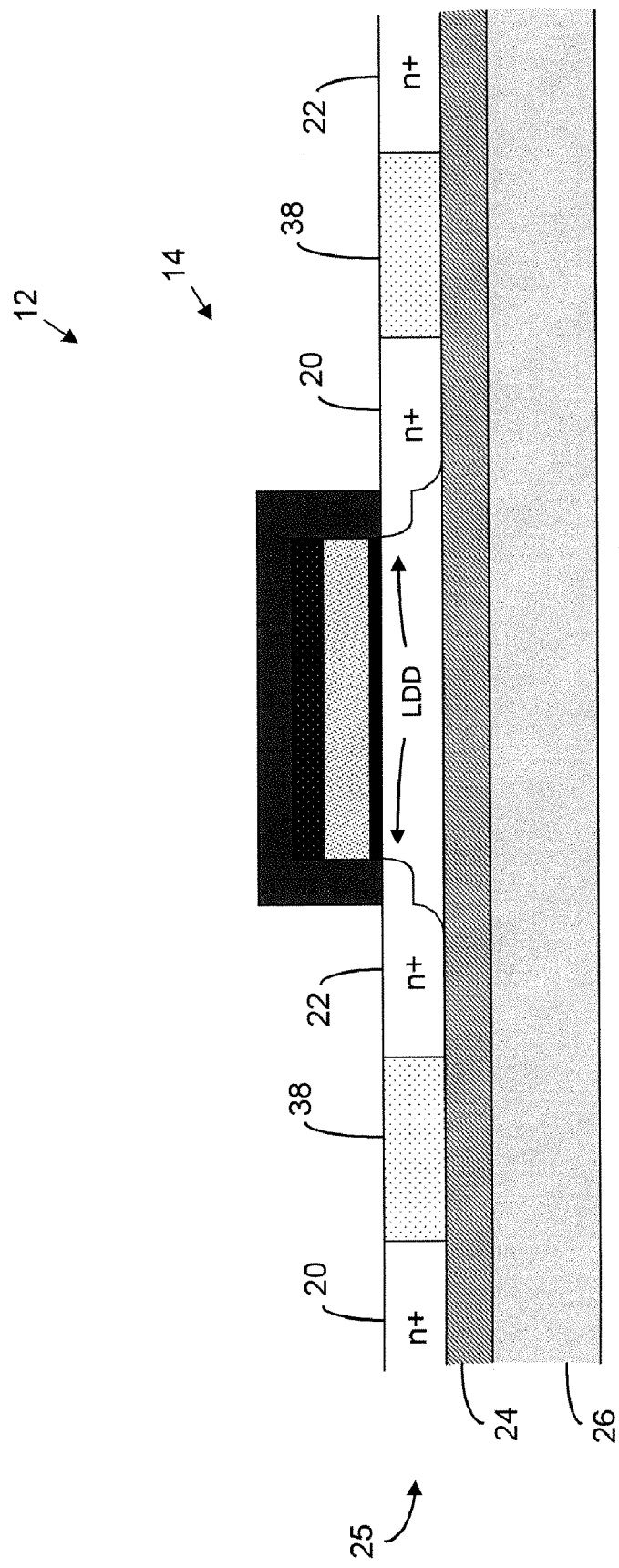
FIGS. 14A-14C are cross-sectional views of an electrically floating body transistor of a memory cell of a portion of a memory cell array of FIGS. 11 and 12 illustrating exemplary embodiments of the present inventions, wherein the source and/or drain regions of the transistors include lightly doped regions (FIG. 14A), halo regions (FIG. 14B) and a combination thereof (FIG. 14C); all source and/or drain regions structures, arrangements and/or configurations/layouts, whether known or unknown (whether conventional or unconventional), are intended to fall within the scope of the present inventions.
Figure 14B:
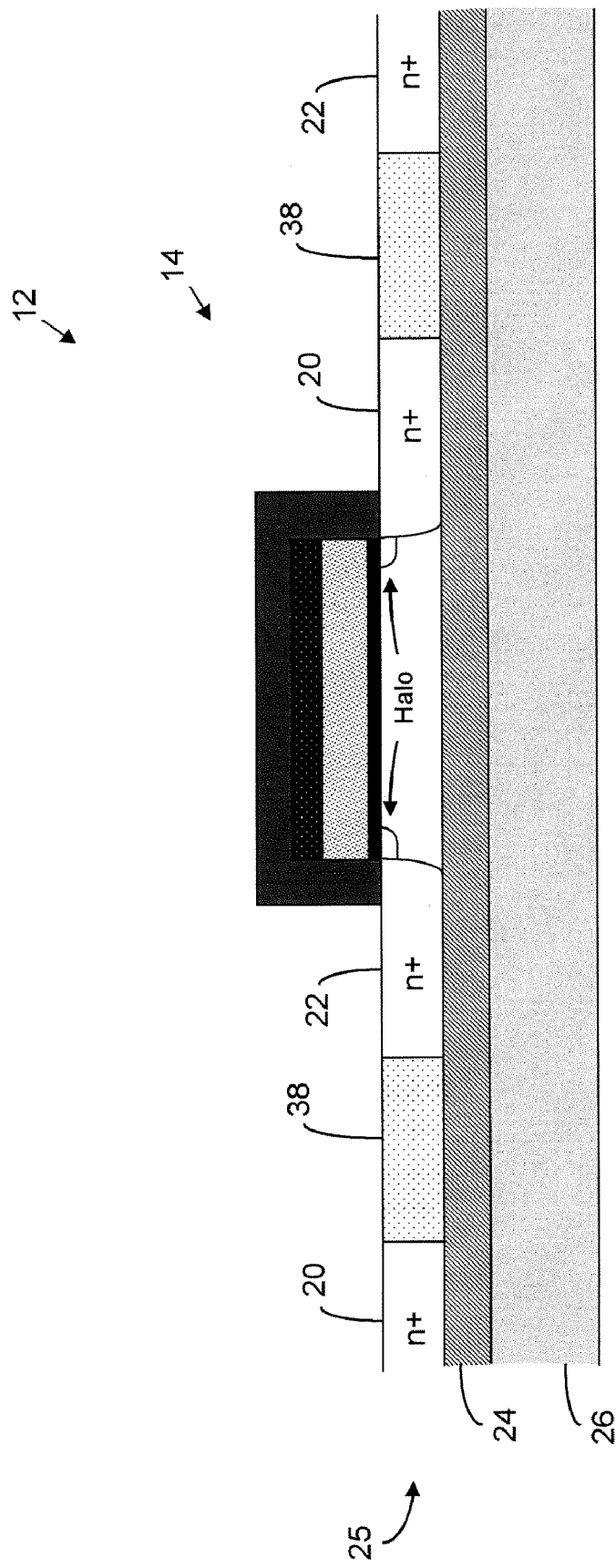
Figure 14C:
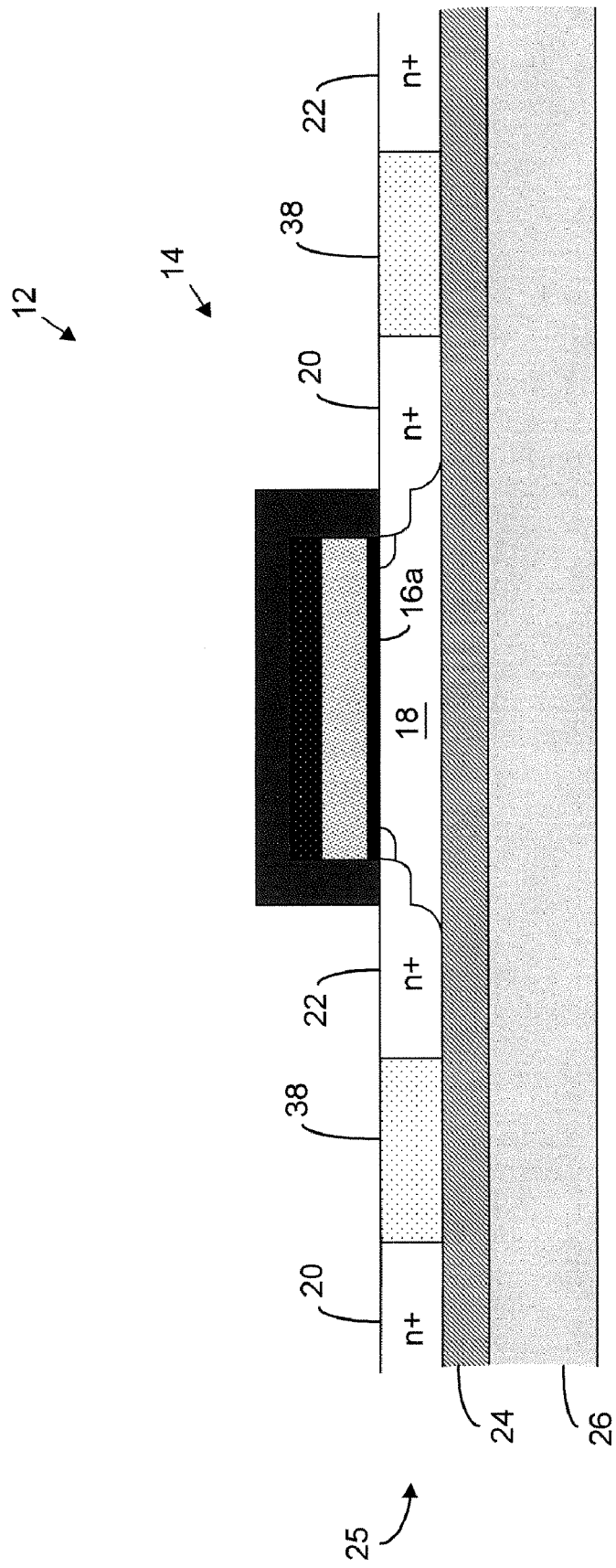

Notably, the source and/or drain regions may include lightly doped drain or extension regions ("LDD"), halo or pocket regions ("Halo") and/or combinations thereof. (See, for example, FIGS. 14A-14C, respectively). All source and/or drain regions structures, arrangements and/or configurations/layouts, whether known or unknown (whether conventional or unconventional), are intended to fall within the scope of the present inventions.

The transistors and other elements of the logic circuitry (for example, periphery circuitry) of the integrated circuit may be fabricated differently than the electrically floating body transistors of the memory cells of the memory cell array. In this regard, additional processing may be employed to "protect" transistors and/or other elements (active and/or passive) in the logic circuitry of the integrated circuit during fabrication of gates 16 of transistors 14 of memory cells 12 of the memory cell array. For example, a mask (soft or hard) or other protective layer may be disposed on or over such transistors and/or other elements (active and/or passive) in the logic circuitry of the integrated circuit during certain portions of the fabrication of the electrically floating body transistors of the memory cells of the memory cell array. In this way, the gates of the transistors in the logic circuitry of the integrated circuit are substantially unaffected during such certain fabrication process of gates 16 of transistors 14 of memory cells 12 of the memory cell array.

With reference to FIG. 15, transistors 52 in the circuitry of the logic section of the integrated circuit, in one exemplary embodiment, are disposed on region 24 (for example, insulation region (such as silicon oxide or silicon nitride) or non-conductive region (for example, region of a bulk semiconductor die or wafer)). The transistors 52 includes gate 54 and gate dielectric 54a, which is disposed between gate 54 and body region 56 of transistors 52. The body region 56 of each transistor 52 is disposed between source region 58 and drain region 60 of the associated transistor 52.

Figure 16C:
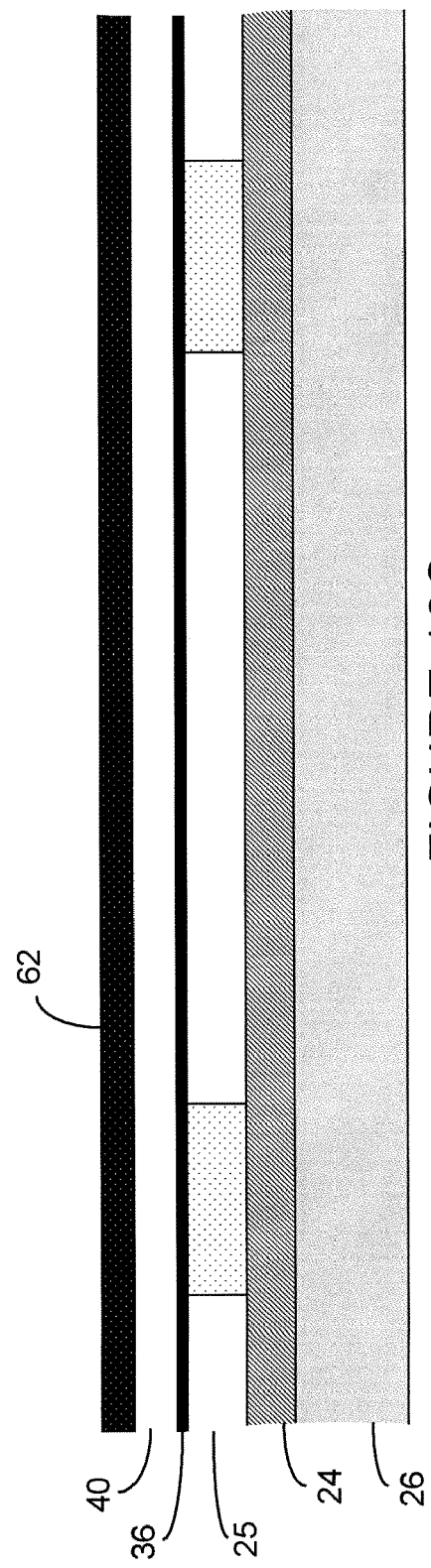

With reference to FIGS. 16A-16C, in one exemplary embodiment, after the conductivity of semiconductor layer 25 is adjusted to provide suitable or predetermined regions in which n-channel transistors are formed and p-channel transistors are to be formed, the discussion of an exemplary method of manufacturing in the circuitry of the logic section of the integrated circuit may begin with deposition, growth and/or formation of gate dielectric layer 36 on and over semiconductor layer 25 (for example, silicon-germanium, gallium arsenide, silicon carbide or monocrystalline silicon) using conventional and/or unconventional processing techniques. (See, FIG. 16A). This process may correspond to the processing illustrated in FIG. 13A.

As noted above, gate dielectric layer 36 may include one material (for example, a silicon dioxide, silicon nitride, or a high dielectric constant material) or more than one material (for example, silicon dioxide and silicon nitride, or other combinations thereof (for example, oxide-nitride-oxide "sandwich" structure) or a high dielectric constant composite material). The gate dielectric layer 36 may be formed using conventional and/or unconventional semiconductor processing techniques (for example, lithographic and etching techniques). The gate dielectric layer 36, after additional processing, forms the gate dielectric of the transistors of the circuitry of the logic section of the integrated circuit. All gate dielectric structures, arrangements and/or materials, whether known or unknown (whether conventional or unconventional), are intended to fall within the scope of the present inventions.

As noted above, isolation regions 38 (for example, shallow trench isolation regions) are formed and/or provided between adjacent transistors. In other embodiments, adjacent transistors (for example, of adjacent memory cells in adjacent rows of memory cells) share source and/or drain regions and, as such, may or may not include isolation regions 38.

Thereafter semiconductor layer 40 is deposited, grown and/or formed on and over gate dielectric layer 36. (See, FIG. 16B). This process may correspond to the processing illustrated in FIG. 13B. For the sake of brevity, this process will not be repeated.

Figure 16D:
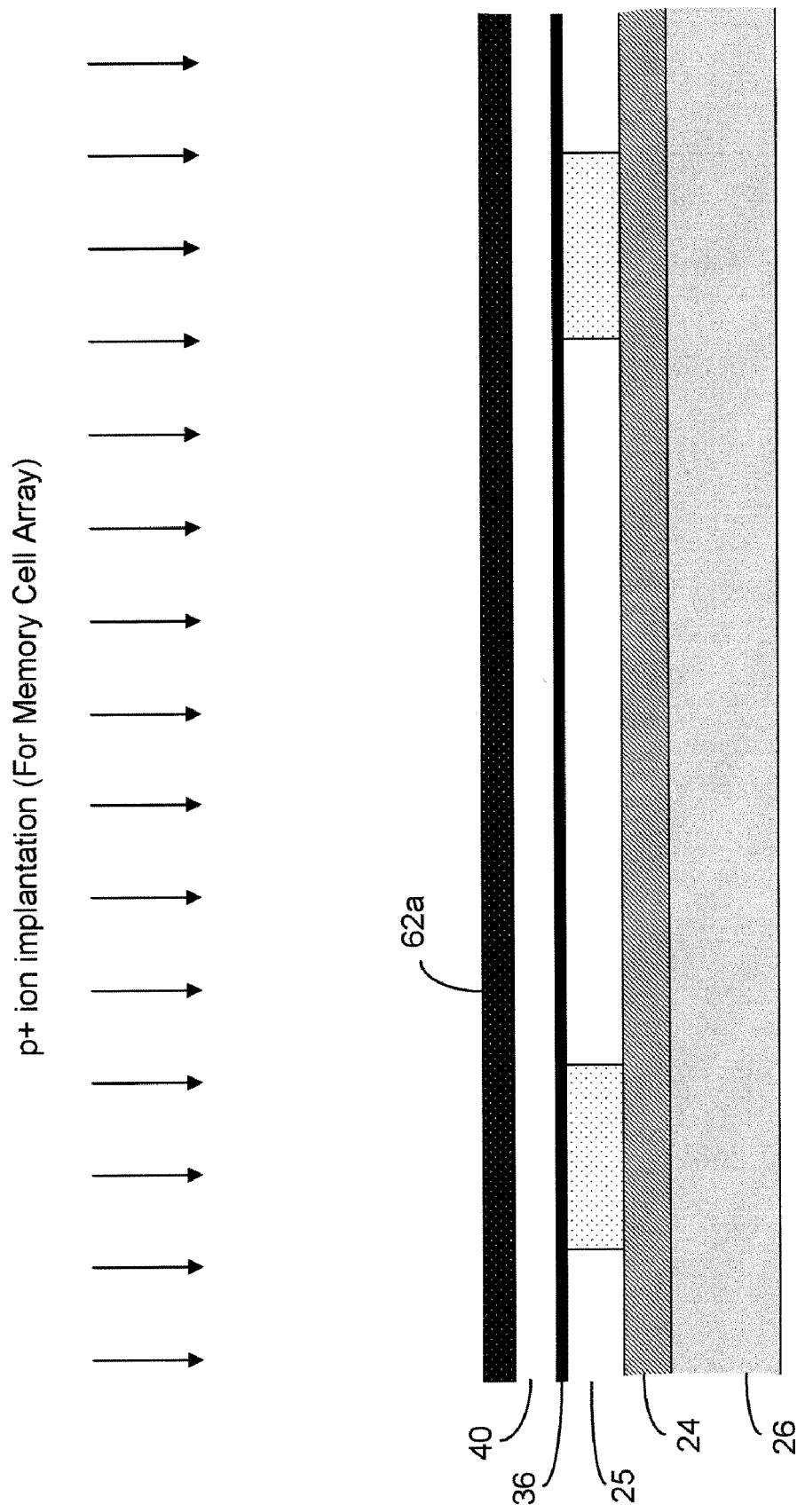

With reference to FIG. 16C, prior to the dopant implanted or introduced into semiconductor layer 40 located in the memory cell array (see, FIG. 13C), in one embodiment, mask material 62 may be deposited, grown and/or provided as well as patterned (via conventional lithographic techniques) to provide mask 62*a* on or over semiconductor layer 40 to "protect" semiconductor layer 40 in the circuitry of the logic section of the integrated circuit during implantation or introduction of a dopant into semiconductor layer 40 in the memory cell array portion of the integrated circuit. In this regard, with reference to FIGS. 13D and 16D, in one embodiment, the p-type dopant may be implanted in semiconductor layer 40 (for example, polycrystalline silicon) in the memory cell array portion of the integrated circuit to increase the work function of semiconductor layer 40 that will form (all or a portion of) the gate electrode of transistors 14 of memory cells 12 while mask 62*a* inhibits and/or prohibits the p-type dopant implantation in semiconductor layer 40 in the circuitry of the logic section of the integrated circuit. In this way, (1) the conductivity of semiconductor layer 40 in the memory cell array portion of the integrated circuit is adjusted such that the total negative charge in semiconductor layer 40 in the memory cell array portion is reduced and (2) the conductivity of semiconductor layer 40 in the circuitry of the logic section of the integrated circuit is unadjusted or substantially unadjusted notwithstanding such p-type dopant implantation.

The mask 62*a* may be a hard or soft mask and may be comprised of any material now known or later developed which inhibits and/or prohibits p-type dopant implantation in semiconductor layer 40 in the circuitry of the logic section of the integrated circuit. In addition, mask material 62 may be deposited, grown and/or provided using any technique whether now known or later developed (whether conventional or unconventional); all of which are intended to fall within the scope of the present inventions.

Figure 16G:
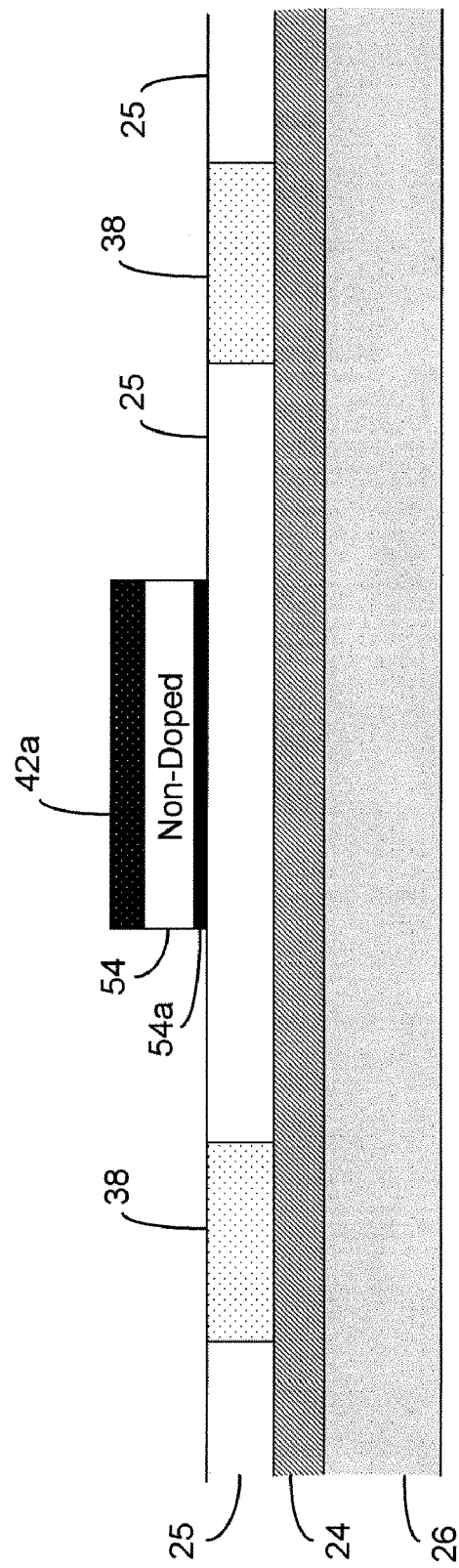

After removal of mask 62*a*, mask material 42 may be deposited, grown and/or provided on or over semiconductor layer 40 in the memory cell array portion (see, FIG. 13D), as discussed above, and in the circuitry of the logic section of the integrated circuit (see, FIG. 16E). The mask material 42 may be patterned (via conventional semiconductor processing techniques) to provide gate mask 42*a*. (See, FIG. 16F) Thereafter, selected portions of semiconductor layer 40 and gate dielectric material 36 may be etched, removed and/or patterned to form and/or provide gates 54 and gate dielectrics 54*a* of the transistors of the circuitry of the logic section of the integrated circuit. (See, FIG. 16G). In addition to formation or providing of gates 54 and gate dielectrics 54*a* of the transistors of the circuitry of the logic section of the integrated circuit, selected portions of semiconductor layer 25 are exposed which will provide (after additional processing) the source and drain regions of such transistors. As noted above, in one embodiment, an anisotropic etch technique is employed to remove selected portions of semiconductor layer 40 and gate dielectric material 36 to form and/or provide gates 54 and gate dielectrics 54*a* of the transistors of the circuitry of the logic section.

Figure 16H:
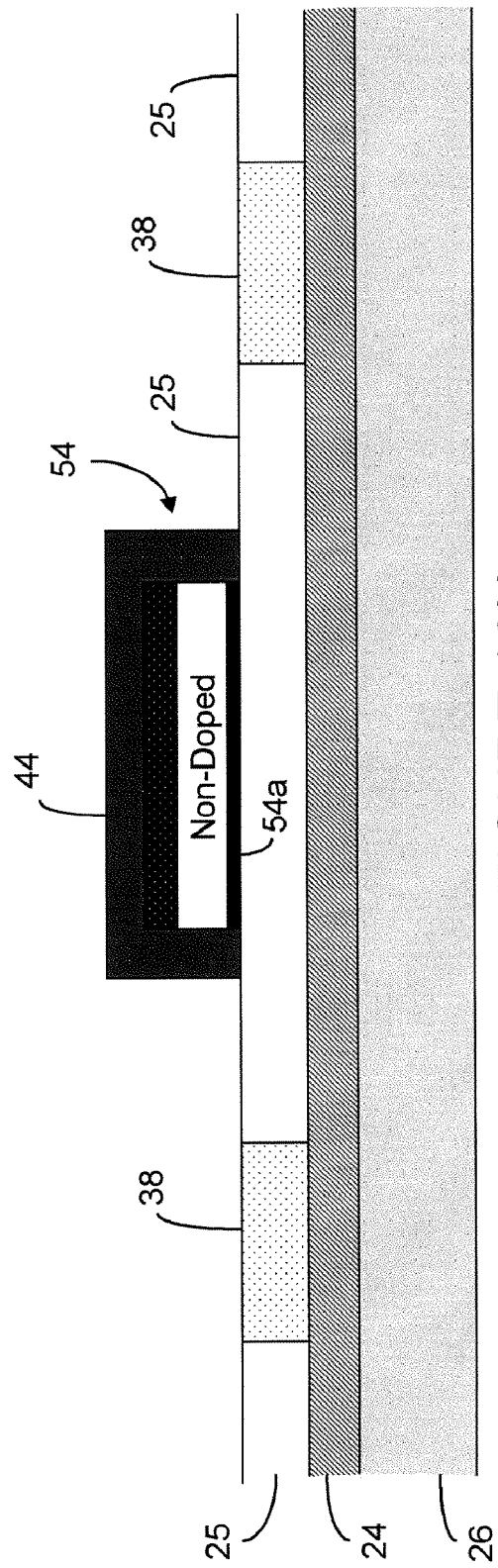
Figure 16I:
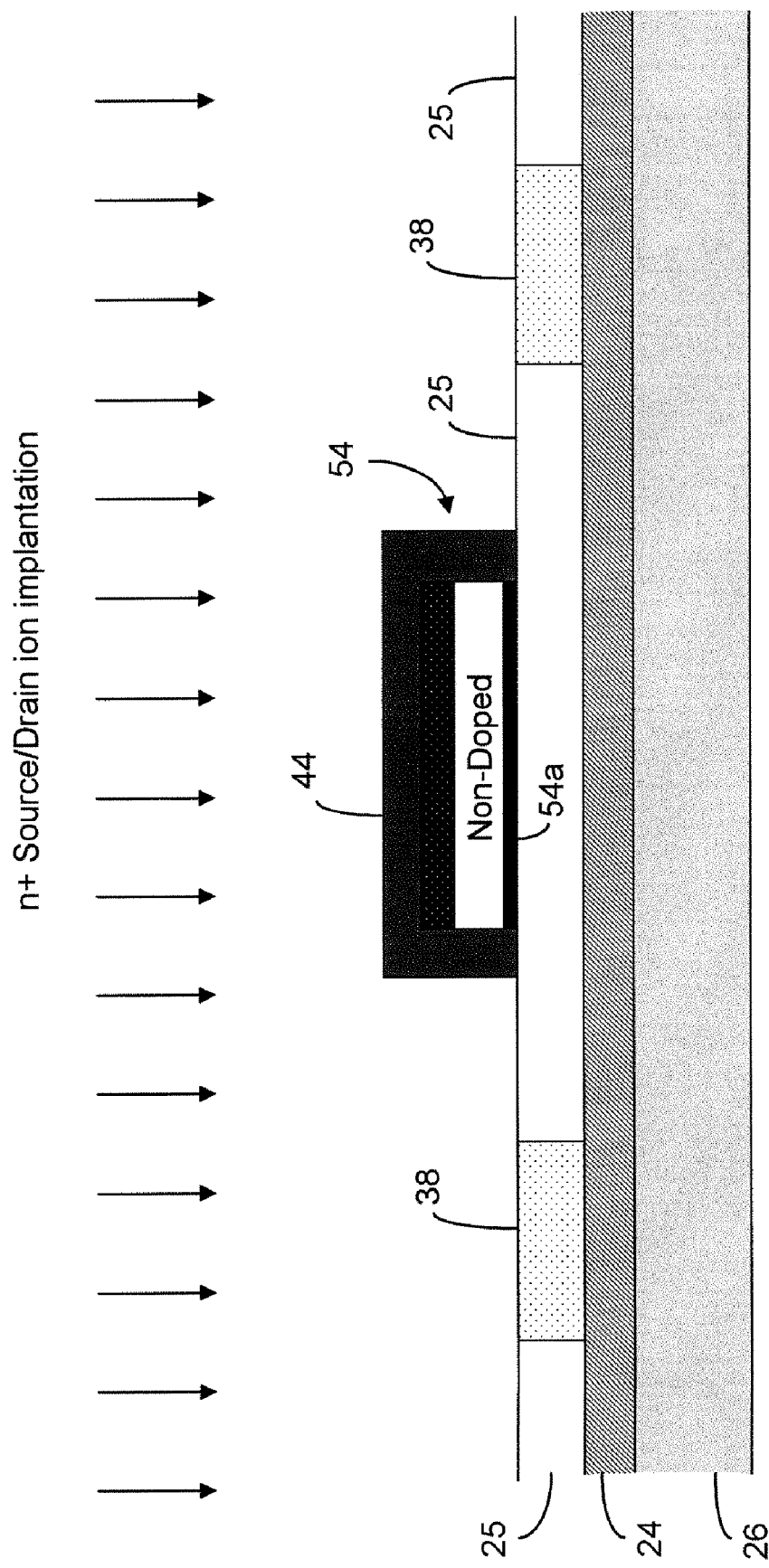

The manufacturing process may continue with the source/drain implant into semiconductor layer 25 to fabricate the transistors of the circuitry of the logic section. This processing may parallel the source/drain implant into semiconductor layer 25 in the memory cell array to form transistors 14 of memory cells 12. (See, FIGS. 13G, 13H and 13I). Briefly, with reference to FIG. 16H, spacer 44 (for example, a silicon nitride and/or a silicon oxide material) may be formed and/or provided using conventional and/or unconventional techniques to provide desired, suitable, predetermined and/or proper relative alignment of body, source and drain regions of the transistors. Thereafter, dopant ions (n-type ions such as phosphorus and/or arsenic) are implanted in exposed areas/portions of semiconductor layer 25. The dopant ions (n-type) may be implanted and/or introduced into "exposed" portions of semiconductor layer 25 (see FIGS. 16I and 16J) to change the conductivity of certain portions of semiconductor layer 25 relative to portions of layer 25 not exposed to implantation (for example, portions beneath gate 16). Notably, in this embodiment, the dopant is introduced into semiconductor layer 25 using gates 16 and associated spacers 44 to provide a self-aligned source/drain regions of transistor 52 in or of the circuitry of the logic section of the integrated circuit.

Figure 16J:
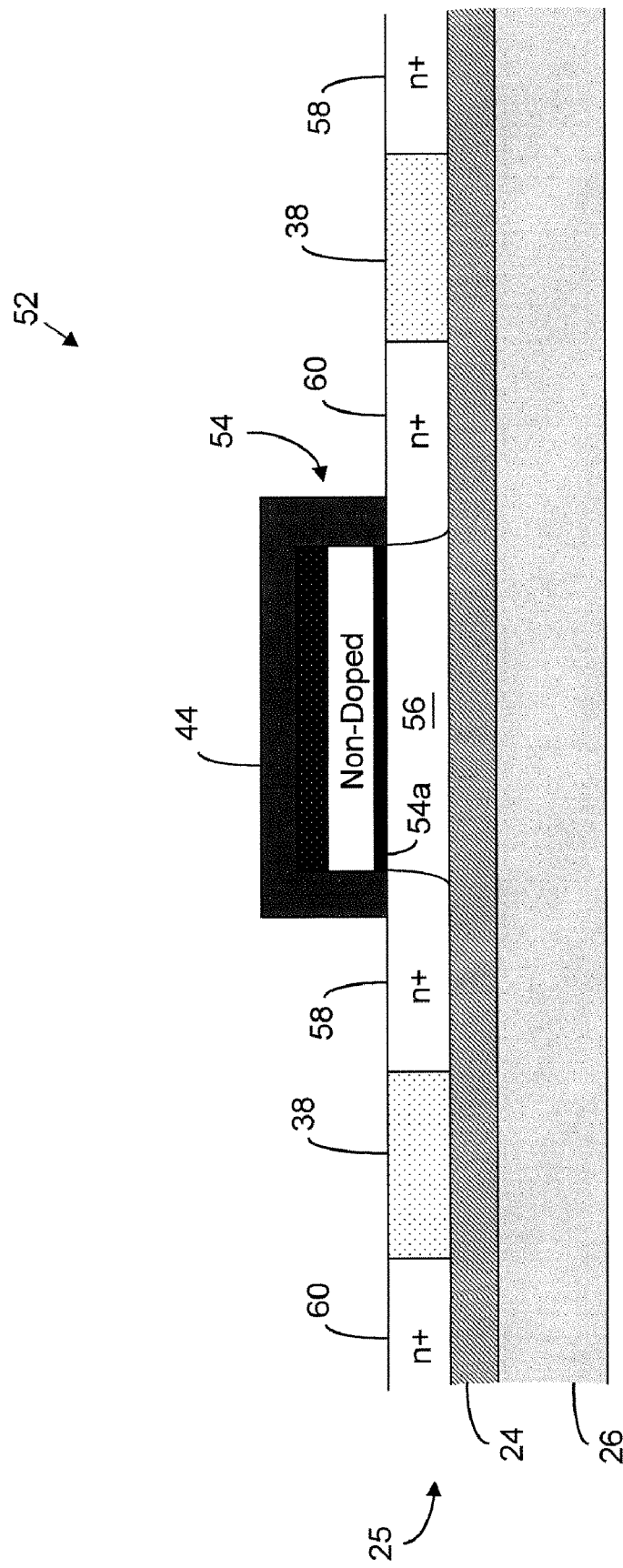

With reference to FIG. 16J, after annealing and formation of a lightly doped region (if any) of the source/drain regions via before/after ion implantation discussed immediately above, transistors 52 are generally formed. In this illustrated embodiment (wherein one of a plurality are illustrated), transistors 52 are disposed on region 24 (for example, insulation region or non-conductive region. The transistors 52 includes gate 54 (which may be doped with n-type ions such as phosphorus and/or arsenic, before or after, formation of the source and drain regions) and gate dielectric 54*a*, which is disposed between gate 50 and body region 56 of transistors 52. The body region 56 is disposed between an associated source region 58 and an associated drain region 60.

Notably, although not illustrated, one or more insulation and planarization materials may be deposited, grown and/or formed, via holes formed therein, and contacts deposited, grown and/or formed to facilitate electrical connection to associated source regions 58 and drain regions 60 of transistors 52 (of the circuitry of the logic section of the integrated circuit) (if any) and/or source regions 20 and drain regions 22 of transistors 12 (of the memory cell array of the integrated circuit). As mentioned above, the one or more insulation and planarization materials may include one or more polymers, silicon dioxides and/or silicon nitrides, combinations of silicon dioxides and silicon nitrides in a stack configuration, and/or silicate glass materials (for example, BPSG, PSG and/or BSG)). Indeed, all materials and deposition, formation and/or growth techniques of the one or more insulation and planarization materials 46, whether now known or later developed, are intended to be within the scope of the present inventions.

As noted above, a passivation layer (not illustrated) may be deposited, formed or grown on the exposed surfaces (for example, exposed portions of bit line and/or source line, circuitry and/or conductive layers) to protect and/or insulate integrated circuit device. The passivation layer may include one or more layers including, for example, polymers, a silicon dioxide and/or a silicon nitride. Indeed, passivation layers may include, for example, a combination of silicon dioxide and a silicon nitride in a stack configuration; indeed, all materials and deposition, formation and/or growth techniques, whether now known or later developed, are intended to be within the scope of the present inventions.

The source and/or drain regions of transistors 52 may include lightly doped drain or extension regions ("LDD"), halo or pocket regions ("Halo") and/or combinations thereof.

Figure 17B:
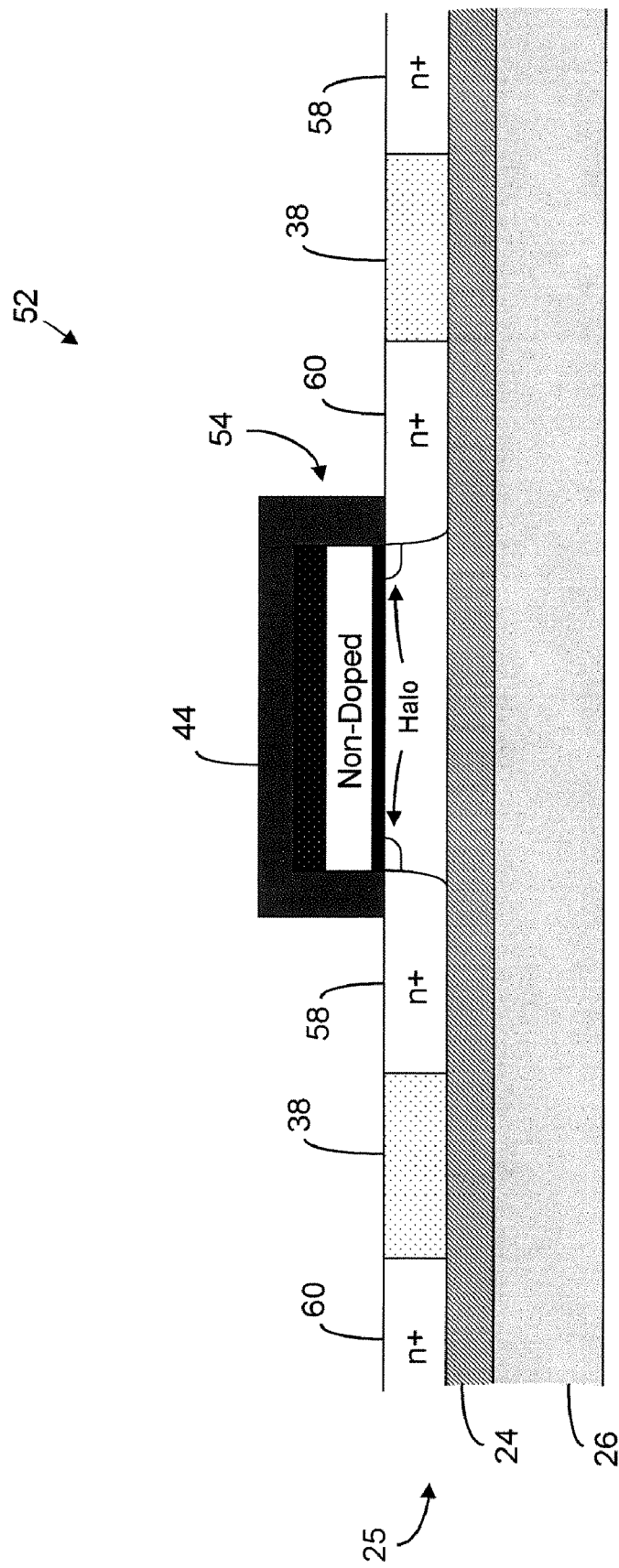
Figure 17C:
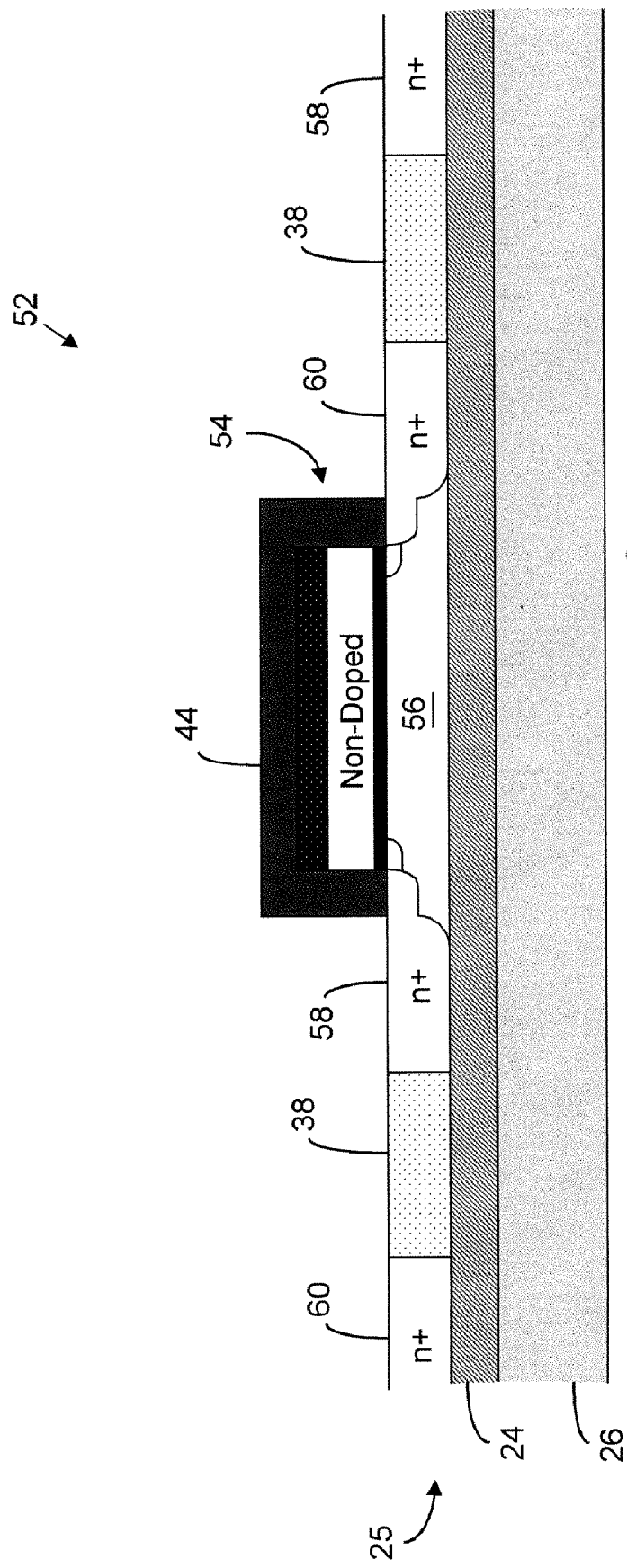

(See, for example, FIGS. 17A-17C, respectively). All source and/or drain regions structures, arrangements and/or configurations/layouts, whether known or unknown (whether conventional or unconventional), are intended to fall within the scope of the present inventions.

Notably, in the embodiments of FIG. 15, gate 54 of transistor 52 is doped before or after formation of the source and drain regions. In certain embodiments, the conductivity of gate 54 of one, some or all of the transistors in or of the circuitry of the logic section of the integrated circuit may be adjusted or changed (during or after deposition, growth and/or formation of semiconductor layer 40 on and over gate dielectric layer 36—see, for example, FIGS. 13B and 16B) to provide the transistor with selected or predetermined electrical characteristics. For example, the conductivity of gates 54 may be adjusted and/or changed (during implantation or introduction of a donor type doping species or n-type dopant (such as, for example, phosphorous, antimony or arsenic, or other element in group 15 of the periodic table as well as compounds having donor type characteristics) may be implanted or introduced into semiconductor layer 40 (for example, polycrystalline silicon). (See, FIG. 18). In this way, the work function of the material that will form the gate electrode of the transistors 52 is reduced or deceased (relative to gate 54 of transistor 52 which is not doped). In this way, the conductivity of semiconductor layer 40 is adjusted such that the total negative charge (or total number of negative charge carriers) in layer 40 is increased.

Figure 18:
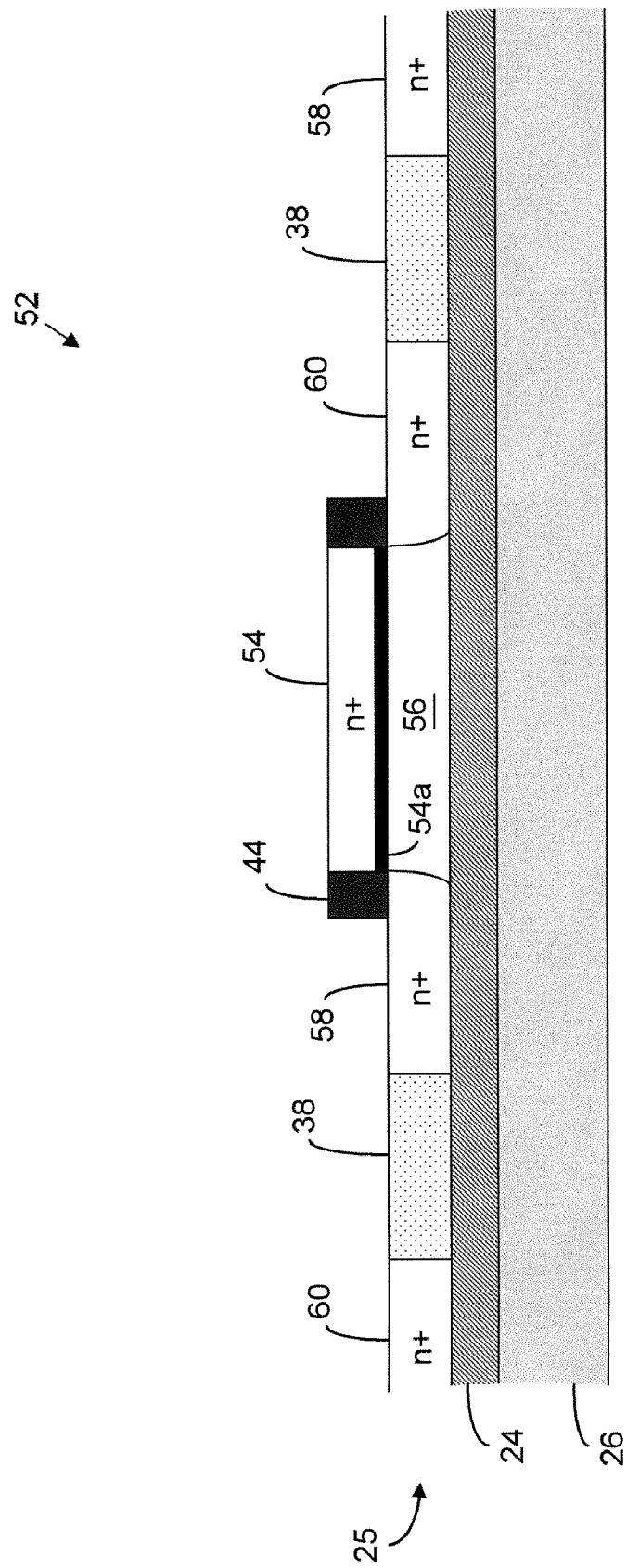
FIG. 18 is a cross-sectional view of an electrically floating body transistor in a portion of the circuitry of the logic section of the integrated circuit having a memory cell and/or memory cell array of, for example, FIGS. 11 and 12, illustrating an exemplary embodiment of the present inventions according to at least one aspect of the present inventions.

In one exemplary manufacturing process, transistor 52 of FIG. 18 may be manufactured using the processing steps which are illustrated in FIGS. 16A-16G in conjunction with FIGS. 19A-19E. For the sake of brevity, the discussion pertaining to FIGS. 16A-16G is set forth above and, as such, will not be repeated. With that in mind, after selected portions of semiconductor layer 40 and gate dielectric material 36 is etched, removed and/or patterned to form and/or provide gates 50 and gate dielectrics 50a of the transistors of the circuitry of the logic section of the integrated circuit (see FIG. 19A), gate mask 42a may be removed (see FIG. 19B), and spacer 44 (for example, a silicon nitride and/or a silicon oxide material) may be formed and/or provided using conventional and/or unconventional techniques to provide desired, suitable, predetermined and/or proper relative alignment of body, source and drain regions of the transistors (see, FIG. 19C). In this exemplary embodiment, a surface of gate 54 is exposed to the implantation and/or introduction of the dopant ions (n-type ions such as phosphorus and/or arsenic) during formation of the source and drain regions of the transistors of the circuitry or the logic section.

Figure 19A:
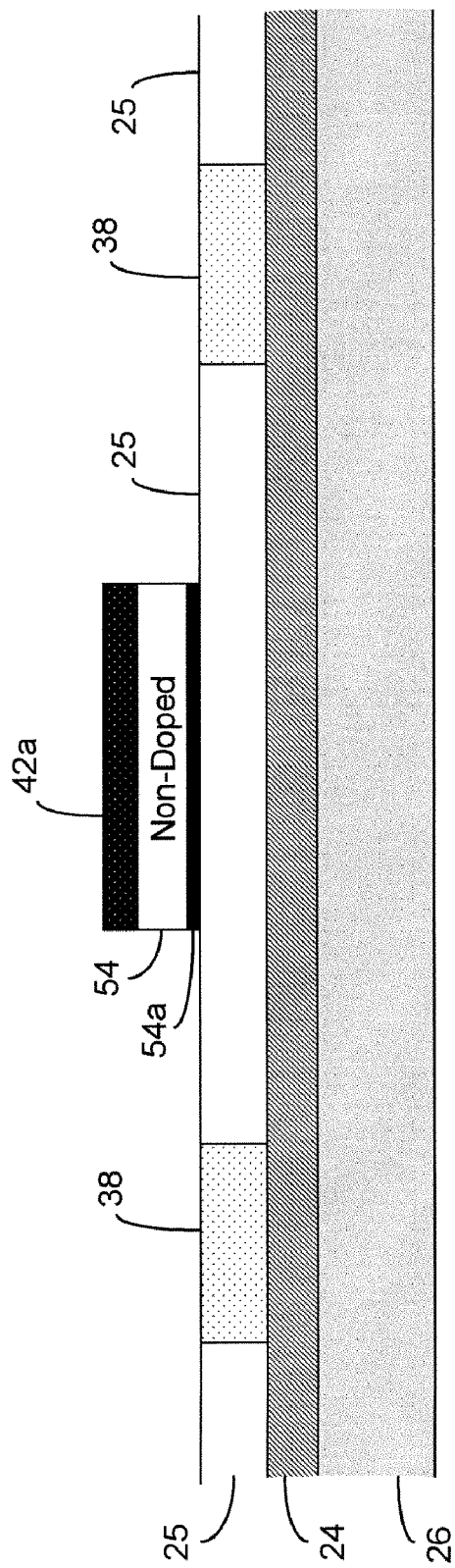
FIGS. 19A-19E illustrate cross-sectional views of an electrically floating body transistor of the circuitry of the logic section of the integrated circuit including a transistor at various stages of an exemplary process to manufacture such transistor of the circuitry of the logic section of the integrated circuit in relation to the various stages of the exemplary process to manufacture an electrically floating body transistor of a memory cell illustrated in FIGS. 13A-13J, according to certain aspects of the present inventions.
Figure 19B:
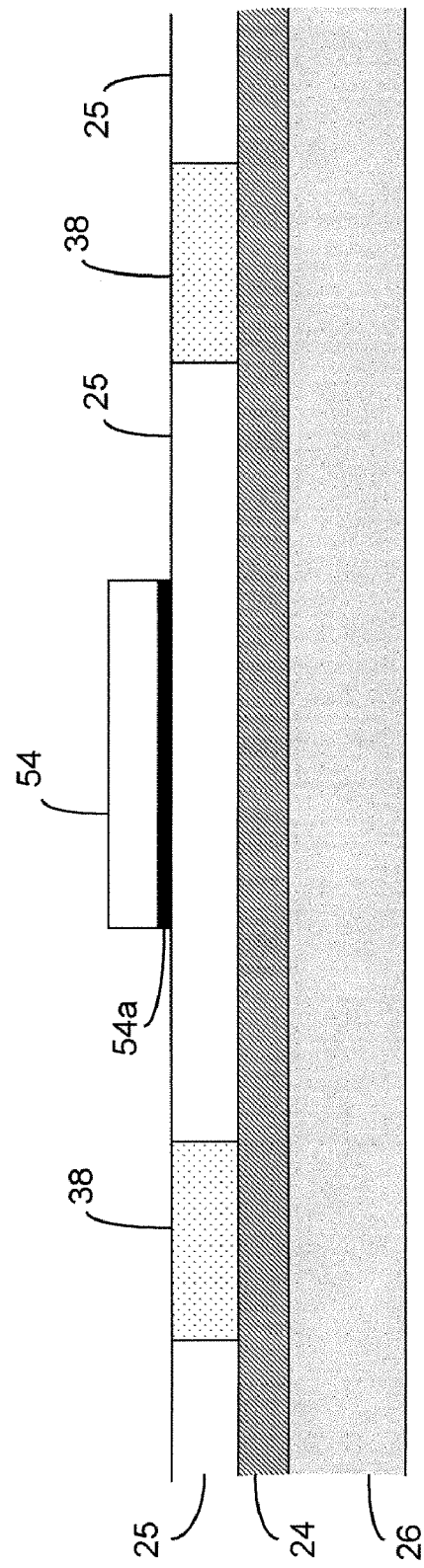
Figure 19C:
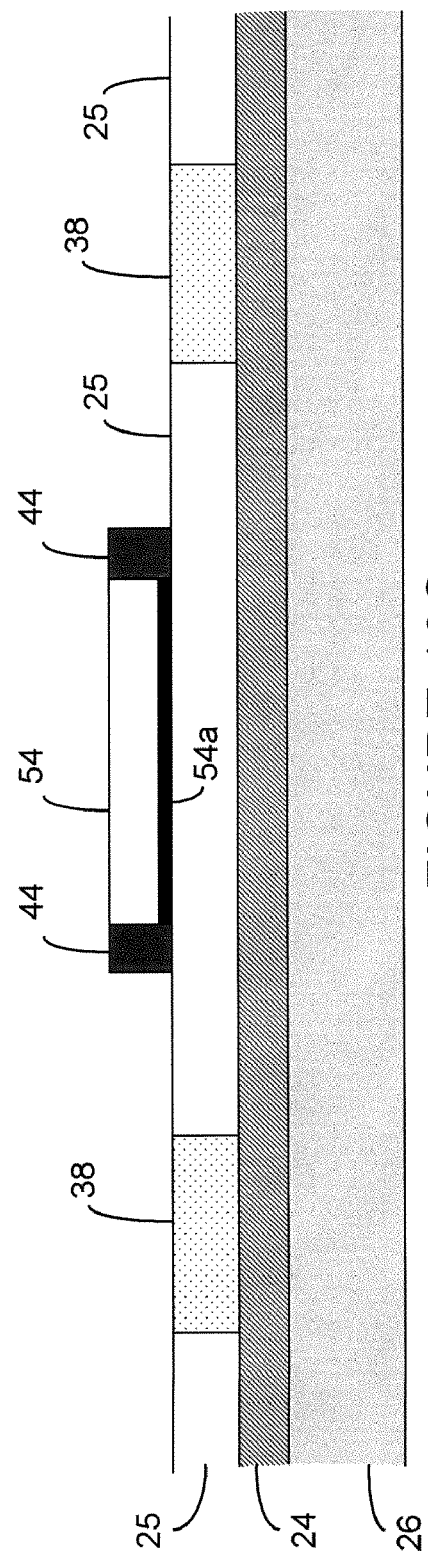
Figure 19D:
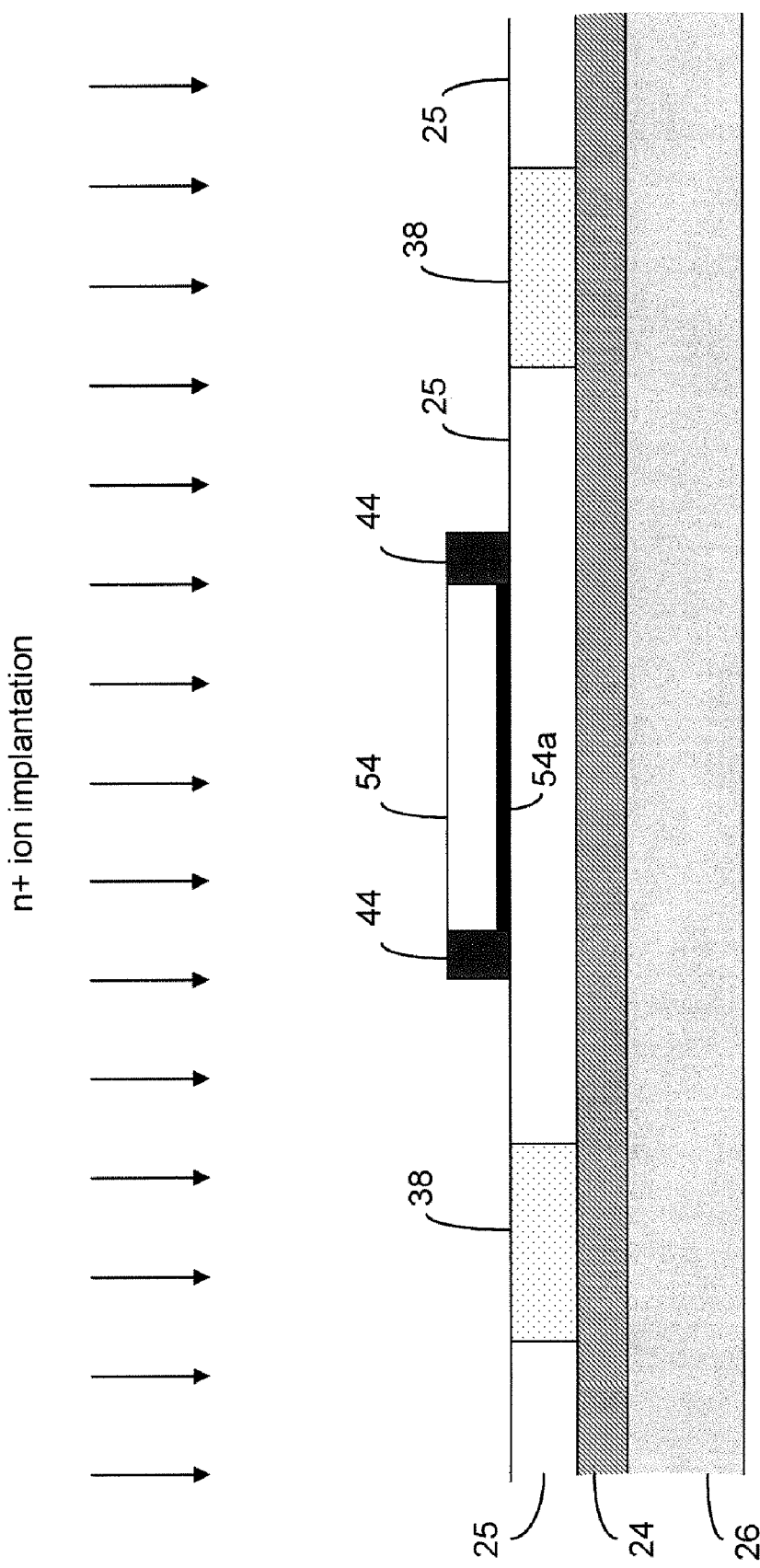
Figure 19E:
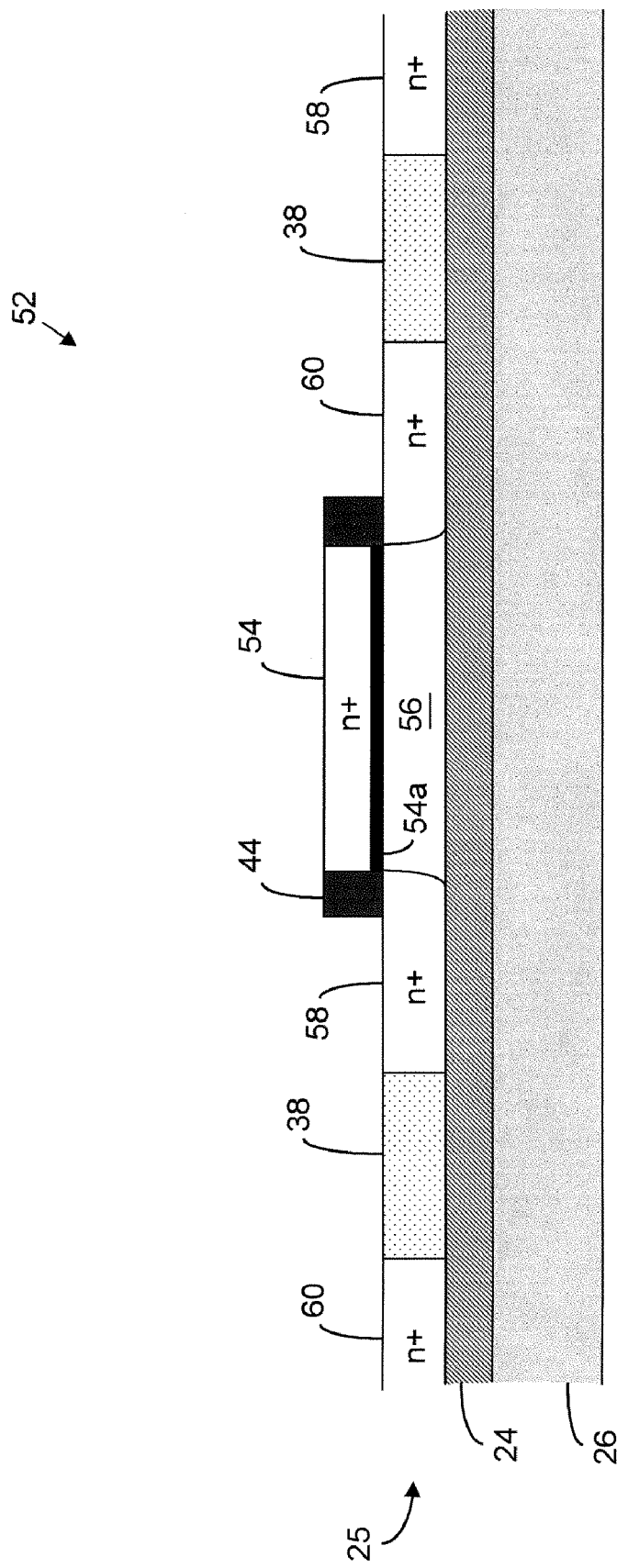

With reference to FIGS. 19D and 19E, the dopant ions (n-type) may be implanted and/or introduced into "exposed" portions of semiconductor layer 25 and gate 54 to change or adjust the conductivity of such material relative to certain portions of layer 25 not exposed to implantation (for example, portions beneath gate dielectric 54a). Notably, in this embodiment, a dopant is introduced into semiconductor layer 25 using associated spacers 44 to provide a self-aligned source/drain regions of the transistor in the circuitry of the logic section of the integrated circuit.

With reference to FIG. 19E, after annealing and formation of a lightly doped region (if any) of the source/drain regions before/after ion implantation, transistors 52 are generally formed. In this illustrated embodiment (wherein one of a plurality are illustrated), one, some or all of transistor 52 include a gate 50 having a conductivity that is changed or adjusted relative to the gate of the transistor of the embodiments of FIGS. 15 and 16. In this regard, the work function of the material that forms gate 50 of transistors 52 is increased. In this way, the conductivity of semiconductor layer 40 is adjusted such that the total negative charge (or total number of negative charge carriers) in gate 54 is increased.

Figure 20A:
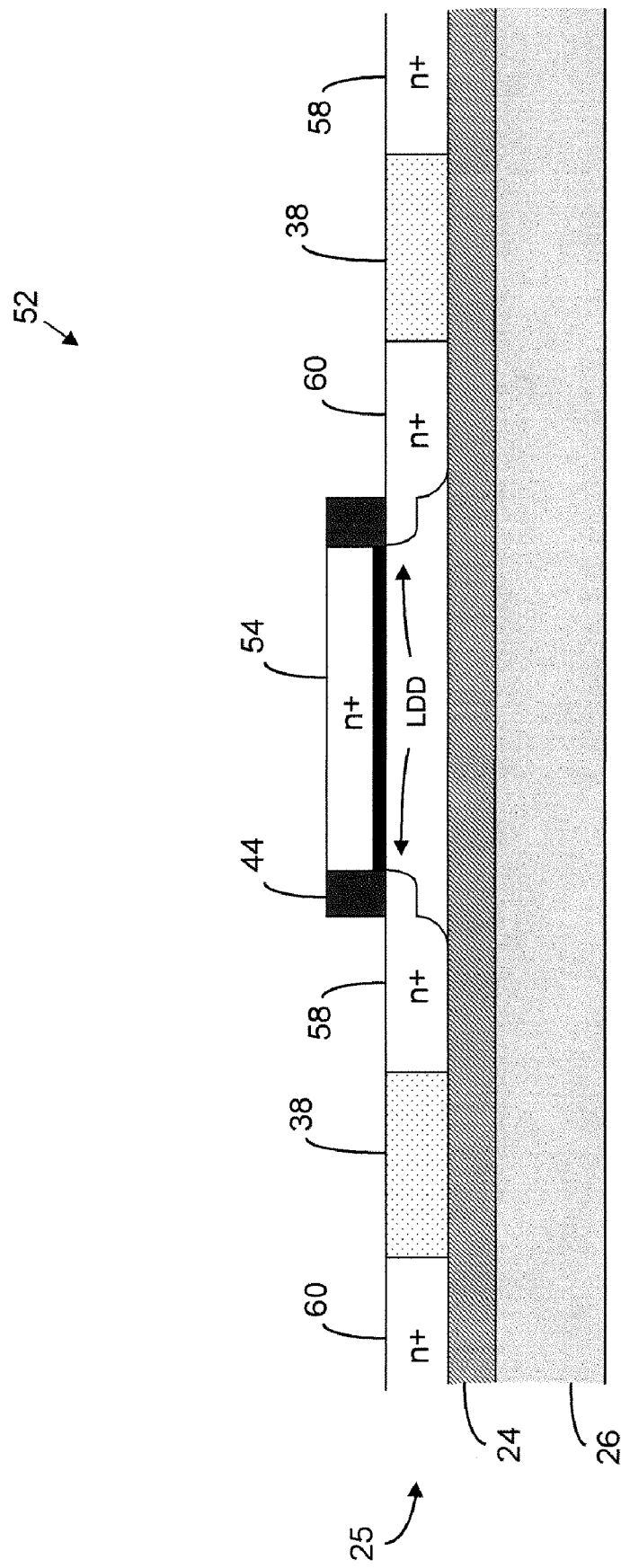
FIGS. 20A-20C are cross-sectional views of an electrically floating body transistor of the circuitry of the logic section of the integrated circuit according to the embodiment of FIG. 19, wherein the source and/or drain regions of the transistor include lightly doped regions (FIG. 20A), halo regions (FIG. 20B) and a combination thereof (FIG. 20C); all source and/or drain regions structures, arrangements and/or configurations/layouts, whether known or unknown (whether conventional or unconventional), are intended to fall within the scope of the present inventions.
Figure 20B:
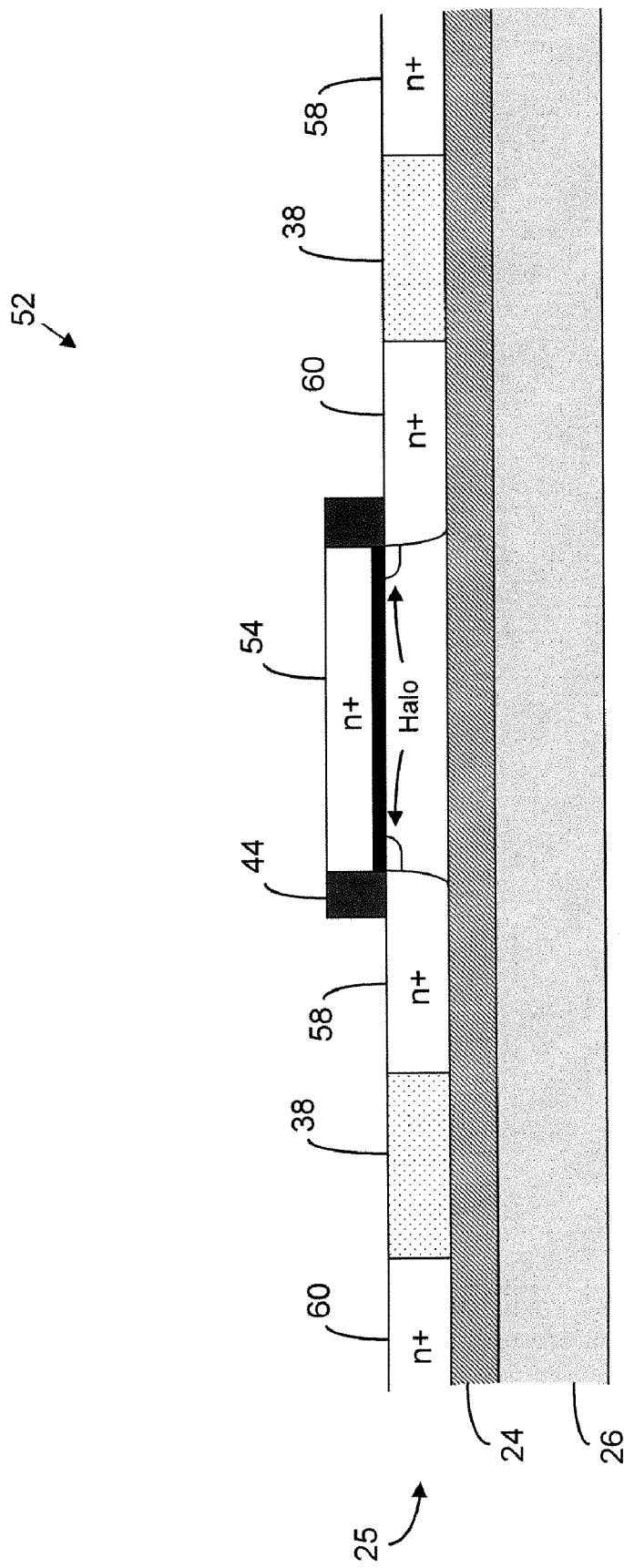
Figure 20C:
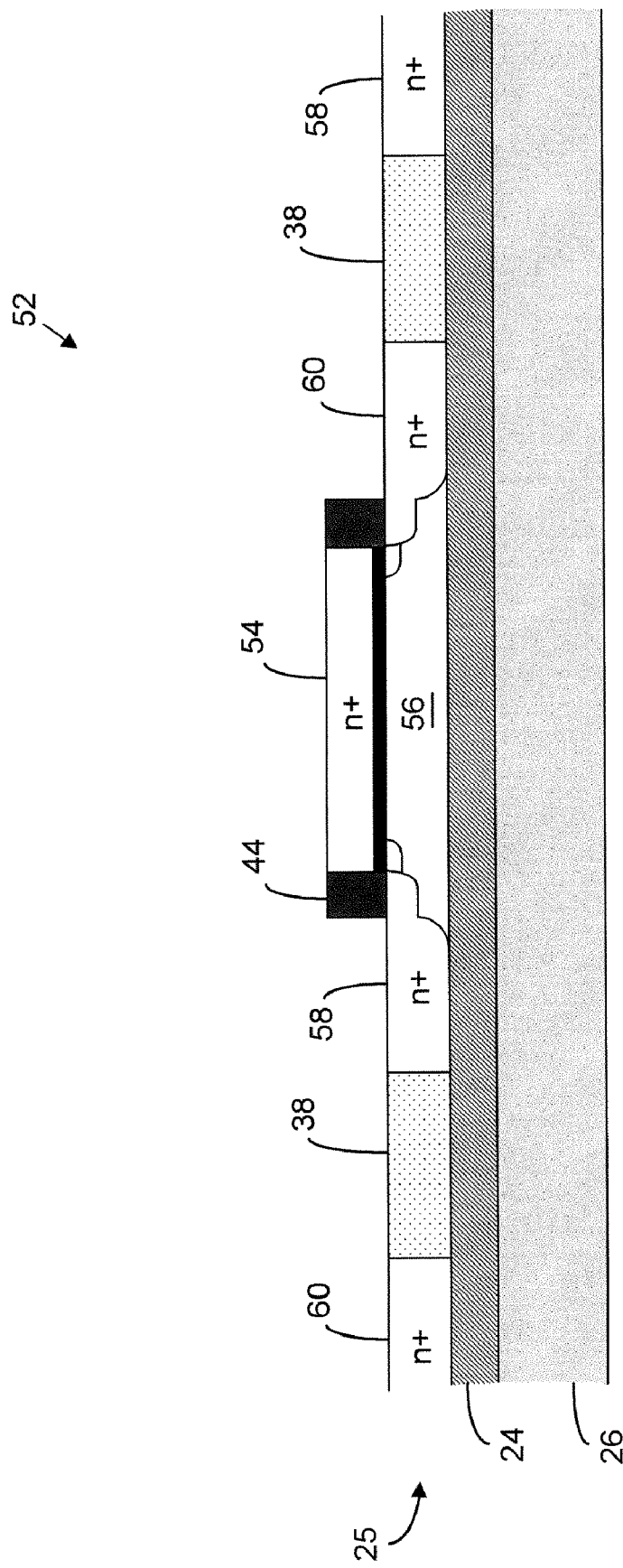

Similar to the embodiments of FIGS. 17A-17C, the source and/or drain regions of transistors 52 of the embodiments of FIG. 18 may include lightly doped drain or extension regions ("LDD"), halo or pocket regions ("Halo") and/or combinations thereof. (See, for example, FIGS. 20A-20C, respectively). All source and/or drain regions structures, arrangements and/or configurations/layouts, whether known or unknown (whether conventional or unconventional), are intended to fall within the scope of the present inventions.

In another embodiment, the gates of the electrically floating body transistors of one, some or all of the memory cells of the memory cell array and/or the gates of one, some or all of the transistors in or of the circuitry of the logic section of the integrated circuit include a plurality of materials. For example, in one exemplary embodiment, gates of transistors 12 (see, FIG. 21) and gates of transistors 52 (see, FIG. 24) include a doped semiconductor material (for example, a doped polycrystalline silicon), a barrier material (for example, titanium nitride, tantalum nitride or tungsten nitride) and a metal material (for example, copper, chromium, gold, silver, molybdenum, platinum, palladium, tungsten and/or titanium, metal stacks, complex metals, conducting alloys and/or complex metal stacks, complex metal stack (for example, nickel silicide NiSix (x=0.5, 1, 3/2, and the like))) and/or phases with different sorts of donor and acceptor type of doping for work function engineering. In this embodiment, the gates of electrically floating body transistors of one, some or all of the memory cells of the memory cell array and/or or of the circuitry of the logic section include a polycide stack structure.

Figure 22A:
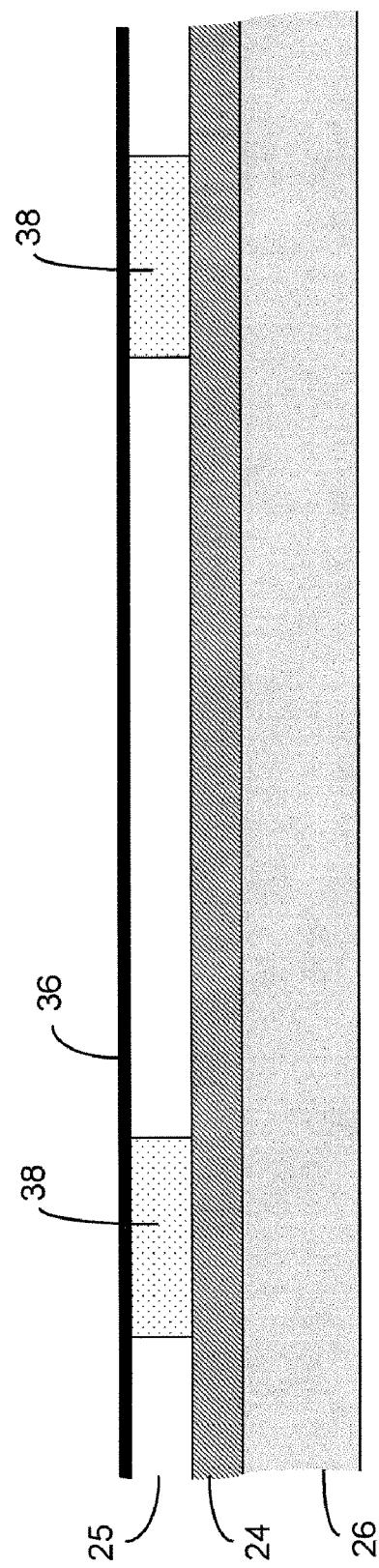
Figure 22B:
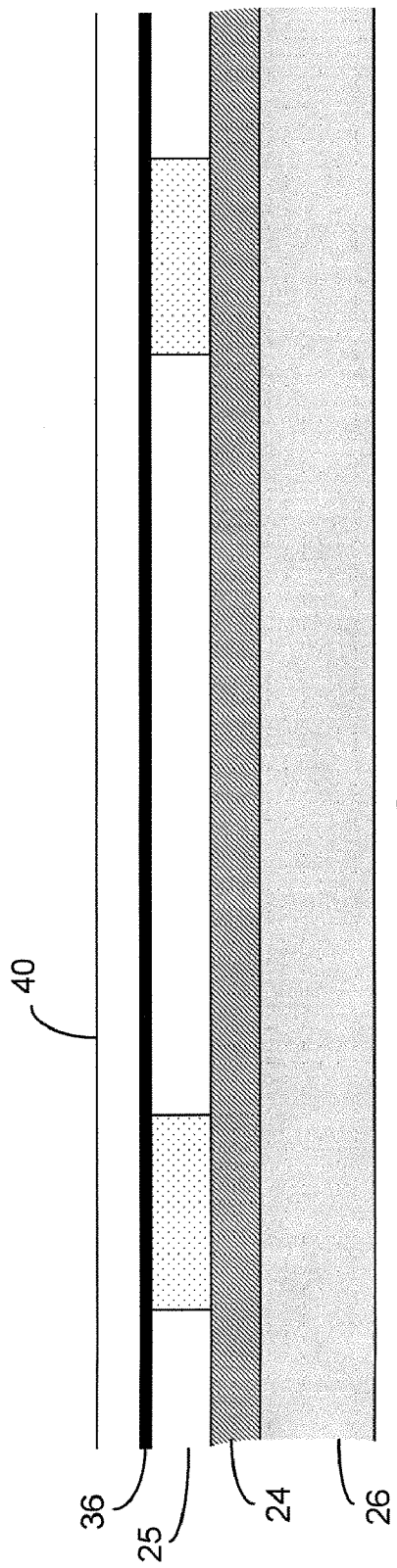

Initially, the manufacturing of the transistors of the memory cells of the memory cell array of FIG. 21 may be similar to the manufacturing of the transistors of the memory cells of FIGS. 13 and 15. (Compare, FIGS. 22A-22C with FIGS. 13A-13C). For the sake of brevity, the discussions pertaining to FIGS. 22A-22C will not be repeated.

Figure 22C:
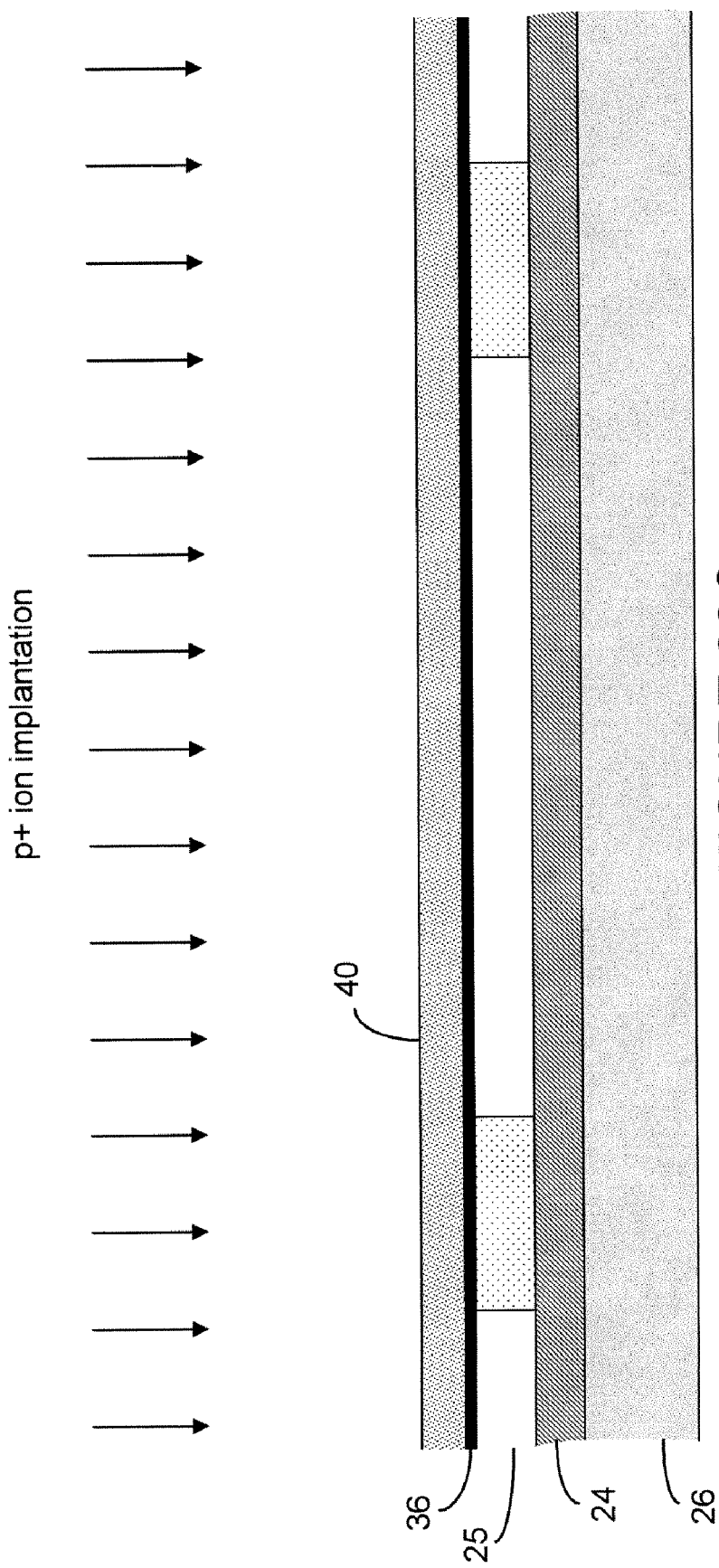
Figure 22D:
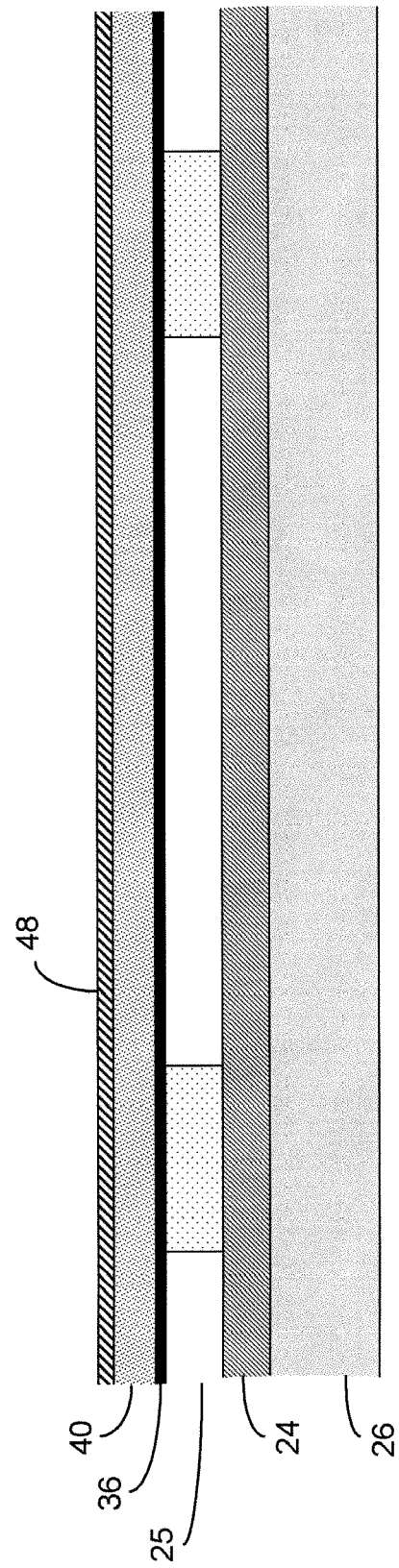
Figure 22E:
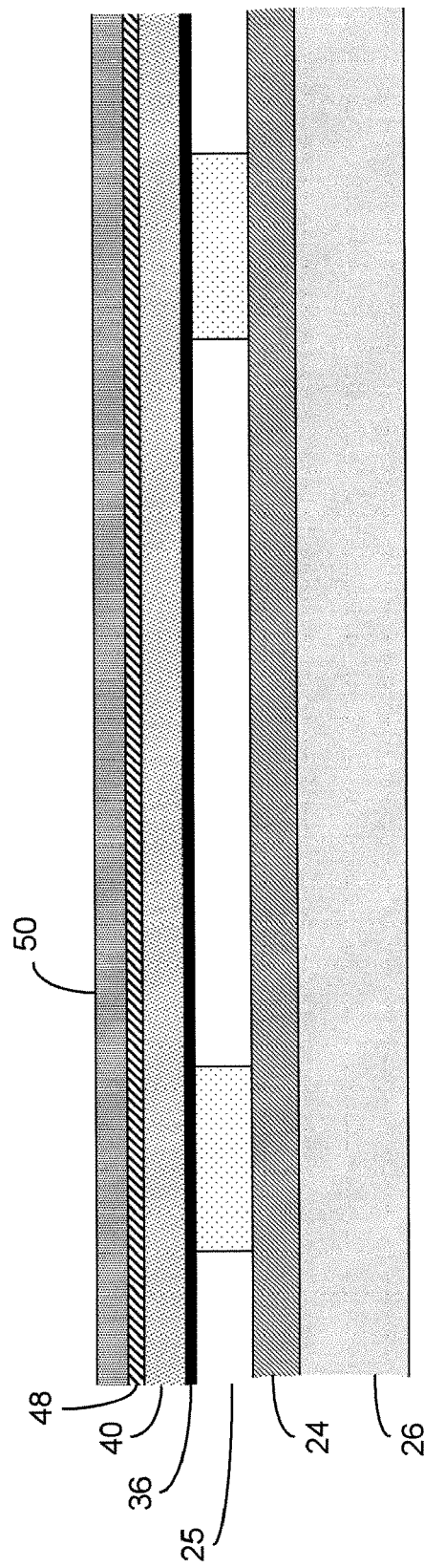

With reference to FIGS. 22C-22E, after a dopant is implanted or introduced into semiconductor layer 40 to increase the work function of the material (FIG. 22C) or deposition, formation or growth of a material/alloy having a high work function (for example, a work function that is greater than 4 eV, such as, for example, palladium (Pd), platinum (Pt), gold (Au), molybdenum nitride (MoN), tungsten nitride (WN), titanium nitride (TiN), iridium (Ir), iridium oxide ($IrO_2$), ruthenium (Ru), ruthenium oxide ($RuO_2$)), a barrier material or layer 48 (for example, titanium nitride, tantalum nitride or tungsten nitride) may be deposited, grown and/or provided on or over semiconductor layer 40 (see, FIG. 22D). Thereafter, a metal material or layer 50 (for example, copper, chromium, gold, silver, molybdenum, platinum, palladium, tungsten and/or titanium, metal stacks, complex metals, conductive alloys and/or complex metal stacks (for example, nickel silicide NiSix (x=0.5, 1, 3/2, and the like)) and/or phases with different sorts of donor and acceptor type of doping for work function engineering) may be deposited, grown and/or provided on or over barrier material or layer 48 (see, FIG. 22E).

As noted above, the gate may be comprised of any material (for example, a metal such as palladium (Pd), platinum (Pt), gold (Au), molybdenum nitride (MoN), tungsten nitride (WN), titanium nitride (TiN), iridium (Ir), iridium oxide ($IrO_2$), ruthenium (Ru), ruthenium oxide ($RuO_2$) having a work function greater than n+ polycrystalline silicon (for example, a work function that is greater than 4 eV). Indeed, under those circumstances where material having a work function that is greater than 4 eV may be readily implemented into the process flow, for example, more easily than p+ polycrystalline silicon, it may be advantageous to employ such material in addition to p+ polycrystalline silicon, or in lieu thereof. Moreover, where such material is a metal or metal compound, such material may provide less polycrystalline depletion effects because it is a metal layer thereby providing a larger gate capacitance and potentially greater reliability and less variability (which may present better or enhanced manufacturability).

Figure 22F:
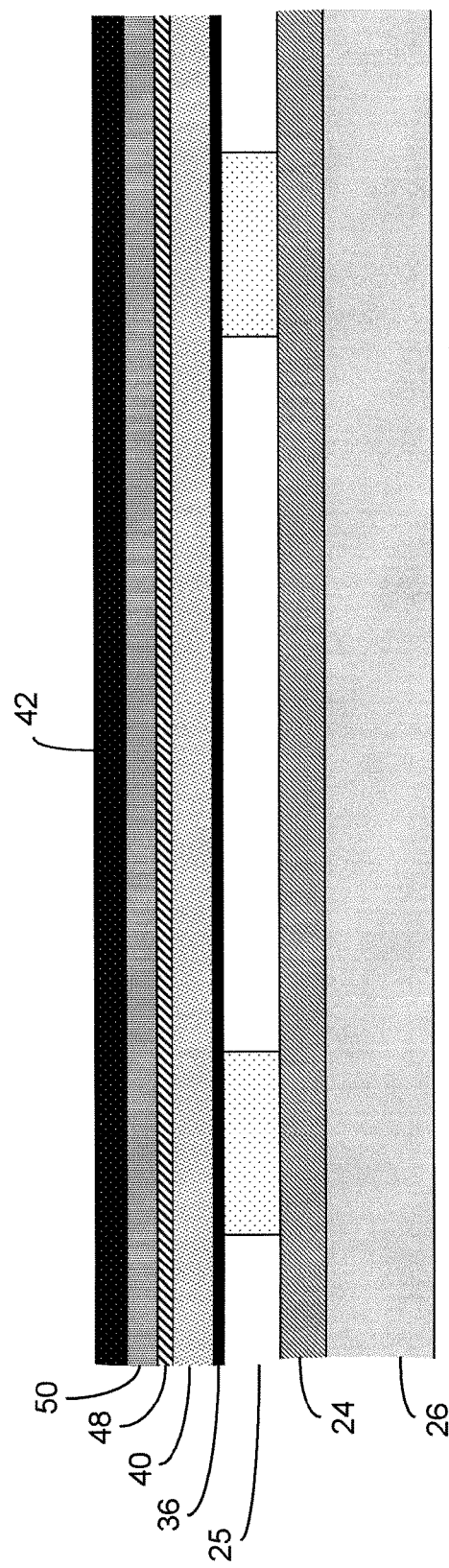
Figure 22H:
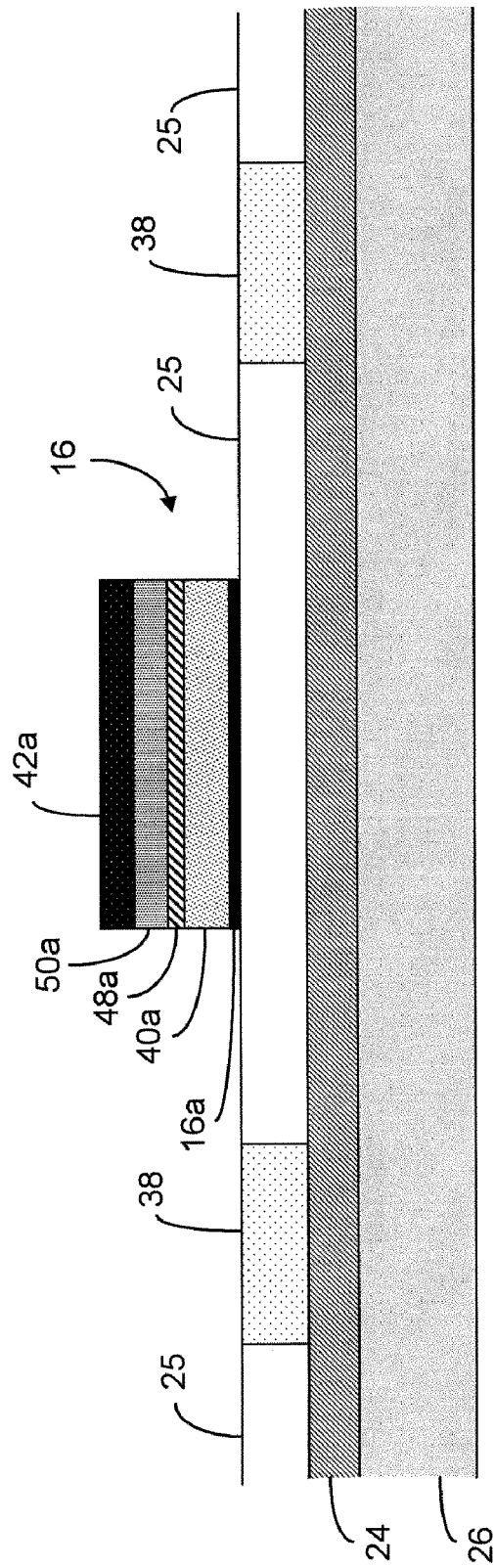

With reference to FIGS. 22F-22H, mask material 42 may be deposited, grown and/or provided on or over semiconductor layer 40 (see, FIG. 22F) and gate mask 42a may be formed using, for example, conventional semiconductor processing techniques (see, FIG. 22G). Thereafter, selected portions of semiconductor layer 40, barrier layer 48, metal layer 50 and dielectric layer 36 may be etched, removed and/or patterned to form and/or provide gate 16 and gate dielectric 16a. (See, FIG. 22H). The gate 16 includes semiconductor material 40a (doped with an impurity as discussed above), barrier material 48a and metal material 50a.

In addition to formation or providing of gate 16 and gate dielectric 16a, selected portions of semiconductor layer 25 are exposed which will provide (after additional processing) the source and drain regions of transistors 14 of memory cells 12. In one embodiment, an anisotropic etch technique is employed to remove selected portions of semiconductor layer 40, barrier layer 48, metal layer 50 and dielectric layer 36 to form and/or provide gates 16 and gate dielectrics 16a of transistors 14 of memory cells 12.

Figure 22I:
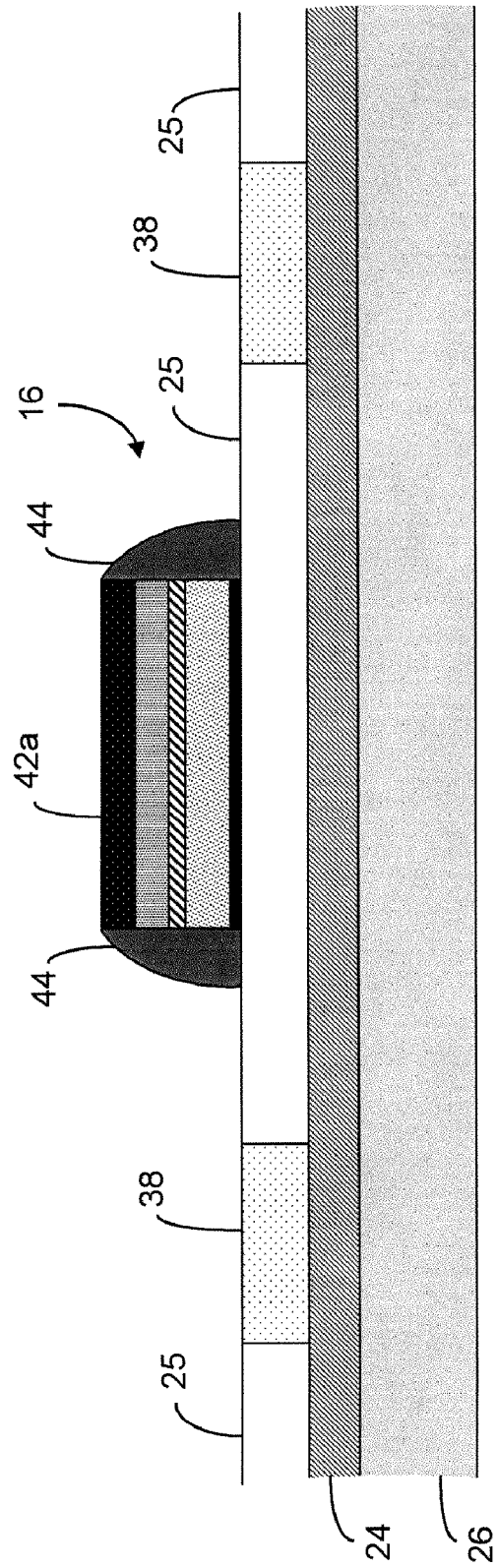
Figure 22J:
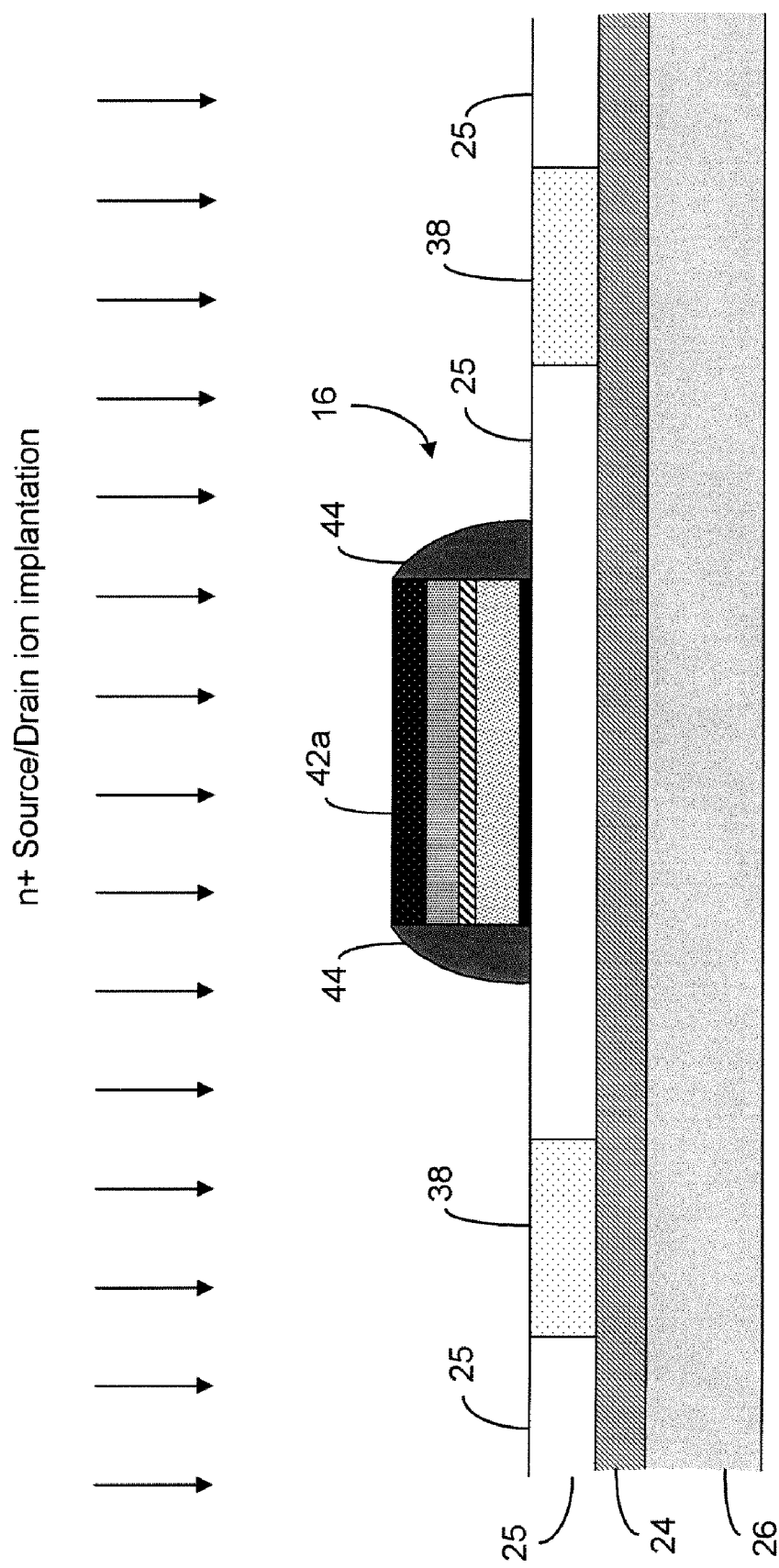

The manufacturing process may continue with the source/drain implant into semiconductor layer 25 to fabricate the transistors of the memory cells. This processing may correspond to the source/drain implant into semiconductor layer 25 in the memory cell array to form transistors 14 of memory cells 12. (See, FIGS. 22I, 22J and 22K). Briefly, with reference to FIG. 22I, spacer 44 (for example, a silicon nitride and/or a silicon oxide material) may be formed and/or provided using conventional and/or unconventional techniques to provide desired, suitable, predetermined and/or proper relative alignment of body, source and drain regions of the transistors. Thereafter, dopant ions (n-type ions such as, for example, phosphorous, antimony or arsenic, or other element in group 15 of the periodic table as well as compounds having donor type characteristics) are implanted in exposed areas/portions of semiconductor layer 25. The dopant ions (n-type) may be implanted and/or introduced into "exposed" portions of semiconductor layer 25 (see FIGS. 22J and 22K) to change the conductivity of certain portions of semiconductor layer 25 relative to portions of layer 25 not exposed to implantation (for example, portions beneath gate 16). Notably, in this embodiment, the dopant is introduced into semiconductor layer 25 using gate 16 and associated spacers 44 to provide a self-aligned source/drain regions of the transistor in or of the circuitry of the logic section of the integrated circuit.

Figure 22K:
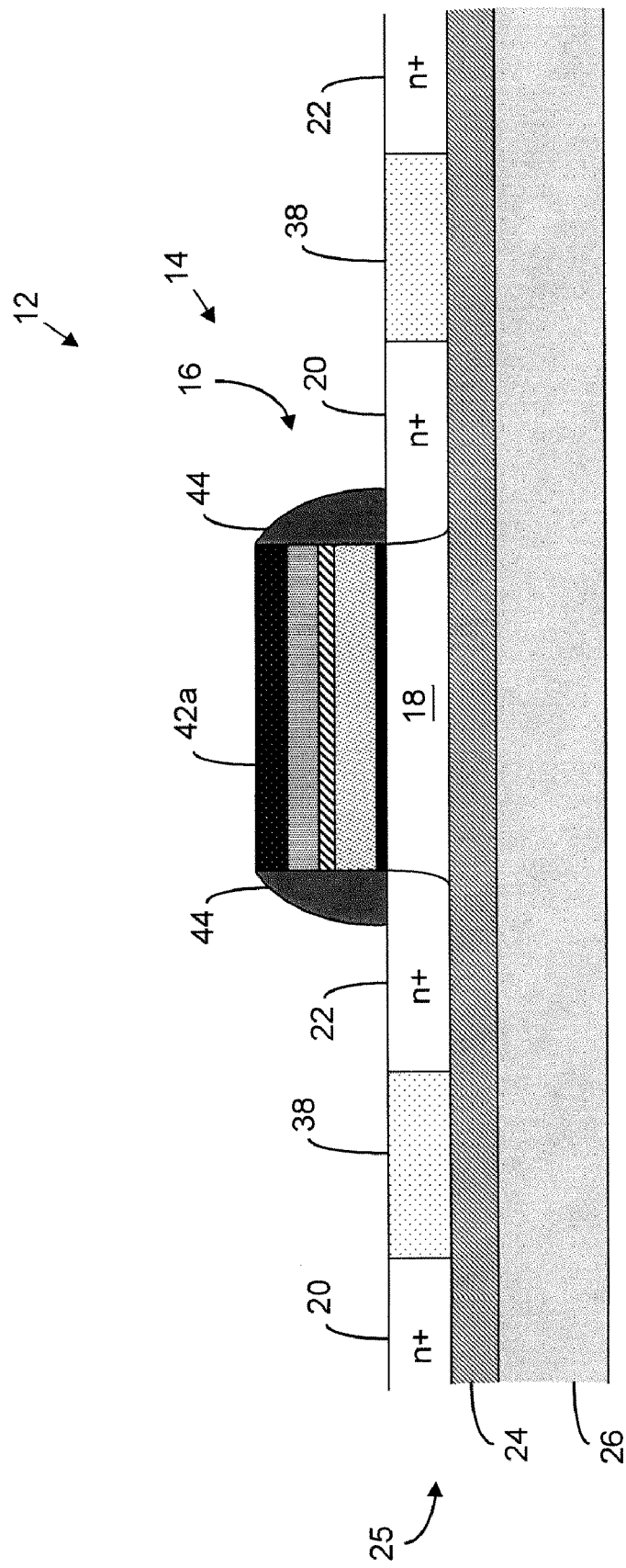

With reference to FIG. 22K, after annealing and formation of a lightly doped region (if any) of the source/drain regions before/after ion implantation, memory cells 12 includes transistors 14. In this illustrated embodiment (wherein one of a plurality are illustrated), transistors 14 are disposed on region 24 (for example, insulation region (such as silicon oxide or silicon nitride) or non-conductive region (for example, region of a bulk semiconductor die or wafer)). The transistors 14 includes gate 16 and gate dielectric 16a, which is disposed between gate 16 and body region 18 of transistors 14. The body region 18 is disposed between source region 20 and drain region 22 of transistors 14. In this exemplary embodiment, gate 16 includes a polycide stack including semiconductor material 40a (doped with an impurity as discussed above), barrier material 48a and metal material 50a.

Figure 22L:
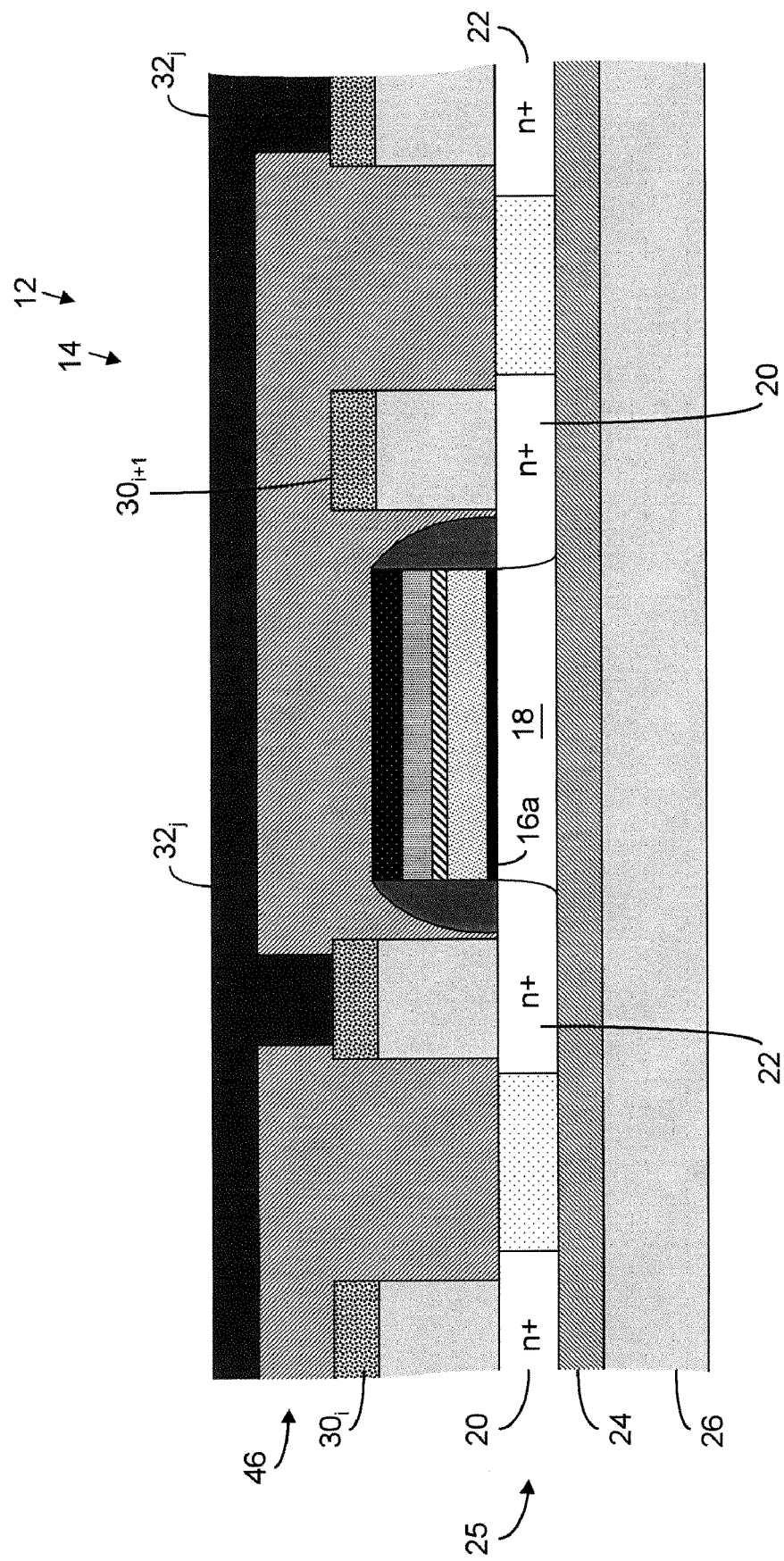

With reference to FIG. 22L, thereafter, one or more insulation and planarization materials 46 may be deposited, grown formed and/or provided (using conventional semiconductor processing techniques), via holes formed in one or more of the insulation and planarization materials 46, and source and bit line contacts deposited, grown and/or formed to facilitate electrical connection to an associated source line 30 and associated bit line 32, respectively. The one or more insulation and planarization materials 46 may include one or more polymers, silicon dioxides and/or silicon nitrides, combinations of silicon dioxides and silicon nitrides in a stack configuration, and/or silicate glass materials (for example, BPSG, PSG and/or BSG)). Indeed, all materials and deposition, formation and/or growth techniques, whether now known or later developed, are intended to be within the scope of the present inventions.

The source lines 30 and/or bit lines 32 may be formed from a highly conductive material (for example, a metal such as copper, chromium, gold, silver, molybdenum, platinum, palladium, tungsten and/or titanium), metal stacks, complex metals and/or complex metal stacks (for example, nickel silicide NiSix (x=0.5, 1, 3/2, and the like) and/or phases with different sorts of donor and acceptor type of doping for work function engineering) and/or a semiconductor material (for example, a silicon or silicon-germanium, whether doped or undoped) which is deposited, grown and/or formed in one or more processes. Notably, although not illustrated or fabricated in this manner in the exemplary embodiments, source line 30 may be fabricated in the same or similar manner as bit line 32 (i.e., the source lines may be connected to associated source regions of transistors of associated memory cells by way of the same or similar material as described above with respect to bit lines 32).

Thereafter (for example, immediately or after additional circuitry and/or conductive layers are deposited, formed or grown), a passivation layer (not illustrated) may be deposited, formed or grown on the exposed surfaces (for example, exposed portions of bit line and/or source line, circuitry and/or conductive layers) to protect and/or insulate integrated circuit device. The passivation layer may include one or more layers including, for example, polymers, a silicon dioxide and/or a silicon nitride. Indeed, passivation layers may include, for example, a combination of silicon dioxide and a silicon nitride in a stack configuration; indeed, all materials and deposition, formation and/or growth techniques, whether now known or later developed, are intended to be within the scope of the present inventions.

Figure 23A:
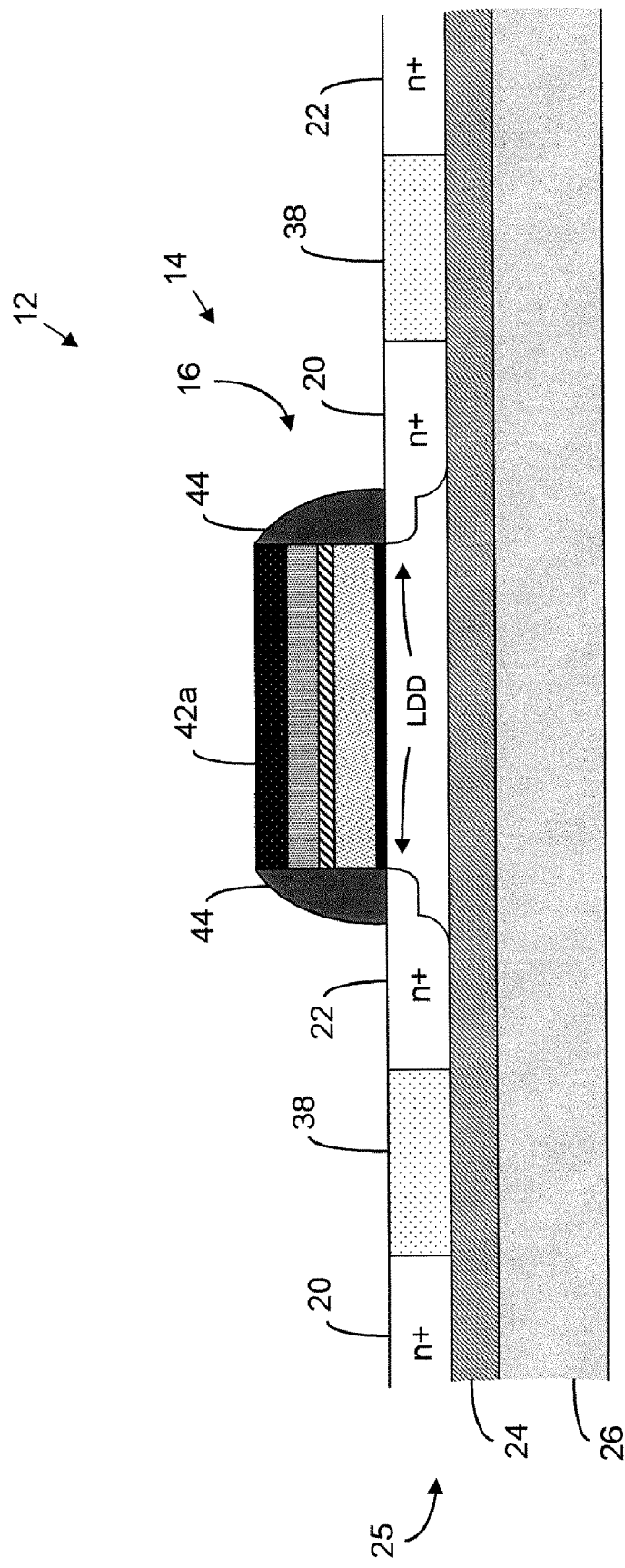
FIGS. 23A-23C are cross-sectional views of a transistor of a memory cell of the memory cell array of the integrated circuit, wherein the gate of each transistor includes a polycide stack, and wherein the source and/or drain regions of the transistor include lightly doped regions (FIG. 23A), halo regions (FIG. 23B) and combinations thereof (FIG. 23C); all source and/or drain regions structures, arrangements and/or configurations/layouts, whether known or unknown (whether conventional or unconventional), are intended to fall within the scope of the present inventions.
Figure 23B:
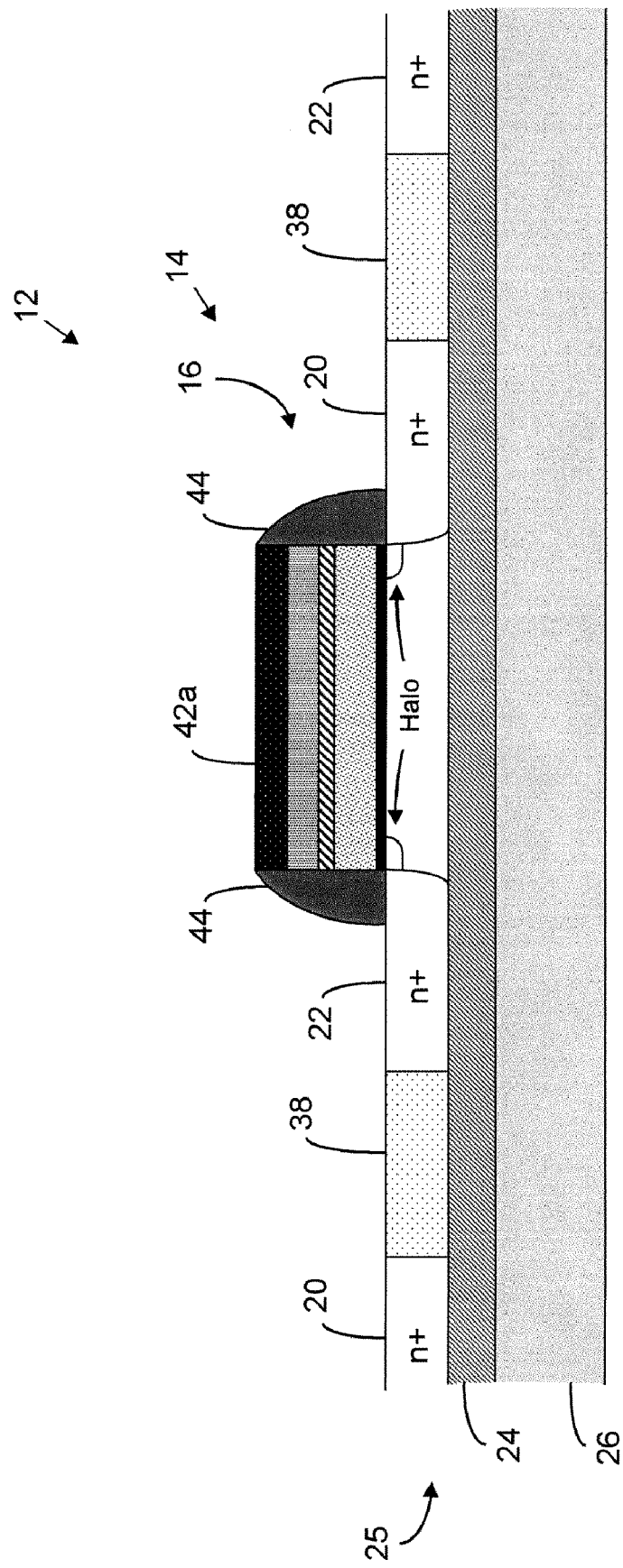
Figure 23C:
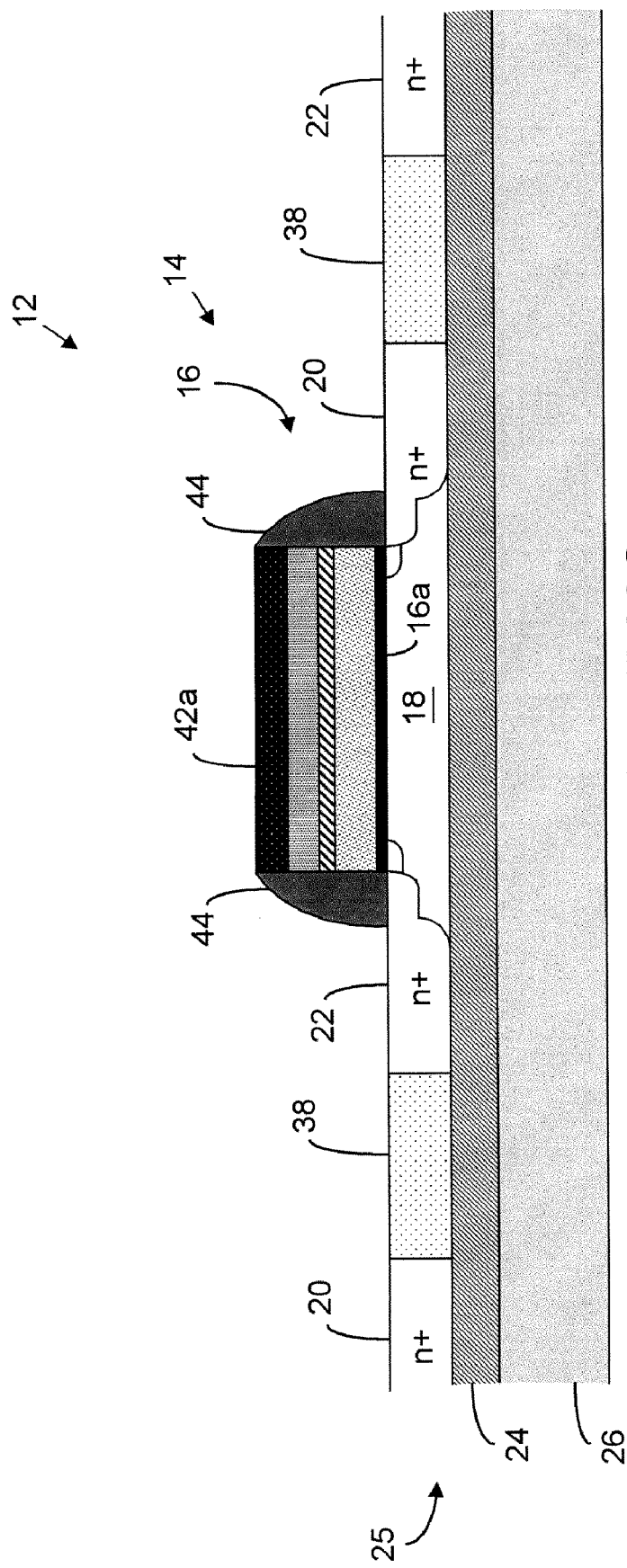

Notably, the source and/or drain regions of the embodiment of FIG. 21 may include lightly doped drain or extension regions ("LDD"), halo or pocket regions ("Halo") and/or combinations thereof. (See, for example, FIGS. 23A-23C, respectively). All source and/or drain regions structures, arrangements and/or configurations/layouts, whether known or unknown (whether conventional or unconventional), are intended to fall within the scope of the present inventions.

The transistors in the circuitry of the logic section of the integrated circuit may be fabricated in a manner which is similar to polycide gate stack implemented in the memory cell array. In this regard, the gates of one, some or all of the transistor in or of the circuitry of the logic section of the integrated circuit include a plurality of materials (for example, a polycide material disposed on a polycrystalline silicon material). For example, with reference to FIG. 24, the gates of transistors 52 are typically doped semiconductor material (for example, n+ doped polycrystalline silicon), a barrier material (for example, titanium nitride, tantalum nitride or tungsten nitride) and a metal material (for example, copper, chromium, gold, silver, molybdenum, platinum, palladium, tungsten and/or titanium, metal stacks, complex metals, conductive alloys and/or complex metal stacks (for example, nickel silicide NiSix (x=0.5, 1, 3/2, and the like) and/or phases with different sorts of donor and acceptor type of doping for work function engineering)).

In this embodiment, additional processing may be employed to "protect" transistors and/or other elements (active and/or passive) in the circuitry of the logic section of the integrated circuit during fabrication of semiconductor material 40 portion of the gate of the transistor of the memory cells of the memory cell array (for example, deposition of a p type dopant into a polycrystalline silicon). For example, a mask (soft or hard) or other protective layer may be disposed on or over the circuitry of the logic section of the integrated circuit during certain portions of the fabrication. In this way, the gate material of the transistors in the circuitry of logic section of the integrated circuit are unaffected or substantially unaffected during certain fabrication process of material of gates 16 of transistors 14 of memory cells 12 in the memory cell array.

Figure 24:
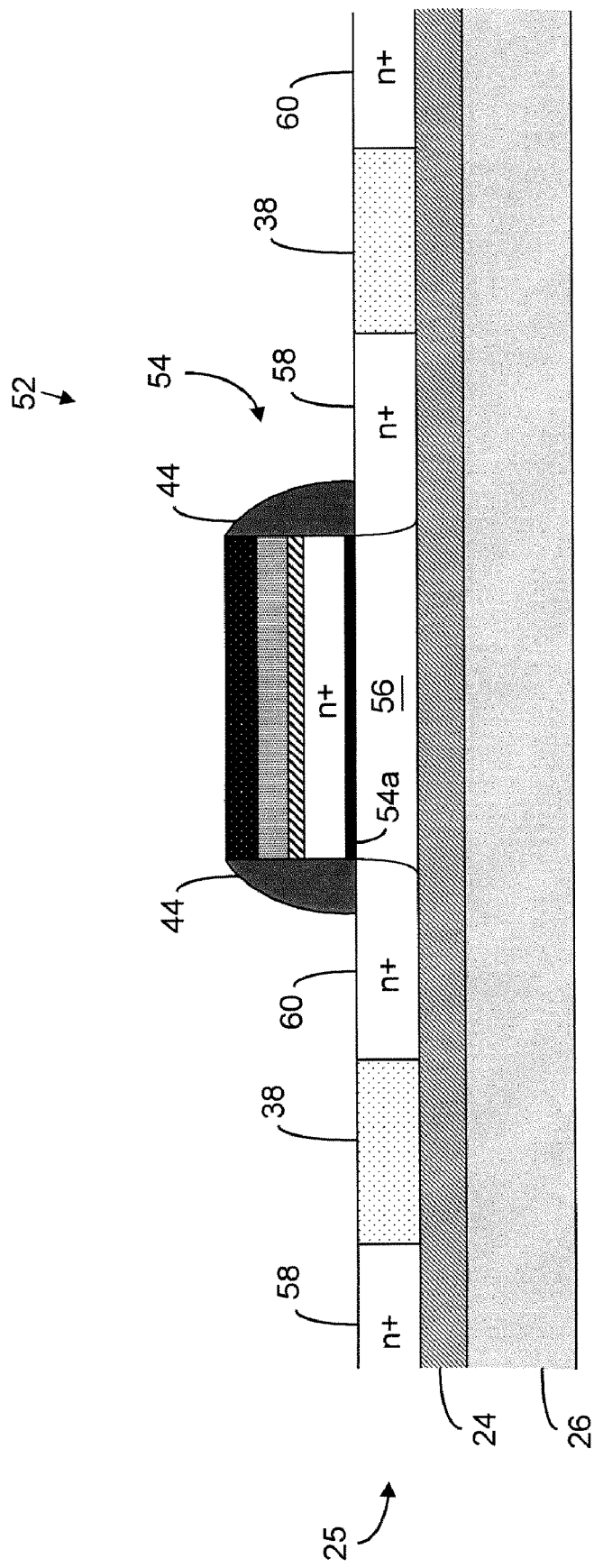
FIG. 24 is a cross-sectional view of an electrically floating body transistor in a portion of the circuitry of the logic section of the integrated circuit having a memory cell and/or memory cell array of, for example, FIGS. 11 and 21, illustrating an exemplary embodiment of the present inventions according to at least one aspect of the present inventions, wherein the gate of one or more of the electrically floating body transistors includes a polycide stack having a doped semiconductor layer.

With reference to FIG. 24, transistors 52 in the circuitry of the logic section of the integrated circuit, in one exemplary embodiment, are disposed on region 24 (for example, insulation region (such as silicon oxide or silicon nitride) or non-conductive region (for example, region of a bulk semiconductor die or wafer)). The transistors 52 each include gate 54 comprising a plurality of materials (for example, a polycide material disposed on a polycrystalline silicon material). For example, the gates of transistors 12 and 52 include a doped semiconductor material such as polycrystalline silicon, a barrier material (for example, titanium nitride, tantalum nitride or tungsten nitride) and a metal material (for example, copper, chromium, gold, silver, molybdenum, platinum, palladium, tungsten and/or titanium, metal stacks, complex metals and/or complex metal stacks (for example, nickel silicide NiSix (x=0.5, 1, 3/2, and the like) and/or phases with different sorts of donor and acceptor type of doping for work function engineering)). A gate dielectric 54a is disposed between gate 54 and body region 56 of transistors 52. The body region 56 of each transistor 52 is disposed between source region 58 and drain region 60 of the associated transistor 52.

Figure 25A:
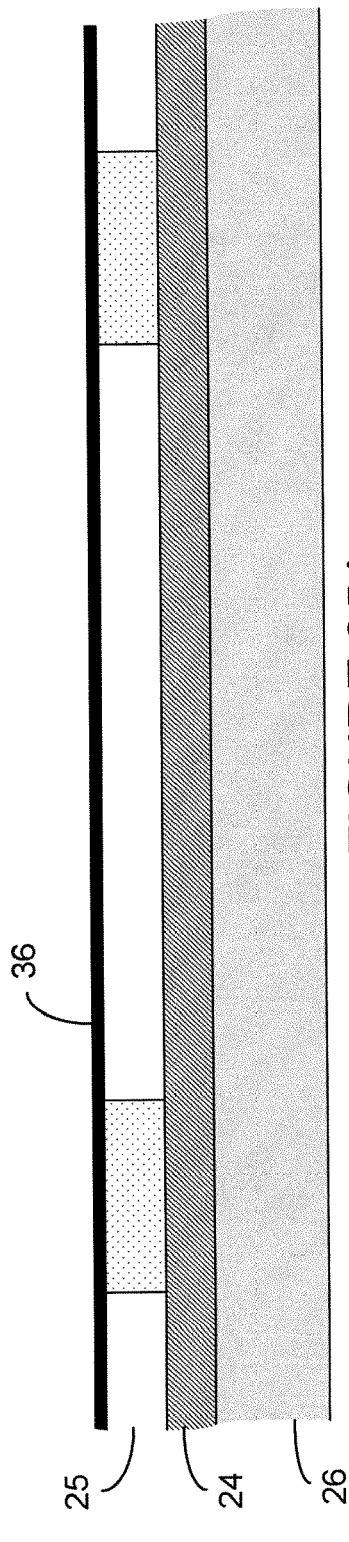
Figure 25B:
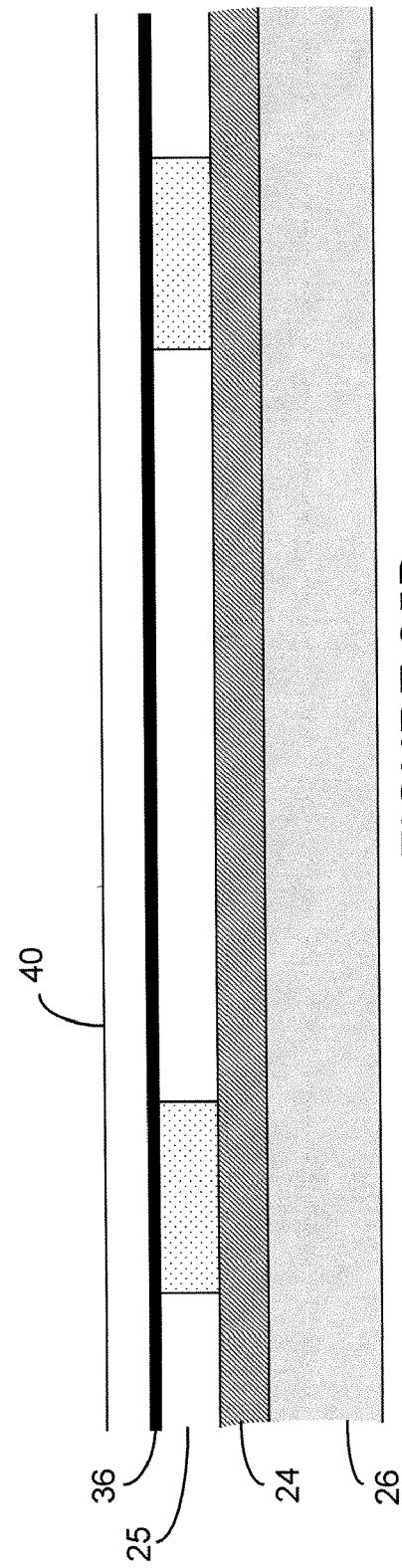

The manufacturing of the transistors of FIG. 24 in the circuitry of the logic section of the integrated circuit may be similar to the manufacturing of the transistors of the FIG. 15. (Compare, FIGS. 25A and 25B with FIGS. 16A and 16B). For the sake of brevity, the discussions pertaining to FIGS. 25A and 25B will not be repeated.

Figure 25C:
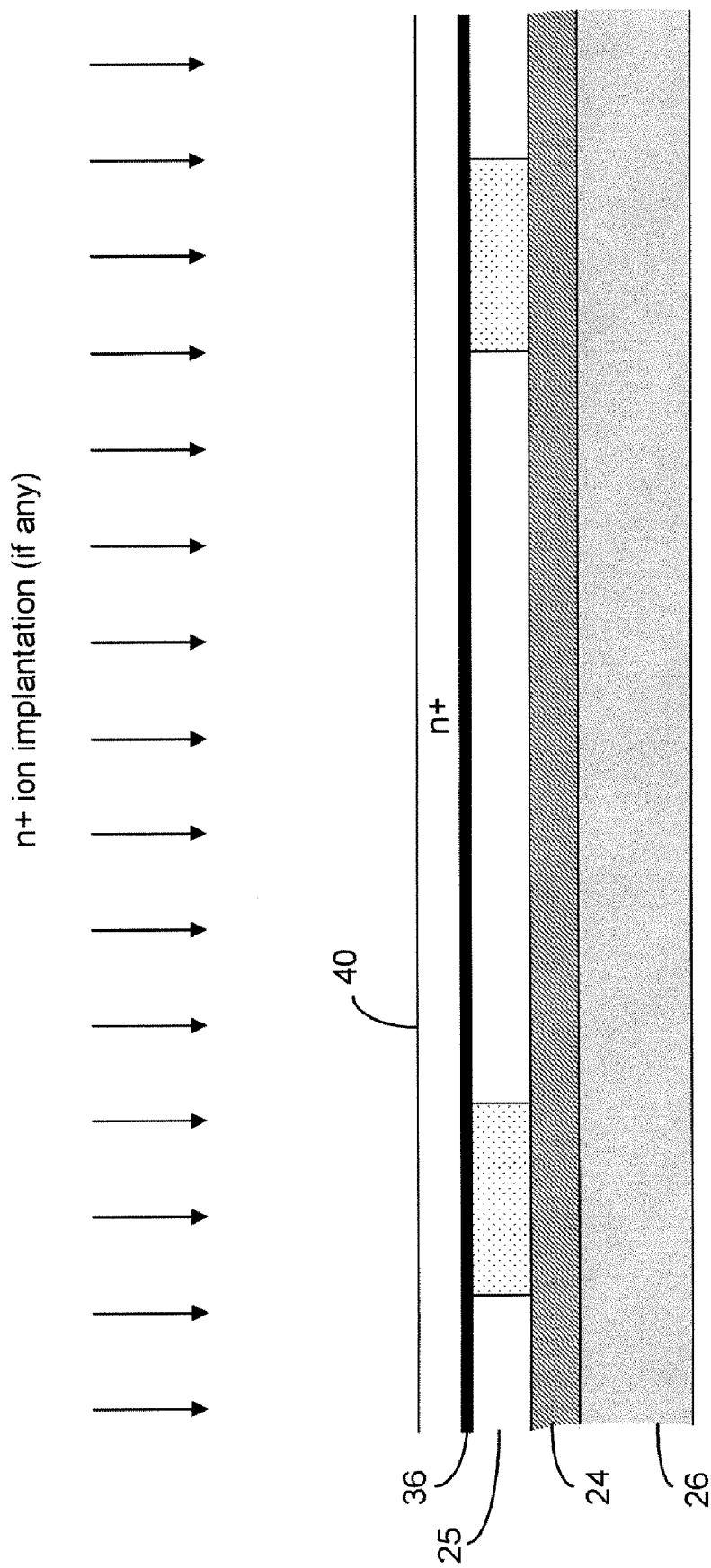

With reference to FIG. 25C, in those instances where gate 54 includes a doped semiconductor material such as polycrystalline silicon (see FIG. 24), a dopant is implanted or introduced into semiconductor layer 40 to adjust or change the work function of the material (FIG. 25C). For transistors 52 of FIG. 24B, a mask (soft or hard) or other protective layer may be disposed on or over the semiconductor layer 40 associated with such transistors to inhibit or prevent implantation or introduction of the dopant into such portions of semiconductor layer 40. In this way, the gate material(s) of the transistors of FIG. 24B in the circuitry of the logic section of the integrated circuit are unaffected or substantially unaffected during certain fabrication process of material of gates 54 of transistors 52 of FIG. 24.

Thereafter, a barrier material or layer 48 (for example, titanium nitride, tantalum nitride or tungsten nitride) may be deposited, grown and/or provided on or over semiconductor layer 40 (see, FIG. 25D). Thereafter, a metal material or layer 50 (for example, copper, chromium, gold, silver, molybdenum, platinum, palladium, tungsten and/or titanium, metal stacks, complex metals and/or complex metal stacks) is deposited, grown and/or provided on or over barrier material or layer 48 (see, FIG. 25E). The processing of FIGS. 25D and 25E may correspond to the processing of FIGS. 22D and 22E, respectively.

Notably, prior to the dopant implanted or introduced into semiconductor layer 40 (for example, the p-type dopant implanted or introduced into layer 40, for example, a polycrystalline silicon) located in the memory cell array, in one embodiment, a mask (like mask material 62—see, FIG. 16C) may be deposited, grown and/or provided as well as patterned (via conventional lithographic techniques) to provide a mask (similar to mask 62a—see, FIG. 16D) on or over semiconductor layer 40 in the circuitry of the logic section of the integrated circuit to "protect" semiconductor layer 40 (via inhibiting doping thereof) in the circuitry of the logic section of the integrated circuit during such processing of the semiconductor layer 40 in the memory cell array portion.

The mask may be a hard or soft mask and may be comprised of any material now known or later developed which inhibits or prohibits p-type dopant implantation in semiconductor layer 40 in the circuitry of the logic section of the integrated circuit. In addition, mask material may be deposited, grown and/or provided using any technique whether now known or later developed (whether conventional or unconventional); all of which are intended to fall within the scope of the present inventions.

Figure 25H:
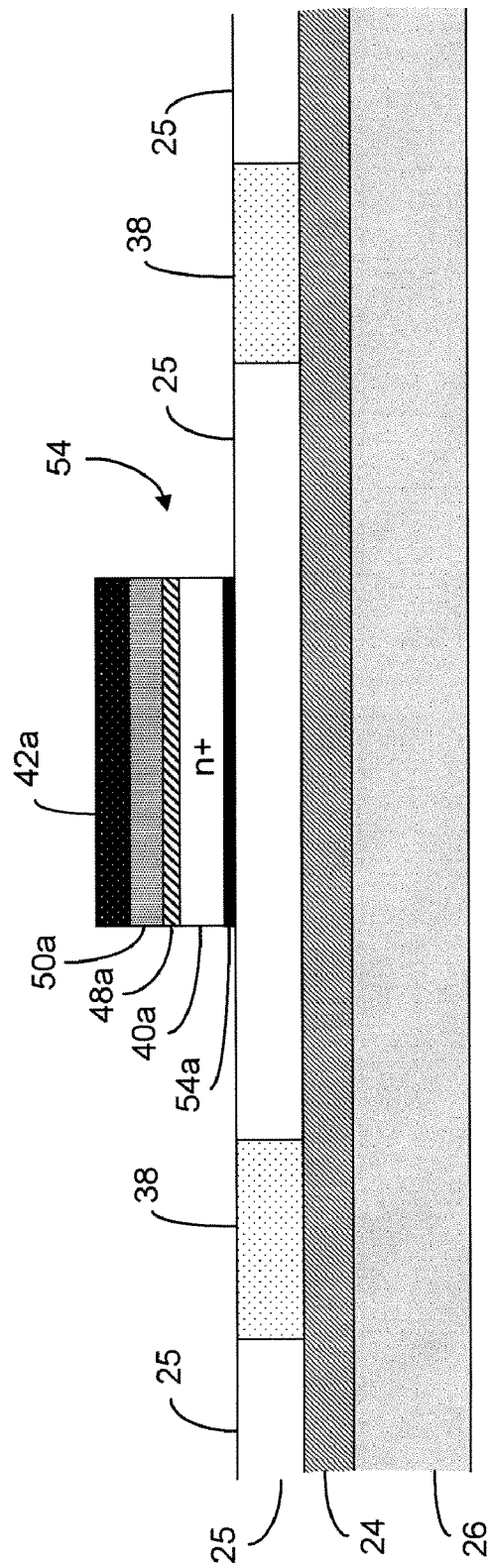

With reference to FIGS. 25F-25H, mask material 42 may be deposited, grown and/or provided on or over semiconductor layer 40 (see, FIG. 25F) and gate mask 42a may be formed using, for example, conventional semiconductor processing techniques (see, FIG. 25G). Thereafter, selected portions of semiconductor layer 40, barrier layer 48, metal layer 50 and dielectric layer 36 may then be etched, removed and/or patterned to form and/or provide gate 54 and gate dielectric 54a. (See, FIG. 25H). In addition to formation or providing of gate 54 and gate dielectric 54a, selected portions of semiconductor layer 25 are exposed which will provide (after additional processing) the source and drain regions of transistors 52. As noted above, in one embodiment, an anisotropic etch technique is employed to remove selected portions of semiconductor layer 40, barrier layer 48, metal layer 50 and dielectric layer 36 to form and/or provide gates 54 and gate dielectrics 54a of transistors 52. Notably, the processing illustrated in FIGS. 25F-25H may correspond to the processing illustrated in FIGS. 22F-22H, respectively.

Figure 25I:
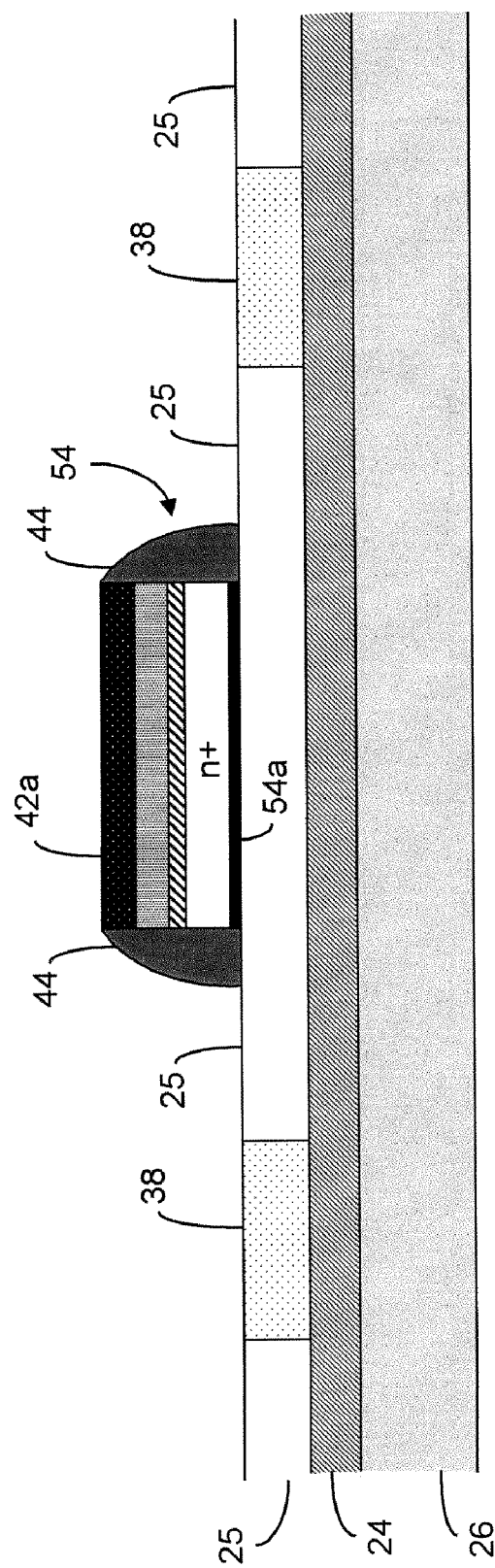
Figure 25J:
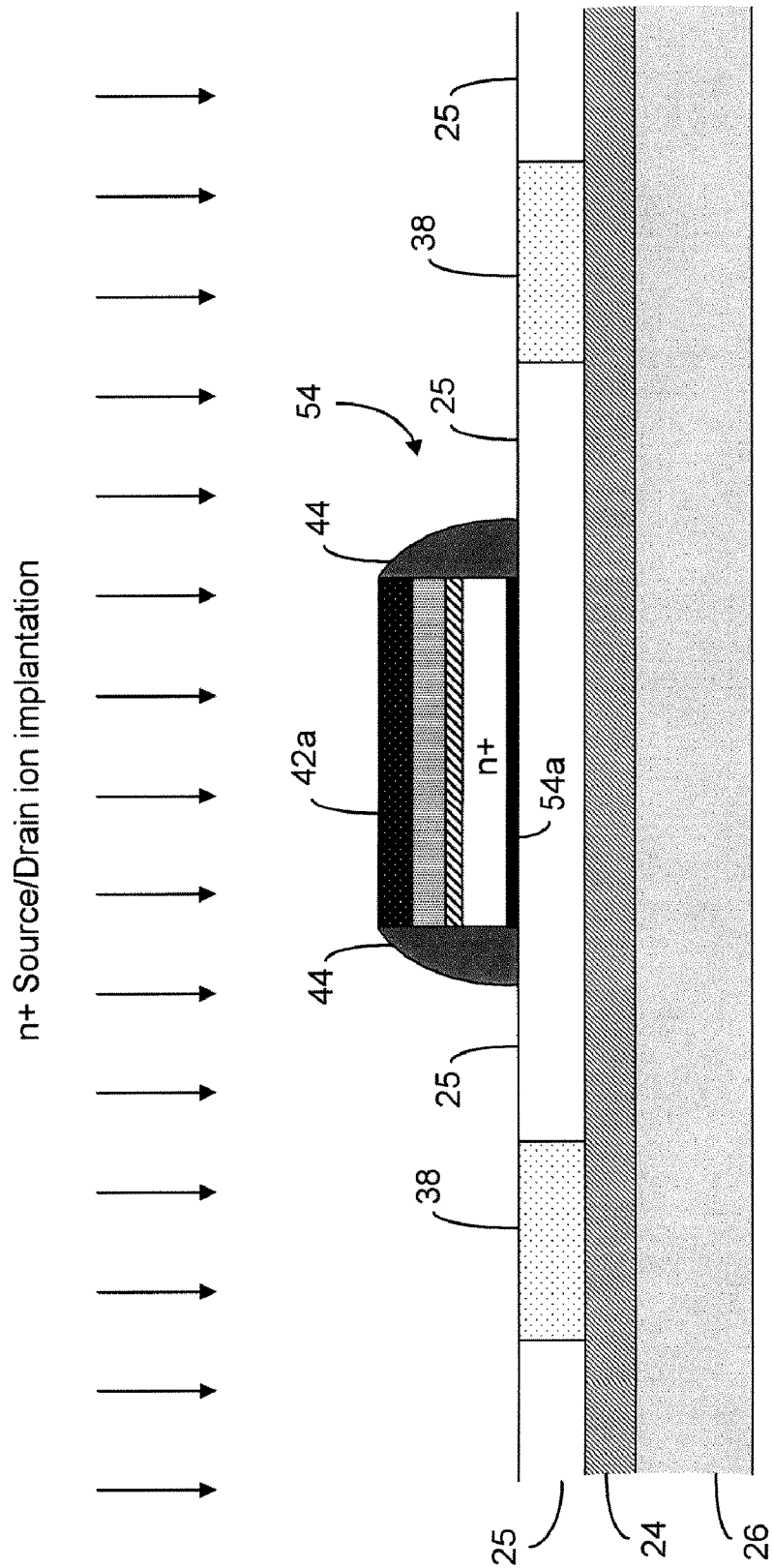
Figure 25K:
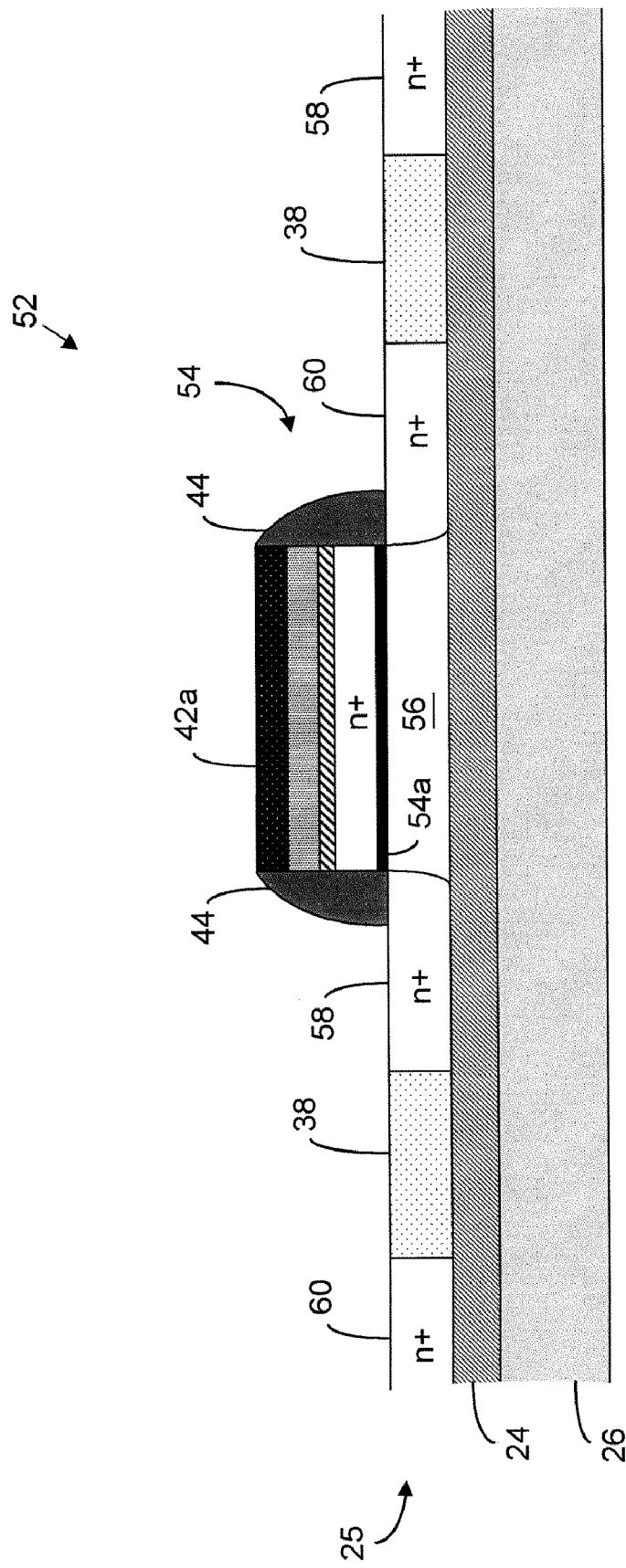

With reference to FIGS. 25I-25K, the manufacturing process may continue with the source/drain implant into semiconductor layer 25 to fabricate the transistors in the circuitry of the logic section of the integrated circuit. This processing may correspond to the source/drain implant into semiconductor layer 25 in the memory cell array to form transistors 14 of memory cells 12. (See, FIGS. 22I, 22J and 22K). Briefly, with reference to FIG. 25I, spacer 44 (for example, a silicon nitride and/or a silicon oxide material) may be formed and/or provided using conventional and/or unconventional techniques to provide desired, suitable, predetermined and/or proper relative alignment of body, source and drain regions of the transistors. Thereafter, dopant ions (n-type ions such as phosphorus and/or arsenic) are implanted in exposed areas/portions of semiconductor layer 25. The dopant ions (n-type)

may be implanted and/or introduced into "exposed" portions of semiconductor layer 25 (see FIGS. 25J and 25K) to change the conductivity of certain portions of semiconductor layer 25 relative to portions of layer 25 not exposed to implantation (for example, portions beneath gate 54). Notably, in this embodiment, the dopant is introduced into semiconductor layer 25 using gate 54 and associated spacers 44 to provide a self-aligned source/drain regions of the transistor in or of the circuitry of the logic section of the integrated circuit.

With reference to FIG. 25K, after annealing and formation of a lightly doped region (if any) of the source/drain regions before/after ion implantation, transistors 52 include gate 54 and gate dielectric 54*a*, which is disposed between gate 16 and body region 56 of transistors 54. The body region 56 is disposed between source region 58 and drain region 60 of transistors 52. In this exemplary embodiment, gate 54 includes a polycide stack including semiconductor material 40*a* (doped with an impurity as discussed above), barrier material 48*a* and metal material 50*a*.

Figure 26A:
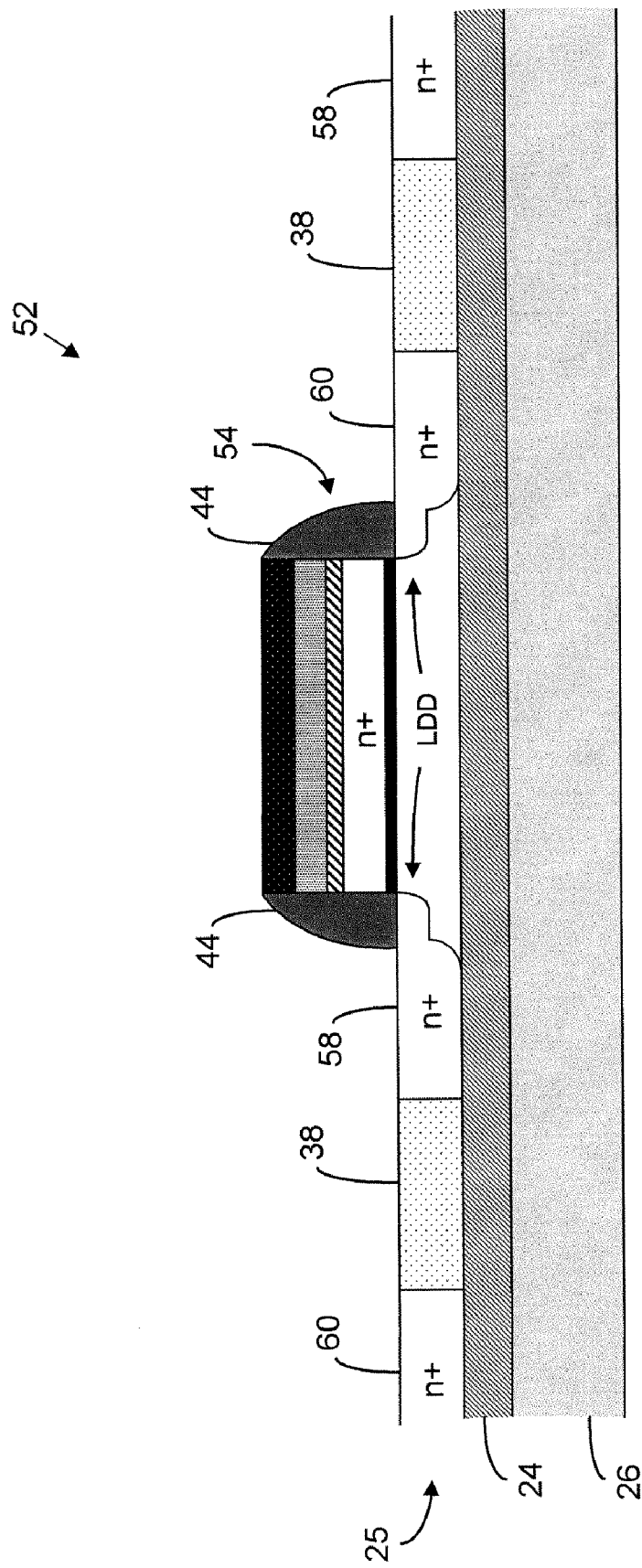
FIGS. 26A-26C are cross-sectional views of an electrically floating body transistor of the circuitry of the logic section of the integrated circuit including an electrically floating body transistor corresponding to the embodiments illustrated in FIG. 24, wherein the source and/or drain regions of the transistor include lightly doped regions (FIG. 26A), halo regions (FIG. 26B) and combination thereof (FIG. 26C); all source and/or drain regions structures, arrangements and/or configurations/layouts, whether known or unknown (whether conventional or unconventional), are intended to fall within the scope of the inventions.
Figure 26B:
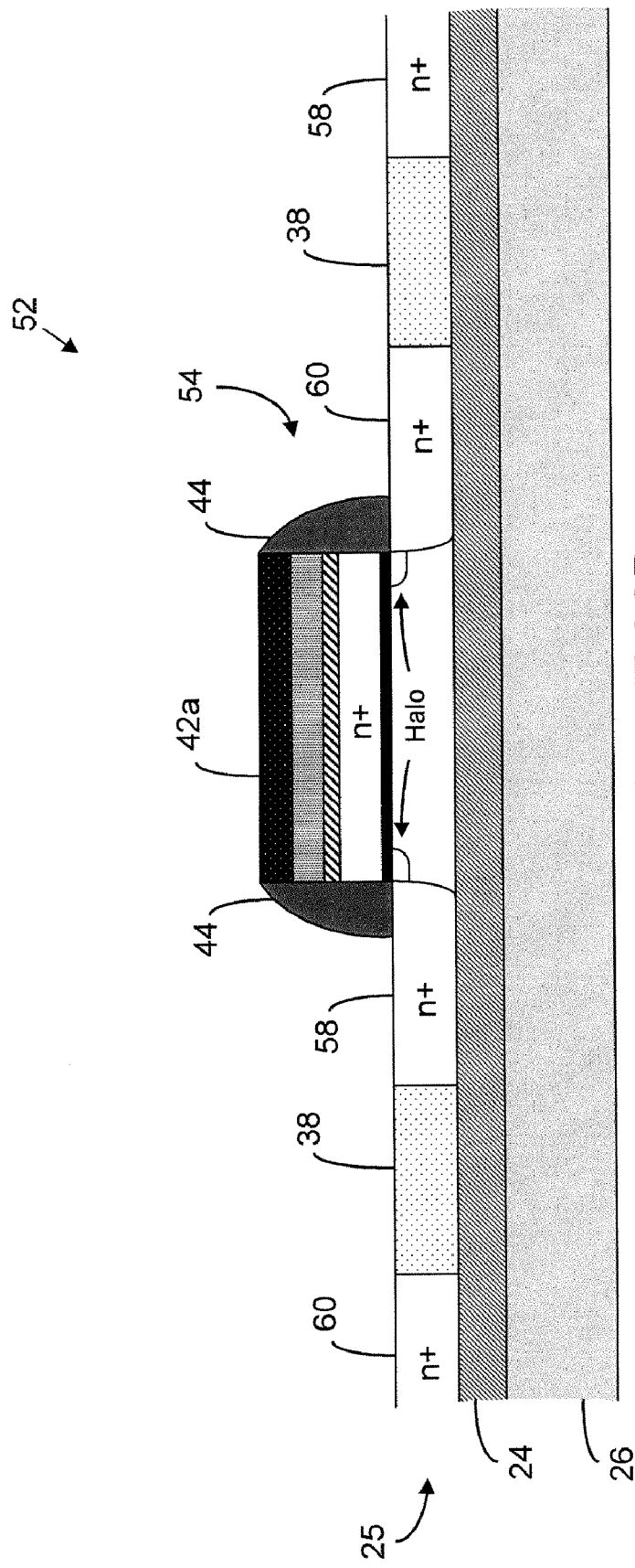
Figure 26C:
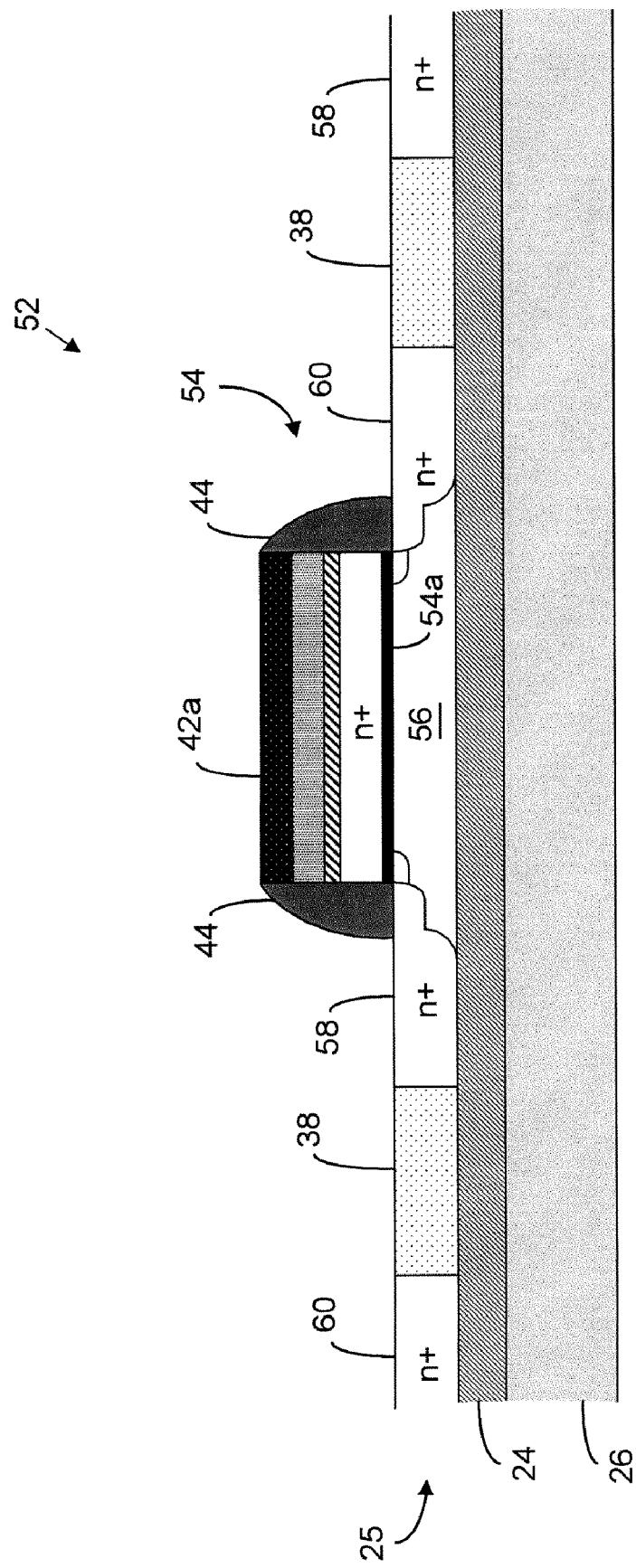

As noted above in other embodiments, the source and/or drain regions of the embodiment of FIG. 24 may include lightly doped drain or extension regions ("LDD"), halo or pocket regions ("Halo") and/or combinations thereof. (See, for example, FIGS. 26A-26C, respectively). All source and/or drain regions structures, arrangements and/or configurations/layouts, whether known or unknown (whether conventional or unconventional), are intended to fall within the scope of the present inventions.

Notably, certain of the process or manufacturing flow/stages of the above exemplary embodiments have been described in the context of a self-aligned process. The inventions described herein may also be employed in processes that are partially self-aligned or process that are not self-aligned.

Figure 27A:
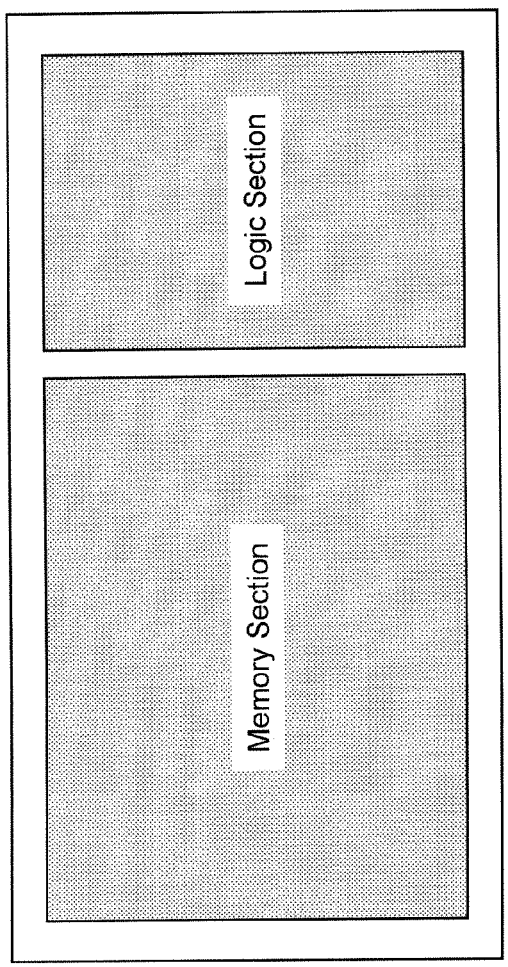
Figure 27B:
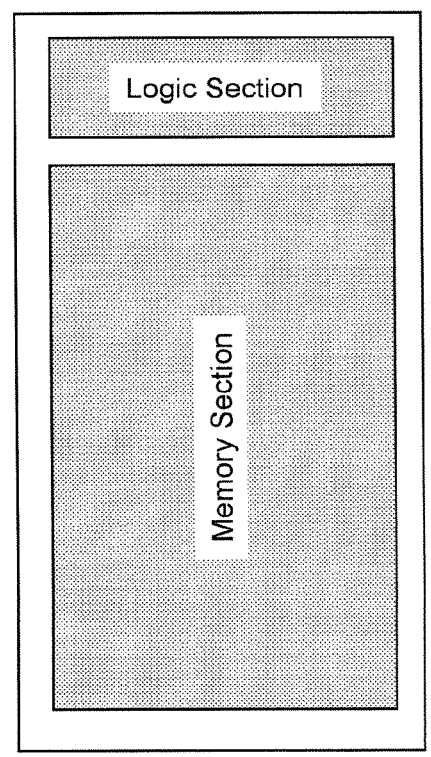
Figure 27C:
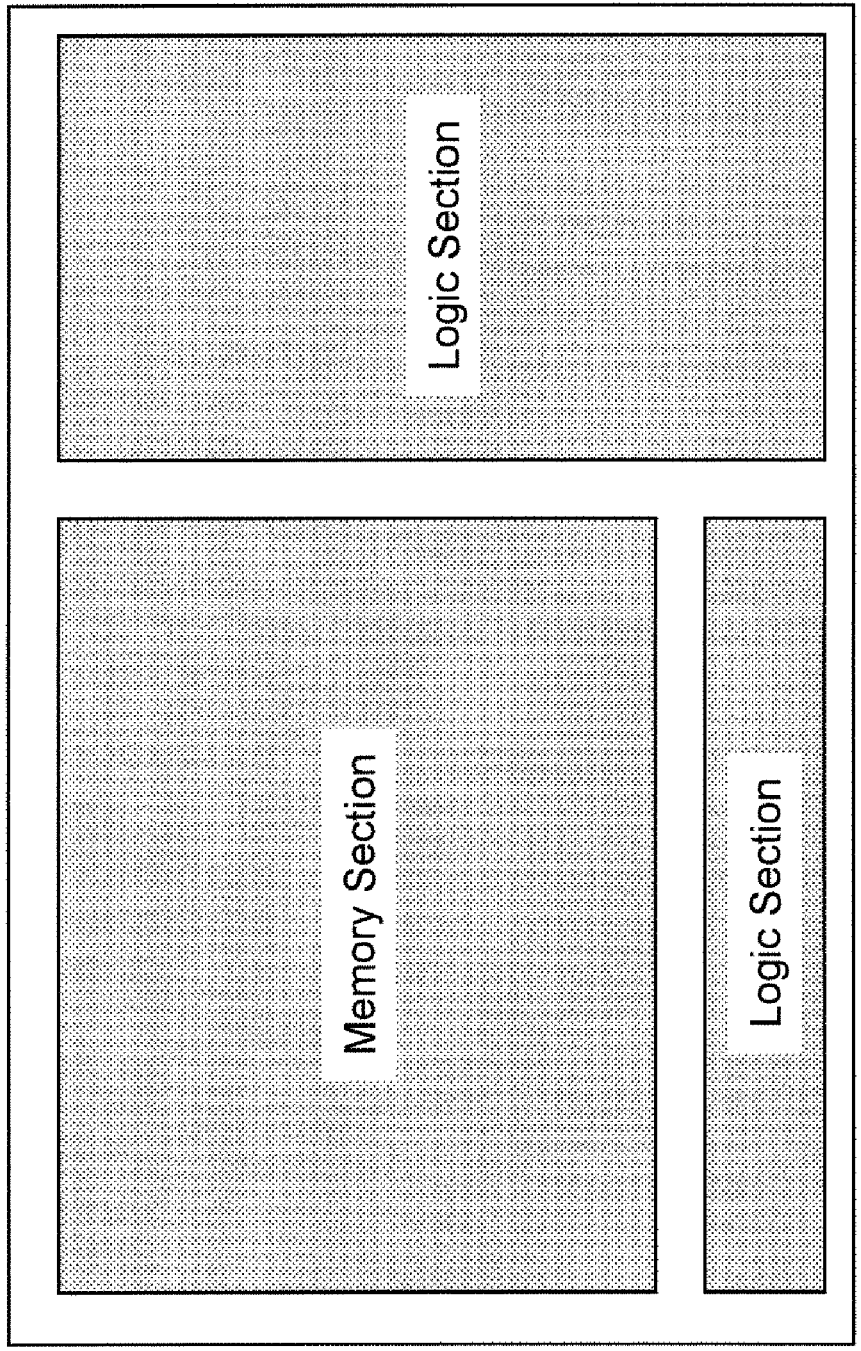

As noted above, the present inventions may be implemented in an integrated circuit device includes memory section (having a plurality of memory cells, for example, PD or FD SOI memory transistors made in the standard planar or any 3D technology—including, planar single or double gate, FinFET or multiple gate (MugFET) transistor, planar or vertical DG-MOSFET (DG=Double Gate)) whether or not the integrated circuit includes a logic section (having, for example, high performance transistors, such as FinFET, multiple gate transistors, and/or non-high performance transistors (for example, single gate transistors that do not possess the performance characteristics of high performance transistors—not illustrated)). In this regard, the present inventions may be implemented in an integrated circuit device that is a logic device and includes a memory section and a logic section (see, for example, FIGS. 27A and 27C), or an integrated circuit device that is primarily a memory storage device (see, for example, FIG. 27B). The memory cell arrays may be comprised of n-channel, p-channel and/or both types of transistors. Indeed, circuitry that is peripheral to the memory array (for example, data sense circuitry (for example, sense amplifiers or comparators), memory cell selection and control circuitry (for example, word line and/or source line drivers), and/or the row and column address decoders) may include p-channel and/or n-channel transistors.

Further, as mentioned above, the present inventions may be employed in conjunction with any memory cell technology now known or later developed. For example, the present inventions may be implemented in conjunction with a memory array, having a plurality of memory cells each including an electrically floating body transistor. (See, for example, (1) U.S. Pat. No. 6,969,662, (2) Okhonin et al., U.S. Patent Application Publication No. 2006/0131650 ("Bipolar Reading Technique for a Memory Cell Having an Electrically Floating Body Transistor"), (3) Okhonin et al., U.S. Patent Application Publication No. 2007/0058427 ("Memory Cell and Memory Cell Array Having an Electrically Floating Body Transistor, and Methods of Operating Same"), (4) Okhonin, U.S. Patent Application Publication No. 2007/0138530 ("Electrically Floating Body Memory Cell and Array, and Method of Operating or Controlling Same"), and (5) Okhonin et al., U.S. Patent Application Publication No. 2007/0187775 ("Multi-Bit Memory Cell Having Electrically Floating Body Transistor, and Method of Programming and Reading Same"). In this regard, the memory cell may consist of a PD or a FD SOI transistor (or transistor formed on or in bulk material/substrate) having one or more gates, which is disposed adjacent to the electrically floating body and separated therefrom by a gate dielectric. The transistors may include a single gate or multiple gate architectures made with the planar or any 3D technology now known or later developed. The body region of the transistor is electrically floating in view of the insulation or non-conductive region (for example, in bulk-type material/substrate) disposed beneath the body region. The state of memory cell is determined by the concentration of charge within the body region of the SOI transistor.

The memory cells of the memory cell array may be comprised of n-channel, p-channel and/or both types of transistors. Indeed, circuitry that is peripheral to the memory array (for example, sense amplifiers or comparators, row and column address decoders, as well as line drivers (not illustrated in detail herein)) may include p-channel and/or n-channel transistors. Moreover, the present inventions may be implemented in conjunction with any memory cell array configuration and/or arrangement of the memory cell array. For example, the present inventions may be implemented in a shared source region and/or shared drain region configuration wherein adjacent memory cells source region and/or shared drain region. (See, FIGS. 29A-29I).

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

For example, the memory cells of the memory cell array may be comprised of n-channel, p-channel and/or both types of transistors. Indeed, circuitry that is peripheral to the memory array (for example, sense amplifiers or comparators, row and column address decoders, as well as line drivers (not illustrated in detail herein)) may include p-channel and/or n-channel transistors. Moreover, the present inventions may be implemented in conjunction with any memory cell array configuration and/or arrangement of the memory cell array. For example, the present inventions may be implemented in a shared source region and/or shared drain region configuration wherein adjacent memory cells source region and/or shared drain region. (See, FIGS. 29A-29I).

Figure 28A:
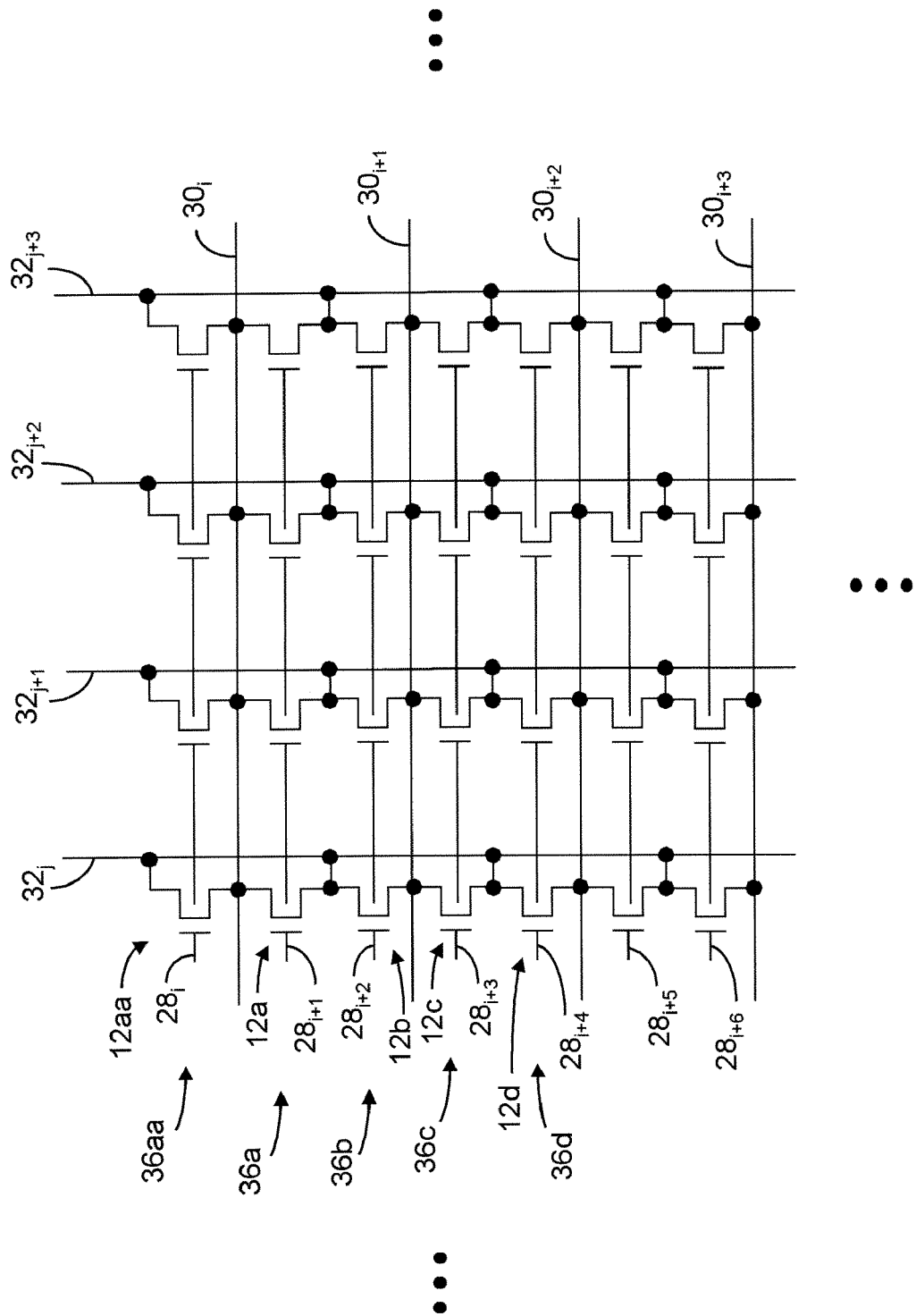
FIG. 28A is a schematic representation of a portion of a memory cell array including a plurality of memory cells, each having one electrically floating body transistor, wherein the memory cell array layout includes memory cells having shared source regions and shared drain regions wherein the transistor of a memory cell of a given or predetermined row of memory cells (i) shares a source region with a source region of an adjacent memory cell of first adjacent row of memory cells and (ii) shares a drain region with a drain region of an adjacent memory cell of second adjacent row of memory cells.
Figure 28B:
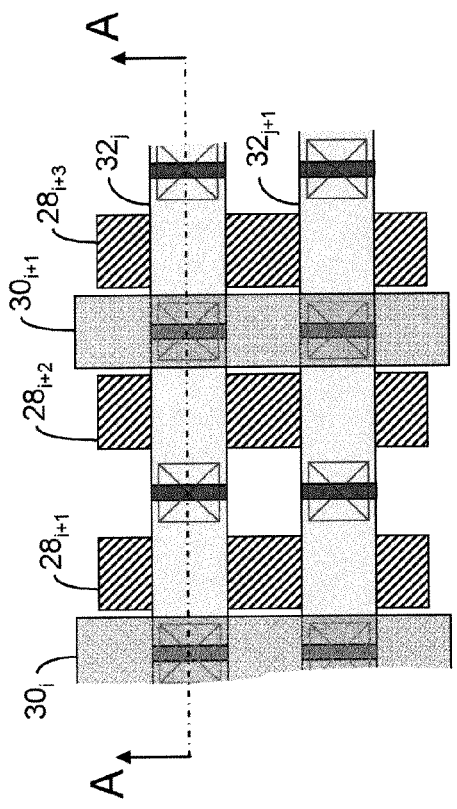
FIG. 28B is an exemplary plan view layout (not drawn to scale) of a portion of the memory cell array of FIG. 28A illustrating the common source and common drain transistor of the memory cell and memory cell array architecture, according to an exemplary embodiment of certain aspects of the present inventions.
Figure 28C:
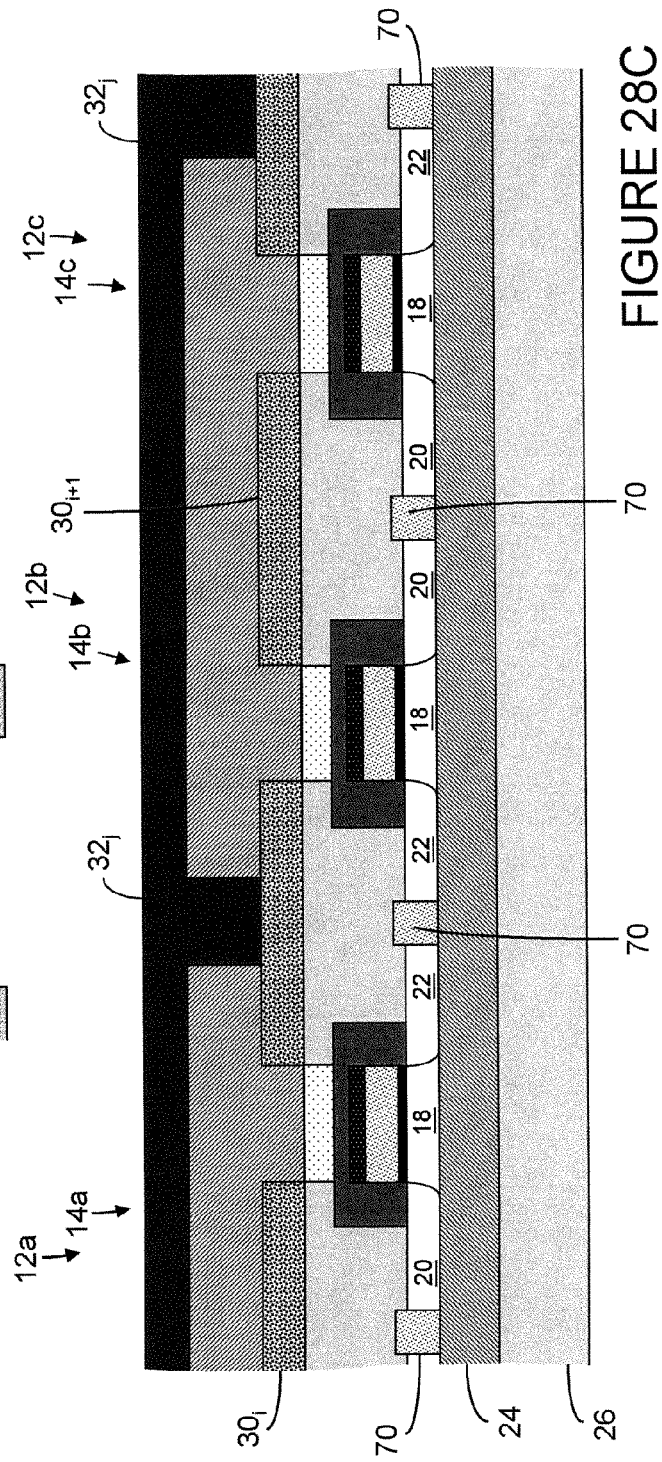
FIG. 28C is a cross-sectional view (sectioned along dotted line A-A of FIG. 28B) of a portion of memory cell array of FIGS. 28A and 28B illustrating an exemplary embodiment of the present inventions, in conjunction with an embodiment of the barriers described and illustrated in U.S. patent application Ser. No. 12/268,671 and U.S. Provisional Application Ser. No. 61/004,672, according to at least one aspect of the present inventions.
Figure 29C:
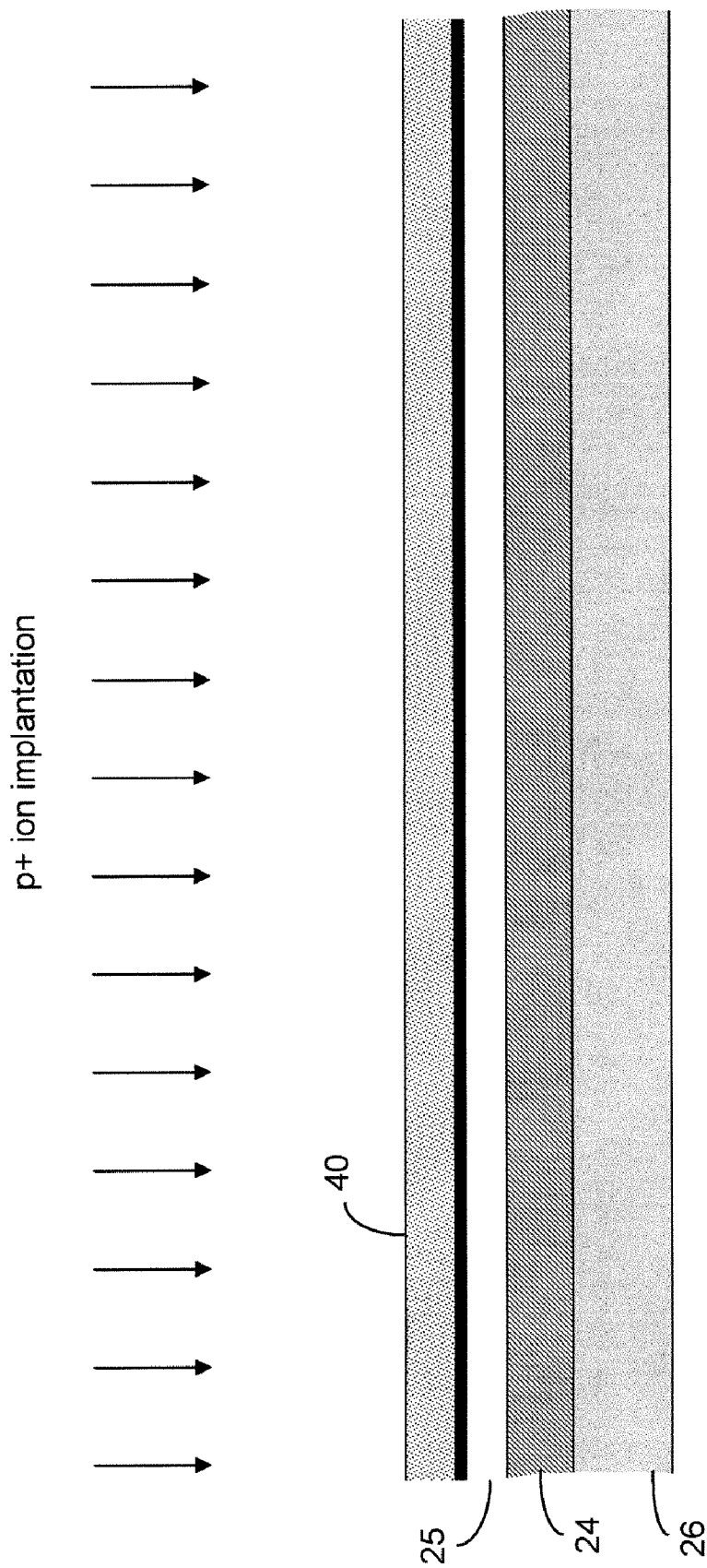
Figure 29D:
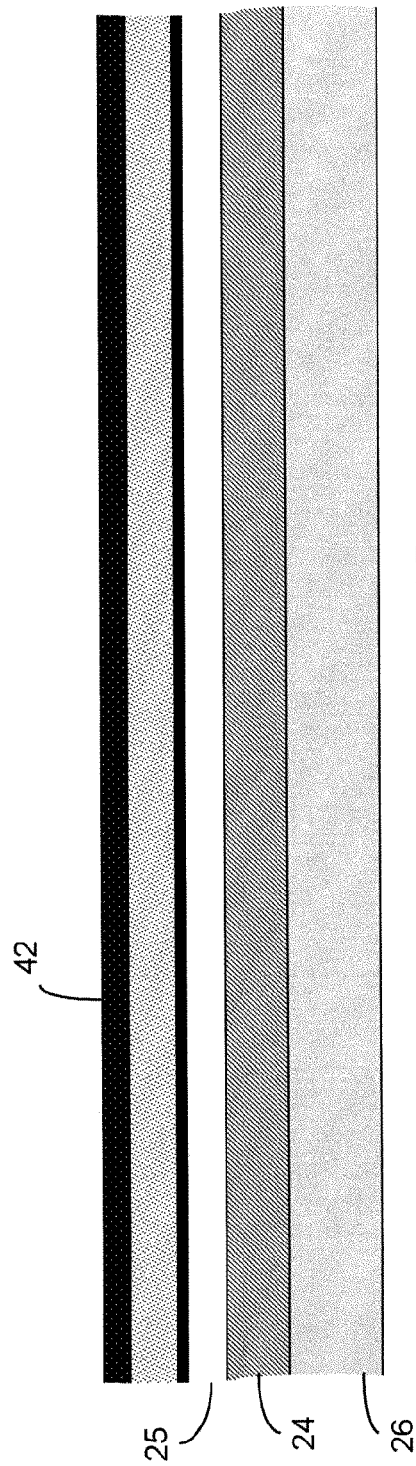
Figure 29E:
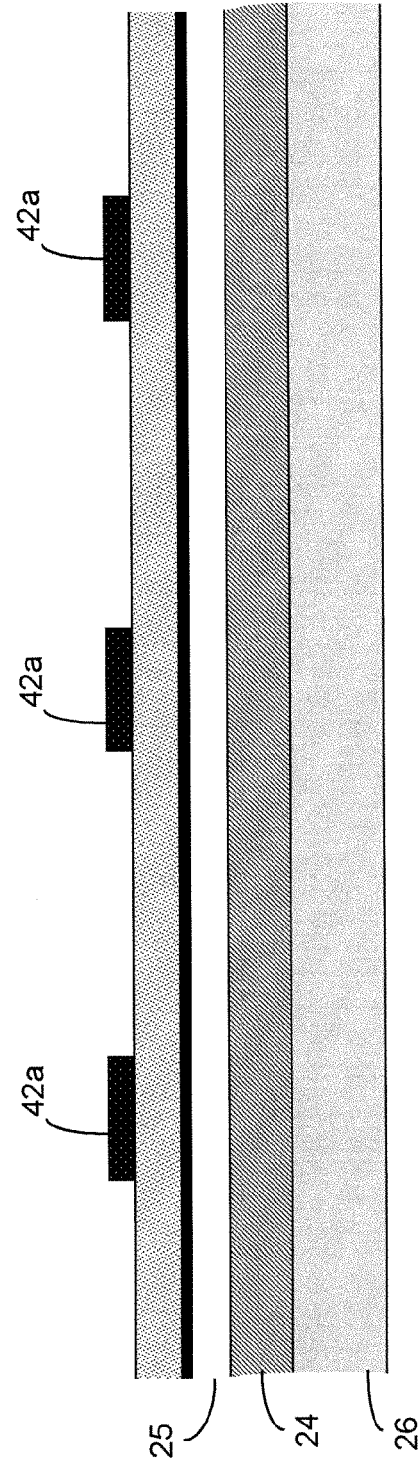
Figure 29H:
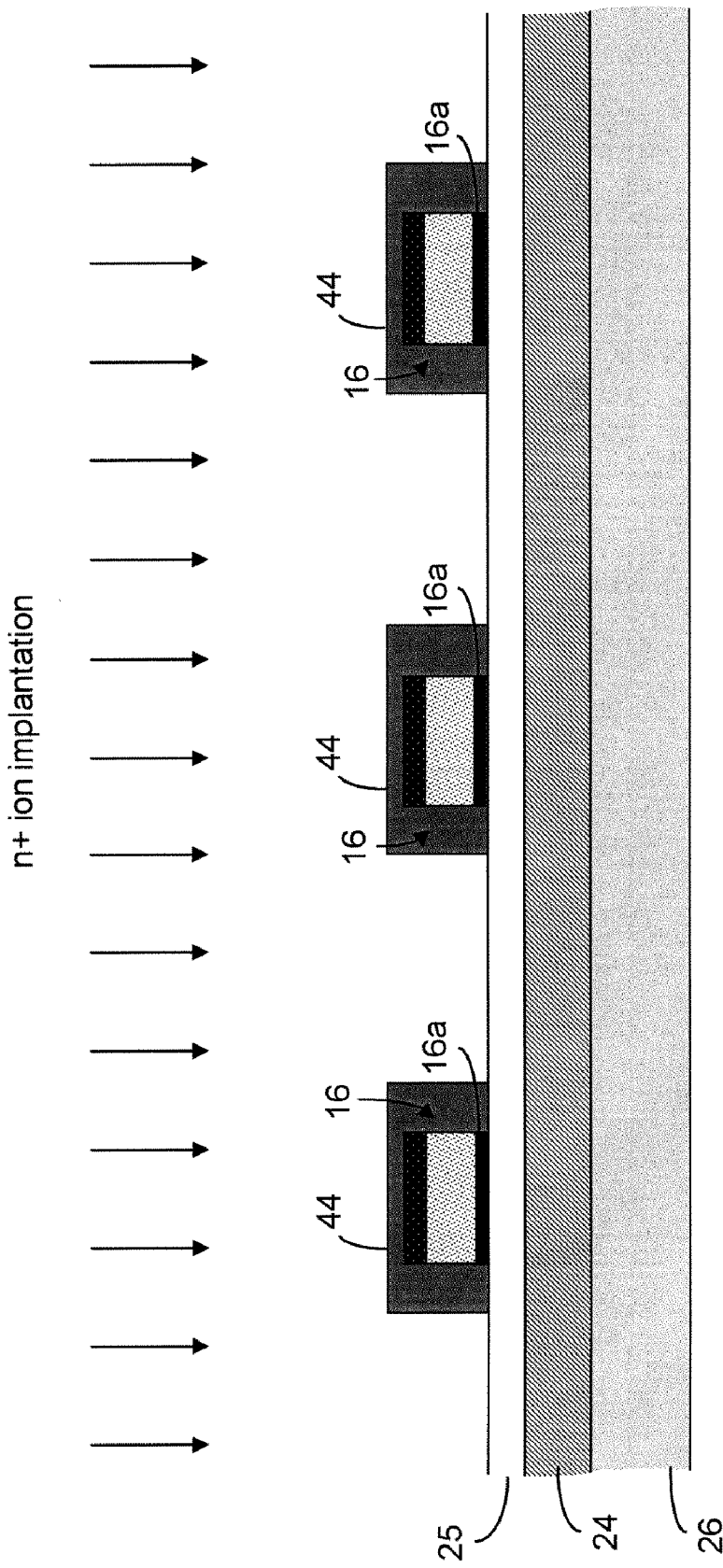
Figure 29I:
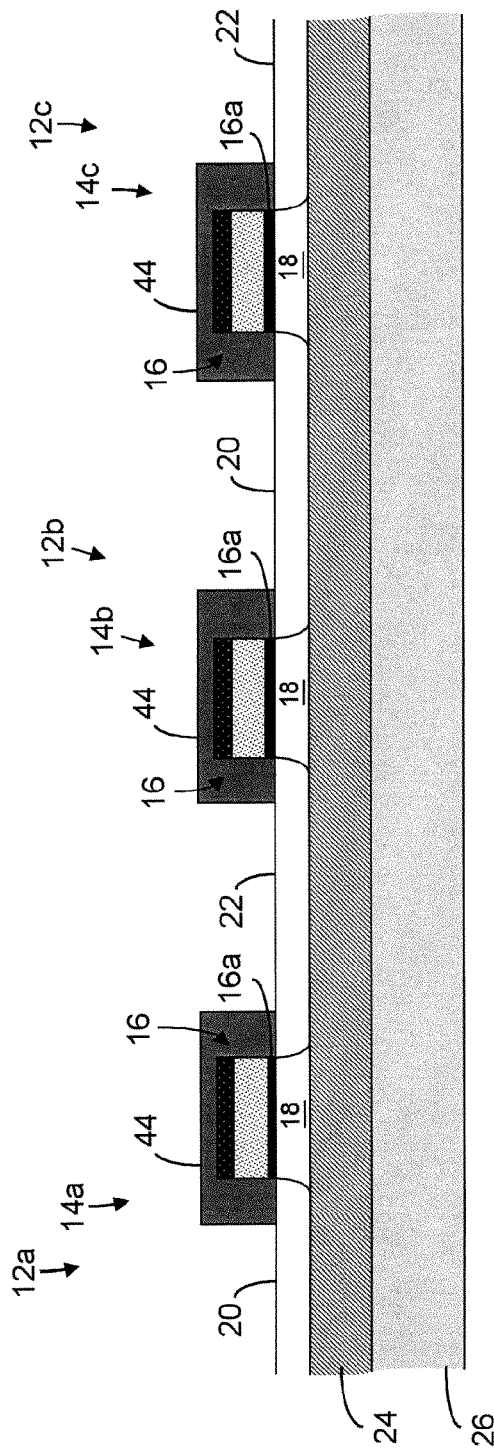
Figure 29J:
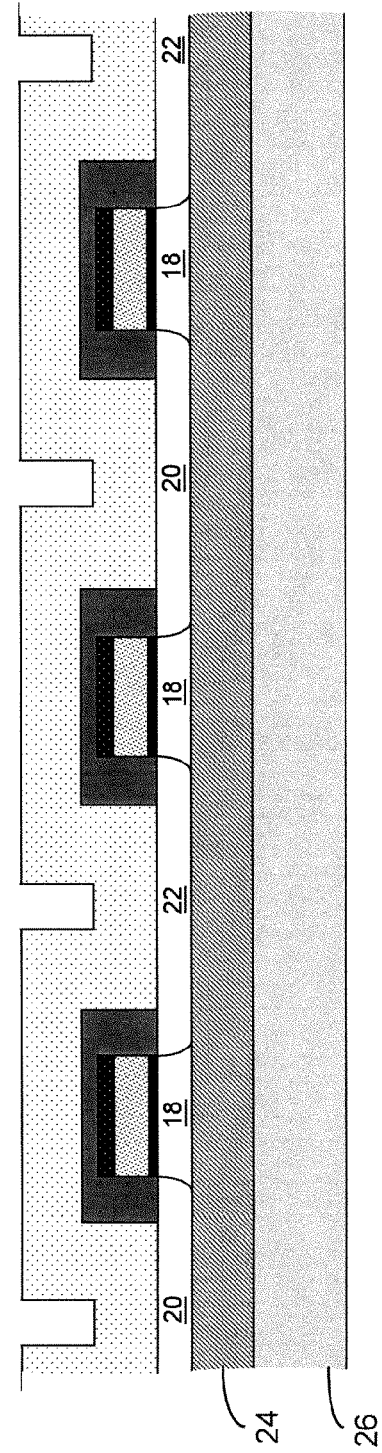
Figure 29Q:
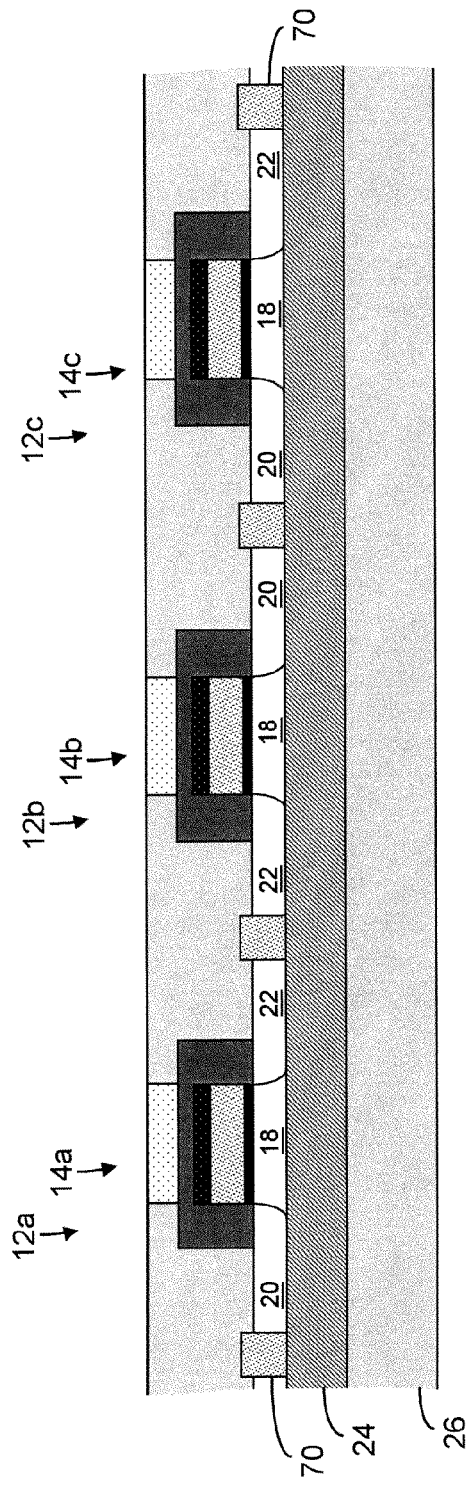
Figure 29R:
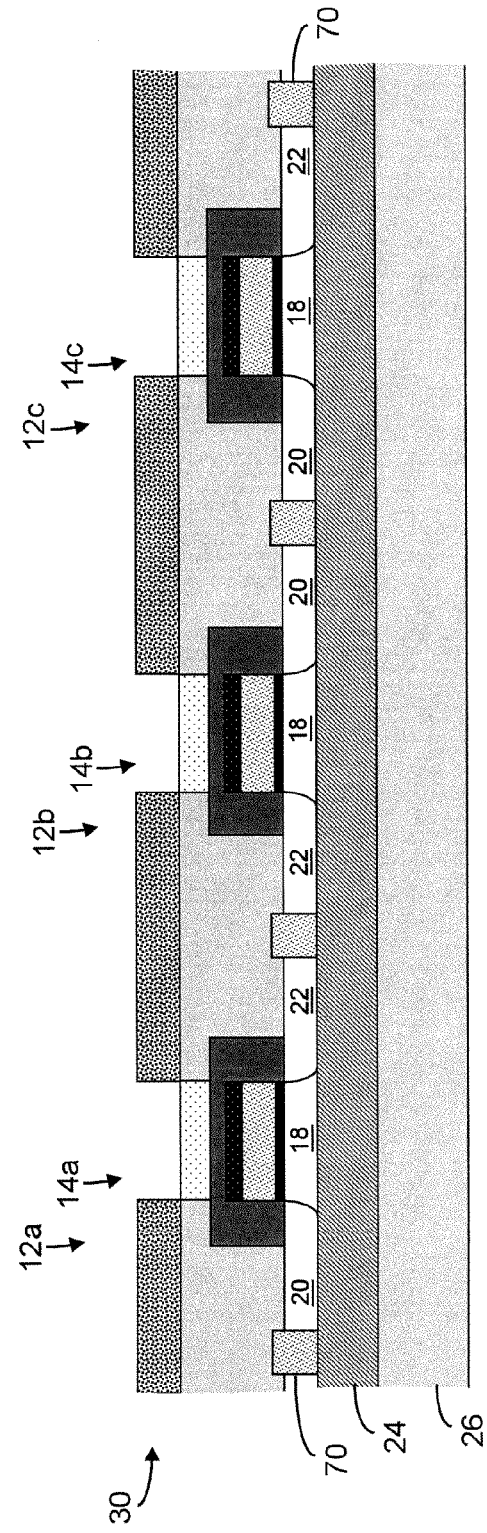
Figure 29S:
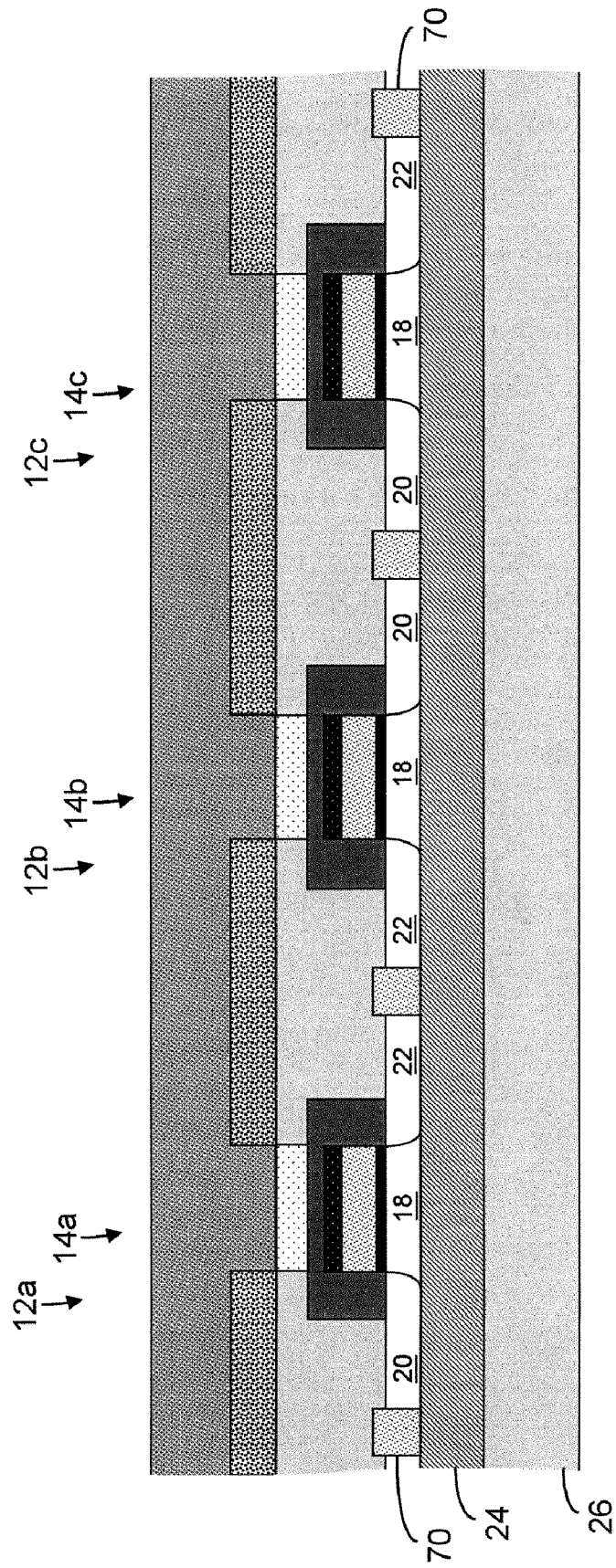
Figure 29T:
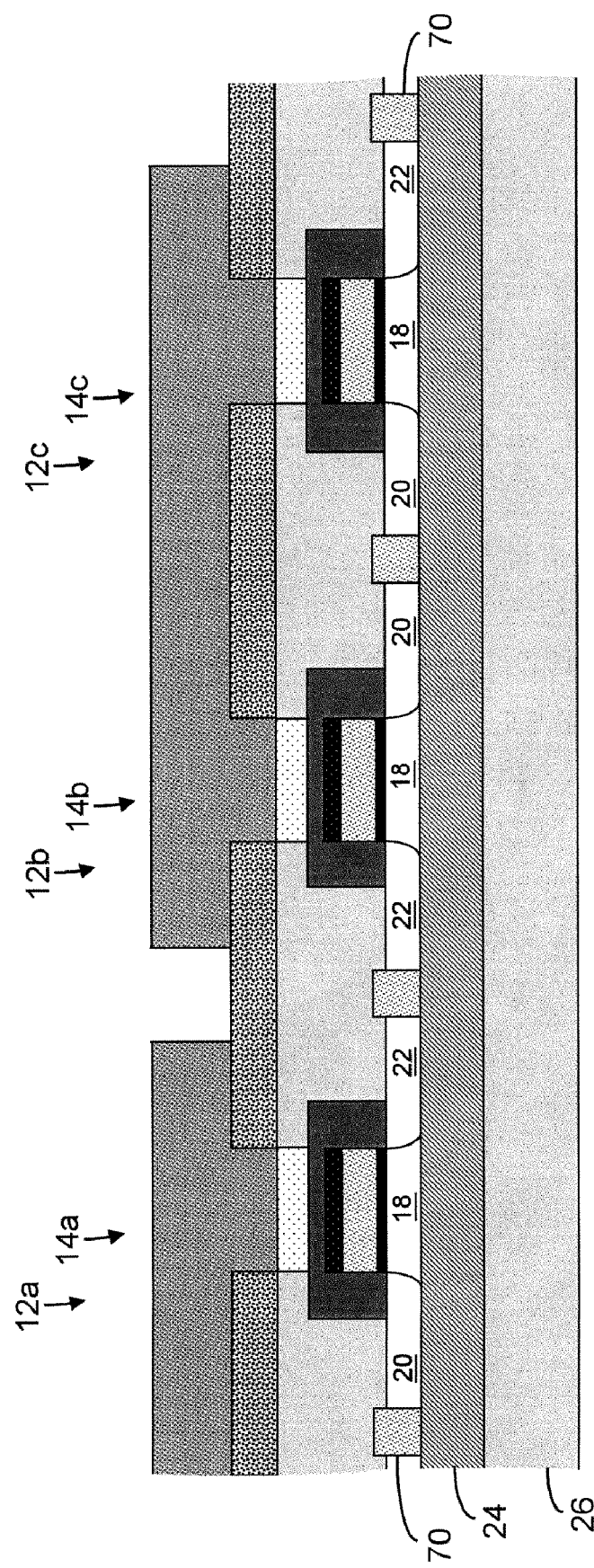
Figure 29U:
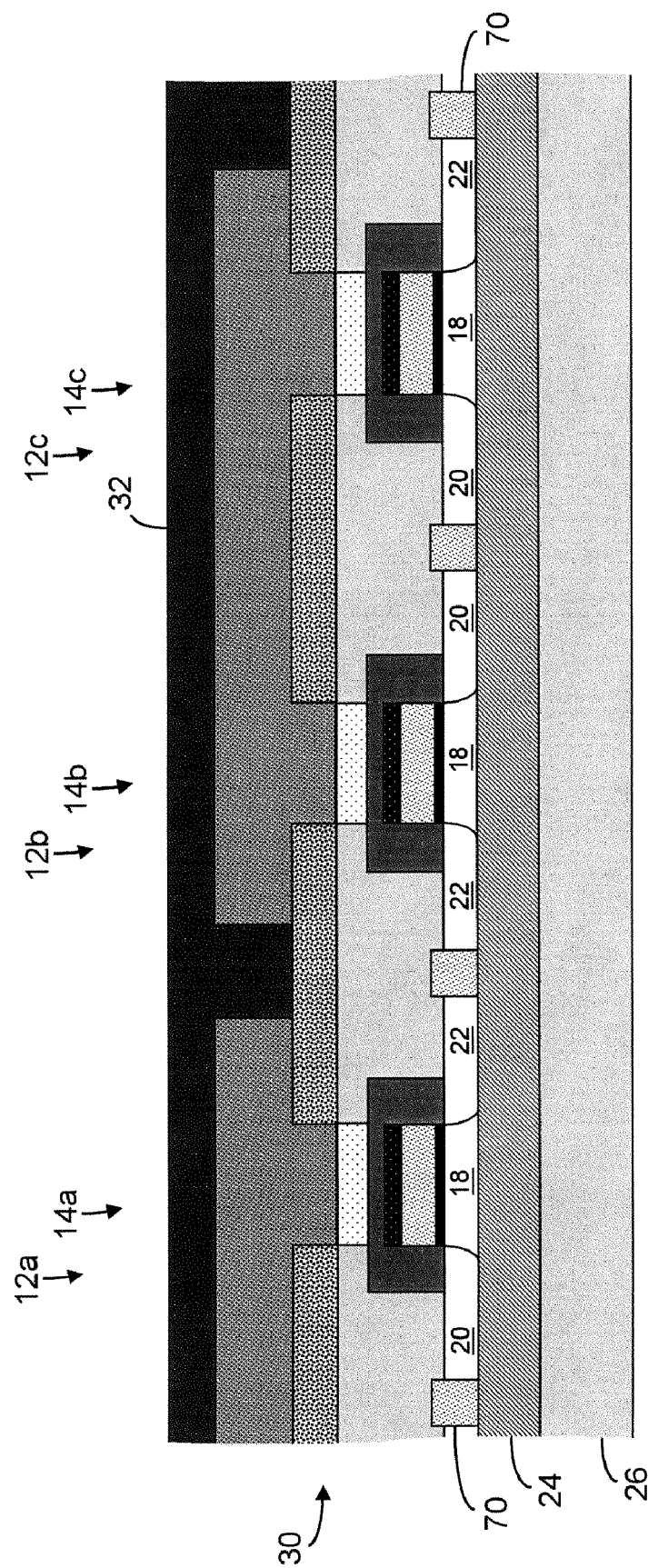

Notably, where the memory cell array is arranged or configured to include a memory cell array having a plurality of memory cells, arranged in a matrix of rows and columns, wherein each memory cell of a given row of memory cells shares a source region and/or a drain region with an adjacent memory cell of an adjacent row of memory cells, the present inventions may be employed in conjunction with the barriers described and illustrated in U.S. patent application Ser. No. 12/268,671 and U.S. Provisional Application Ser. No. 61/004,672 (Inventor: Fazan; hereinafter collectively the "Barrier Application"); the contents of these applications are incorporated by reference herein in their entirety. In this regard, with reference to FIGS. 28A-28C, the present inventions (for example, the transistors having any of the gate structures as described above) may be implemented with the memory cell array having barriers 70 disposed in or between the shared source regions and/or shared drain regions of adjacent memory cells. The barrier 70 may include one or more different materials and/or one or more different crystalline structures relative to the material(s) and/or crystalline structure(s) of the source and/or drain regions of the transistors of the memory cells. An exemplary manufacturing technique of the present inventions in conjunction with the Barrier Application is illustrated in FIGS. 29A-29U. For the sake of brevity, the discussion will not be repeated however, as noted above, the Barrier Application is incorporated by reference herein in their entirety.

As noted in the Barrier Application, the material and/or crystalline structure of the barrier 70 may include electrical characteristics that reduce, eliminate and/or minimize any disturbance and/or adverse impact on a given memory cell (for example, reduction in the read window), during performance of one or more memory operations (for example, a read and/or write operation(s)) on memory cells adjacent to such given memory cell. For example, such material may facilitate and/or provide for sufficiently rapid recombination of charge carriers (minority and/or majority) in the source and/or drain regions of the transistors of memory cells that share source regions and/or shared drain regions with transistors of adjacent memory cells.

Figure 30A:
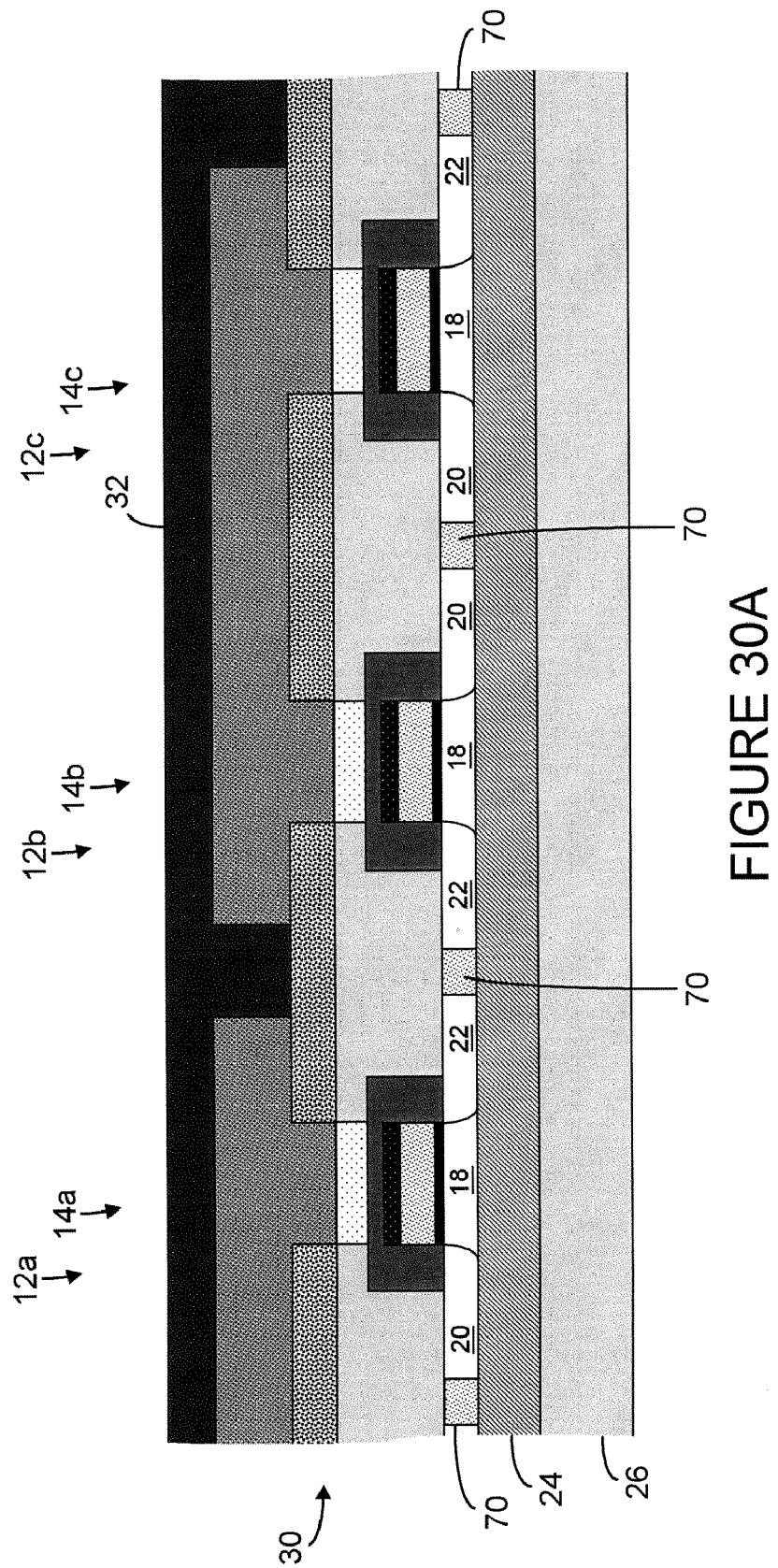
FIGS. 30A-30C are cross-sectional view (sectioned along dotted line A-A of FIG. 28B) of a portion of memory cell array of FIGS. 28A-28C illustrating an exemplary embodiment of the present inventions, according to at least one aspect, wherein the barriers between the drain and source regions of the electrically floating body transistors of adjacent memory cells are substantially planar with respect to the associated source and/or drain regions (FIG. 30A), the barriers are not substantially planar with respect to the associated source and/or drain regions (FIG. 30B) and the height of such barriers is less than the height of the associated source and/or drain regions, and the barriers are comprised of the contact material (FIG. 30C)
Figure 30B:
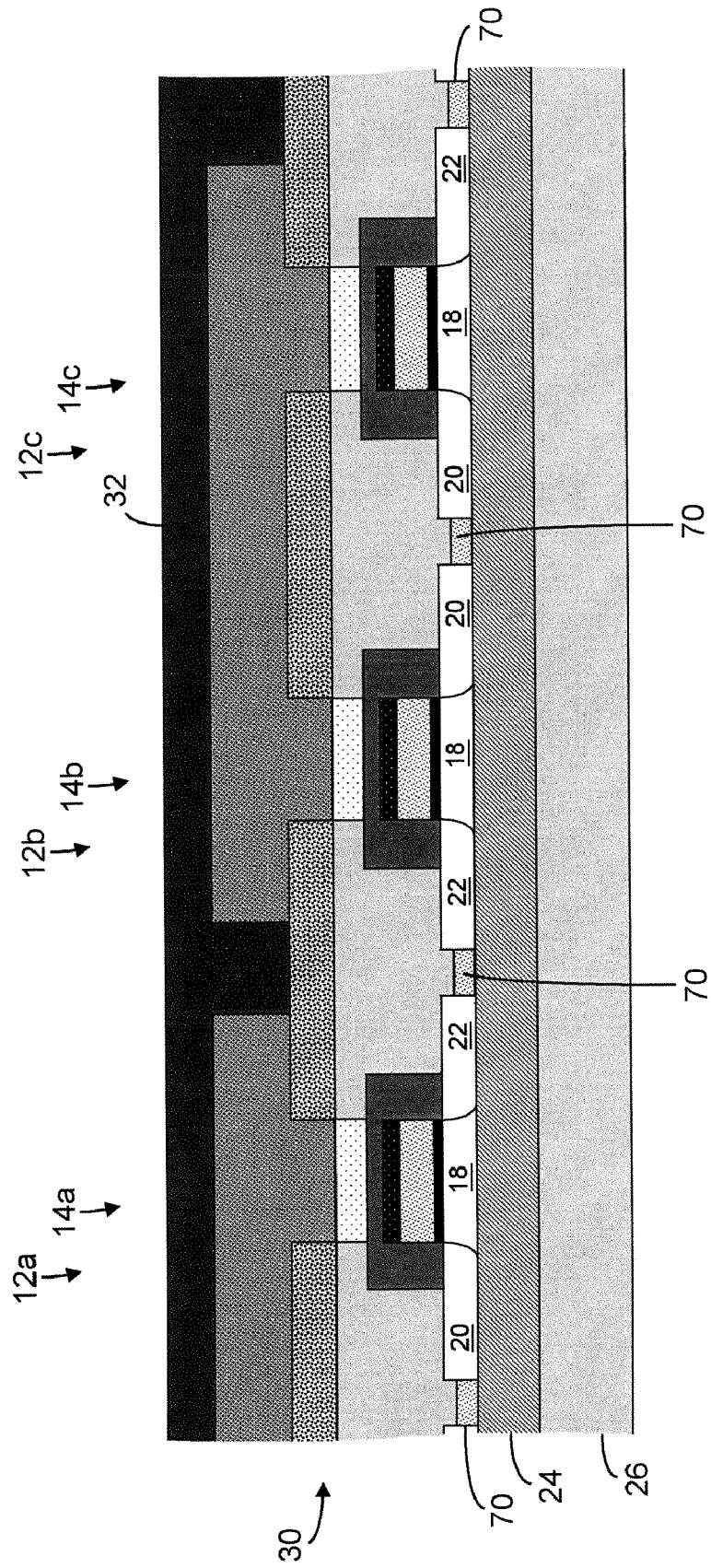

The barriers 70 may be substantially planar relative to the source and/or drain regions (see, FIG. 30A), wherein the barriers 70 are substantially planar with respect to the upper surface of source regions 20 and drain regions 22. In another embodiment, the height of the barriers 70 may be less than the height of the source and/or drain regions (see, FIG. 30B, wherein the barriers 70 do not provide a substantially planar relative to the source and/or drain regions and, as such, the height of barriers 70 is less than the height of the upper or top surface of source regions 20 and drain regions 22).

Figure 30C:
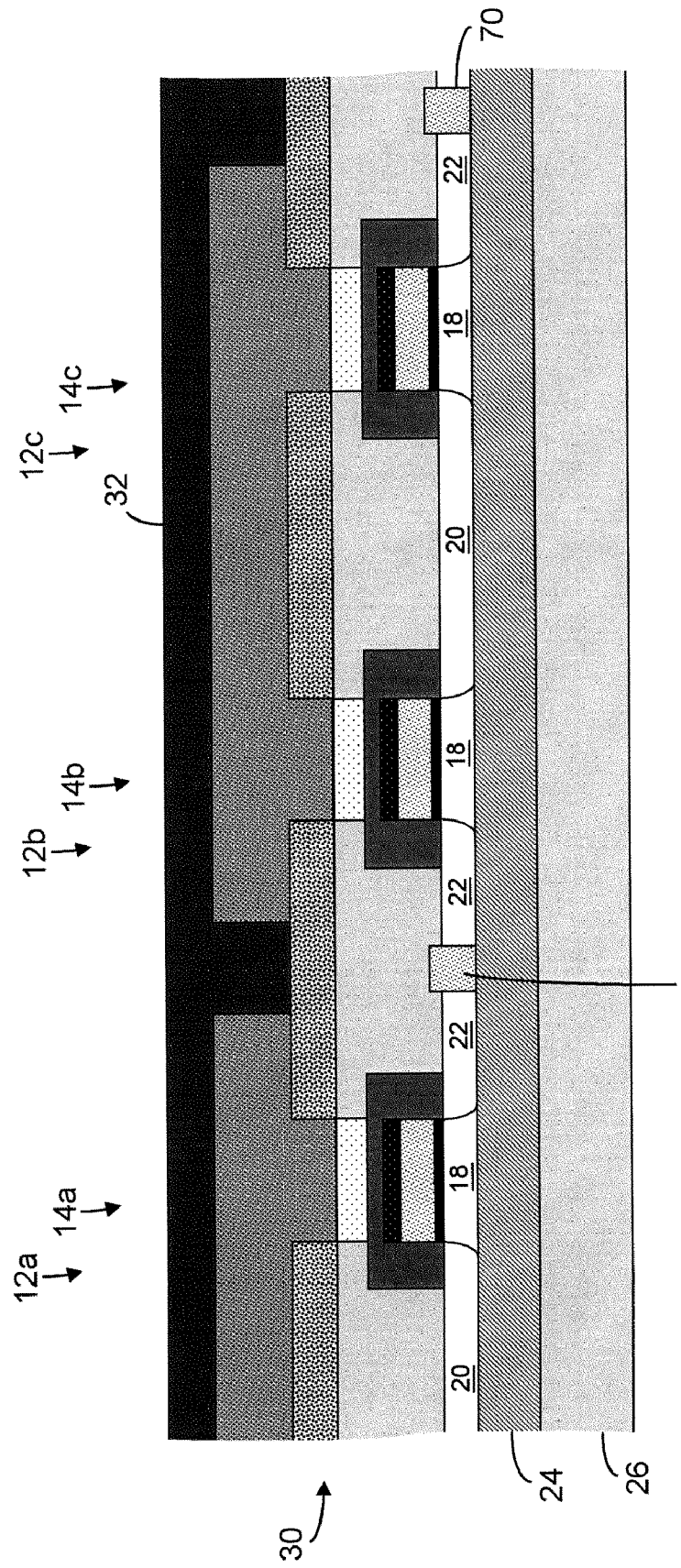
Figure 30D:
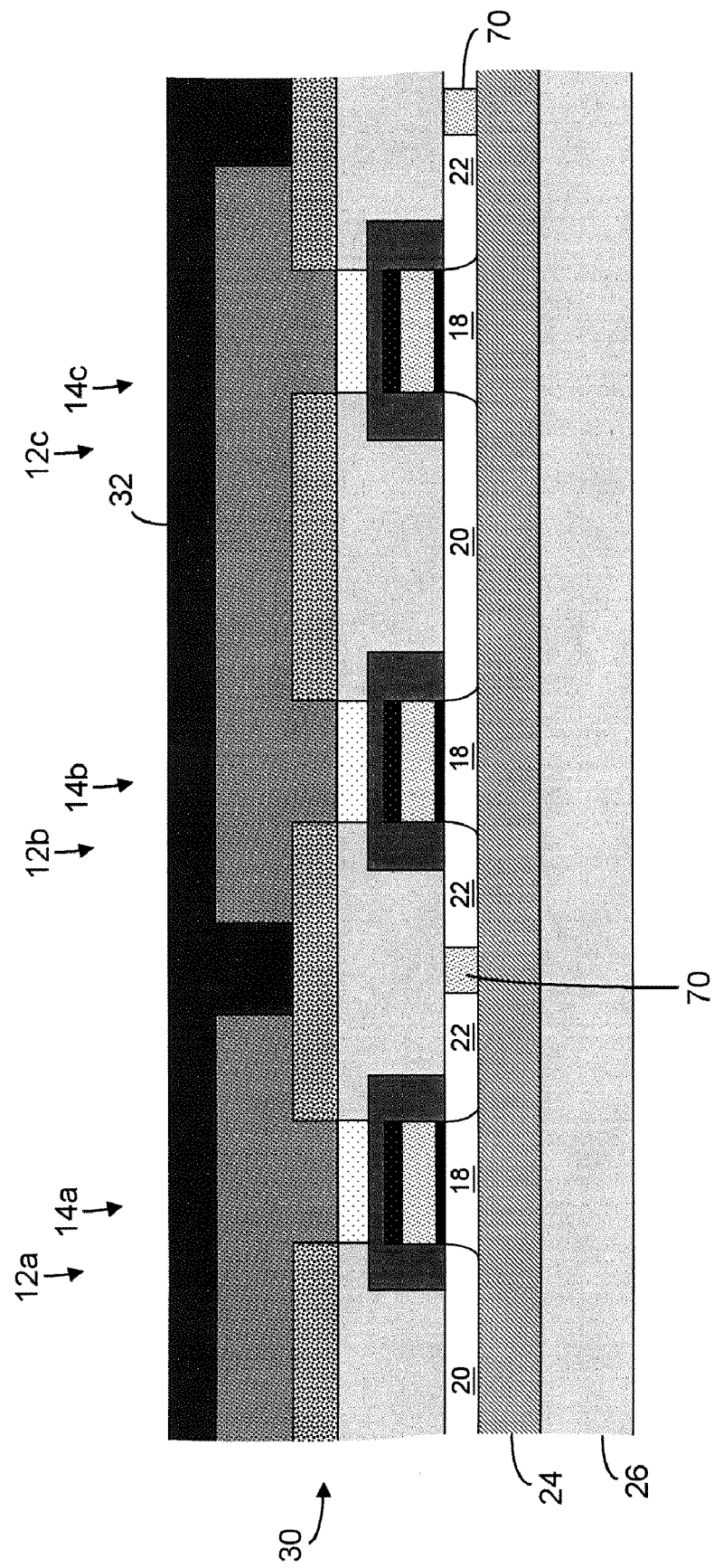
FIGS. 30D-30F are cross-sectional view of a portion of memory cell array wherein each illustrates an exemplary embodiment of the present inventions in conjunction with the shared drain region according to an aspect of the present inventions or shared source region according to an aspect of the present inventions wherein the barriers between the shared drain or source regions of the electrically floating body transistors of adjacent memory cells.
Figure 30E:
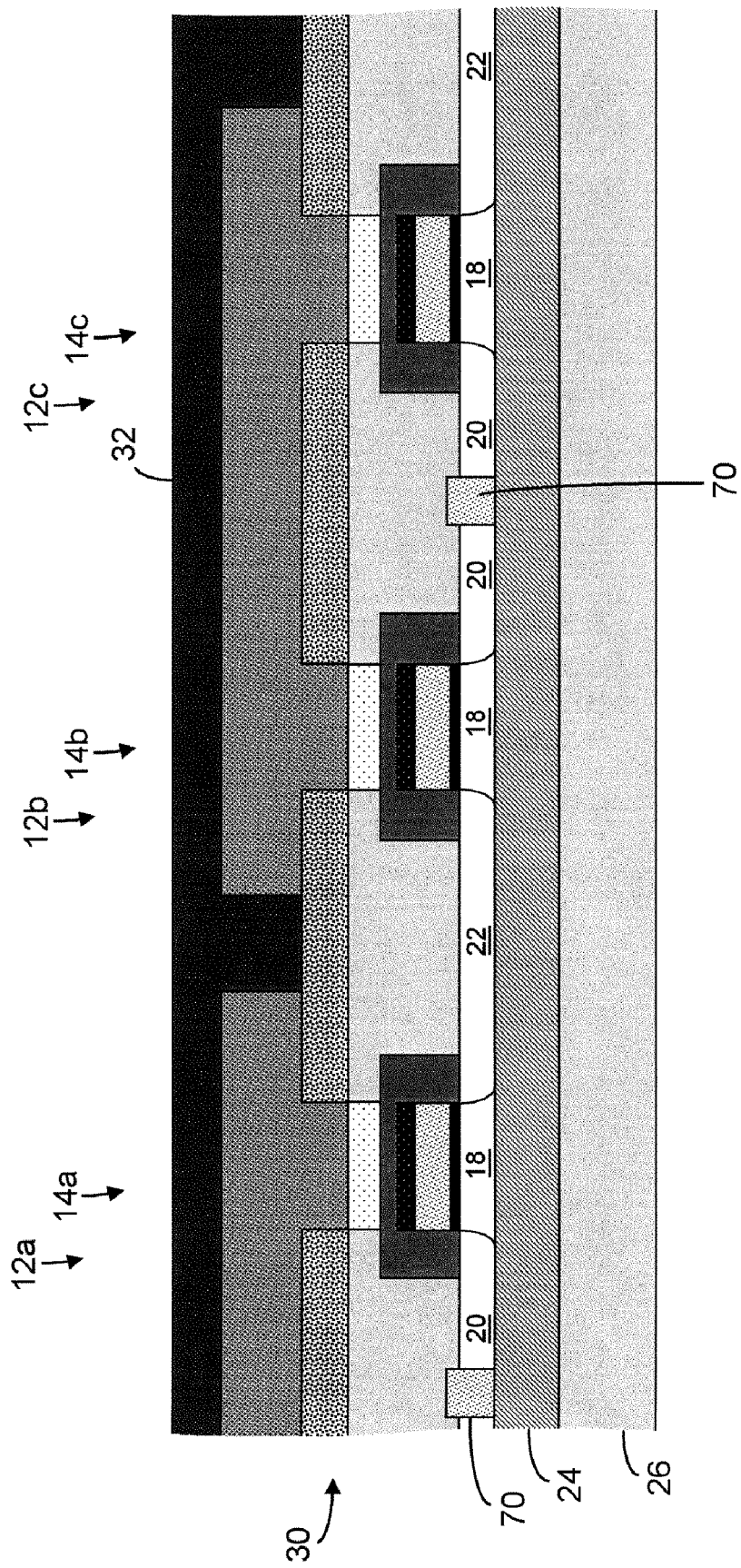
Figure 30F:
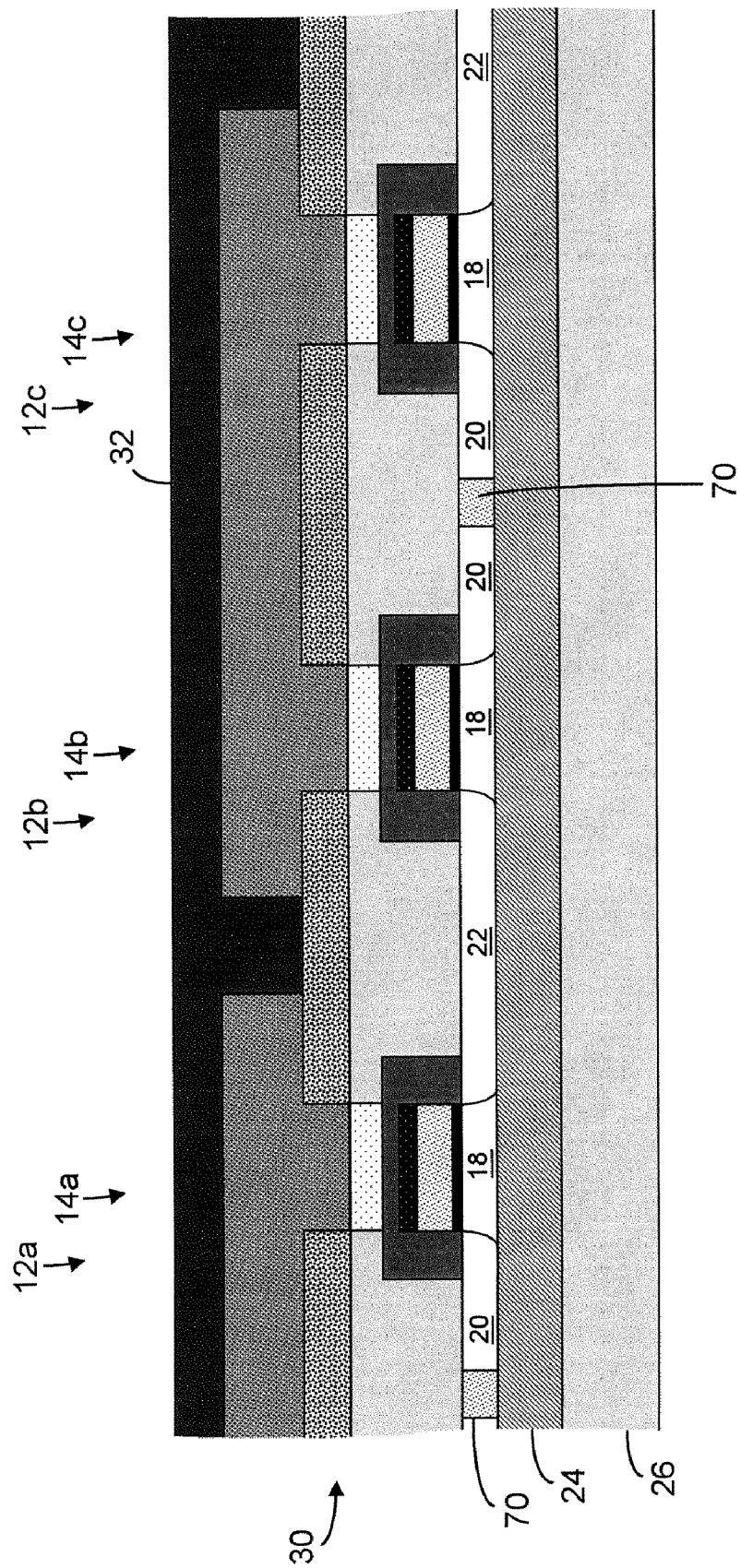
Figure 31:
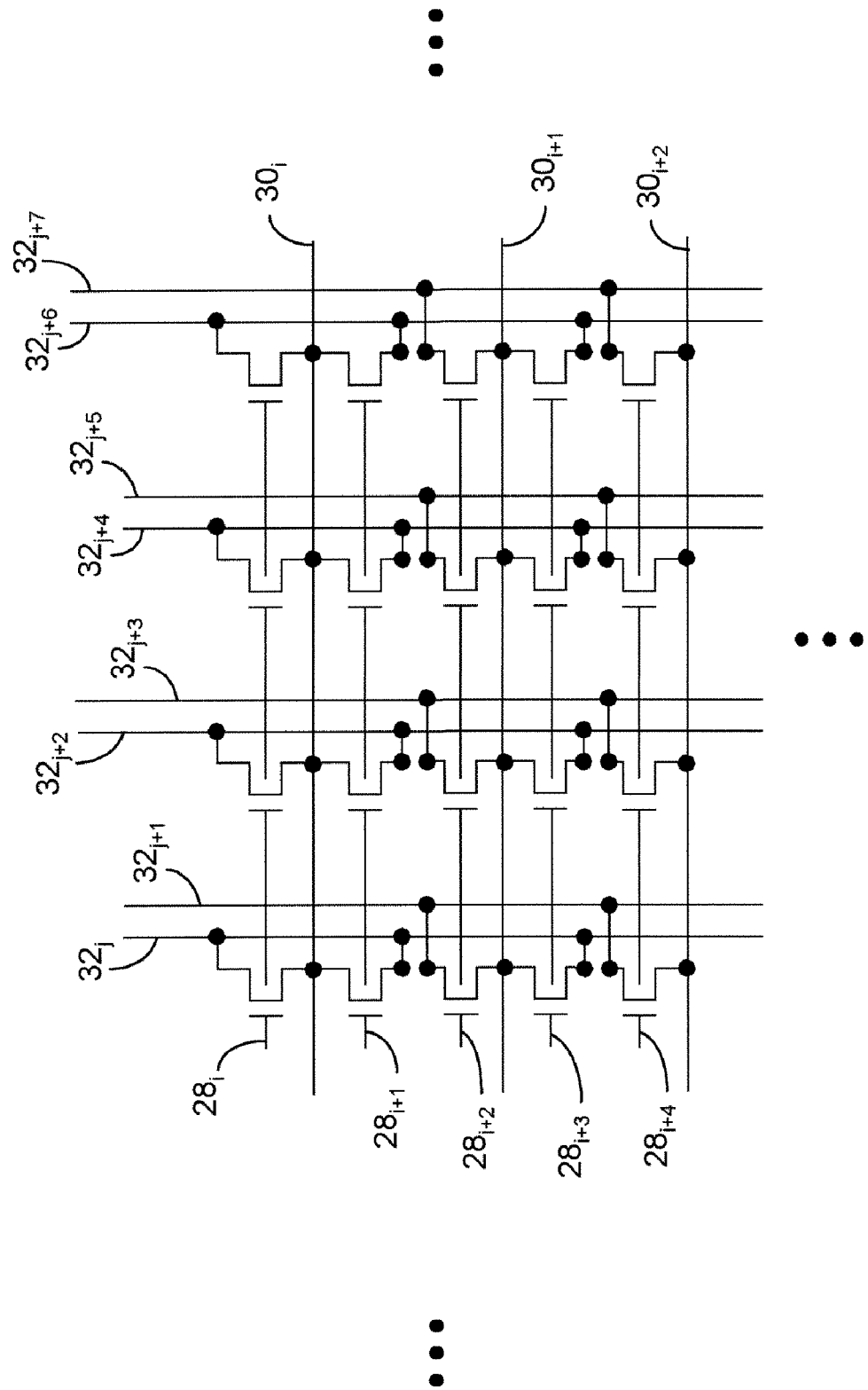
FIG. 31 is a schematic representation of a memory cell array including a plurality of memory cells comprised of one electrically floating body transistor wherein the memory cell array includes separate drain lines such that the drain region of each memory cell of a given row of memory cells are separated from the drain region of each memory cell of the adjacent row(s) of memory cells.
Figure 32:
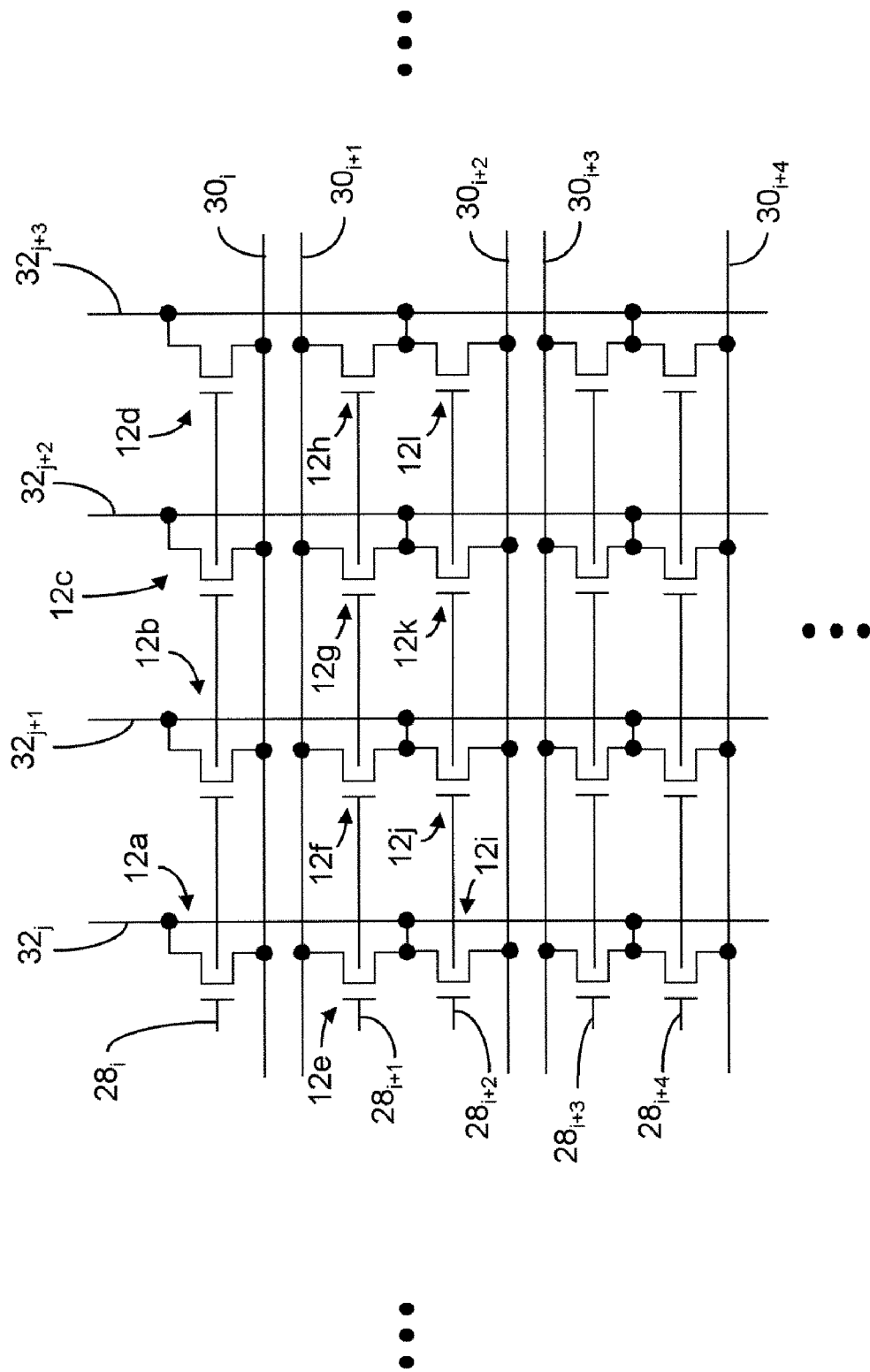
FIG. 32 is a schematic representation of a memory cell array including a plurality of memory cells comprised of one electrically floating body transistor wherein the memory cell array includes separate source lines such that the source region of each memory cell of a given row of memory cells are separated from the source region of each memory cell of the adjacent row(s) of memory cells.

Moreover, the present inventions may employ barriers 70 in conjunction with many different array configurations. For example, the present inventions may employ barriers 70 between the common drain regions (see, FIGS. 30C and 30D) or barriers 70 between the common source regions (see, FIGS. 30E and 30F) or between both the common drain regions and common source regions (see, for example, FIGS. 30A and 30B). Indeed, the present inventions may be implemented in memory cell array architectures that do not include both common drain regions (see, FIG. 31) and/or common source regions (see, FIG. 32).

In addition, in those instances where the memory cell array is arranged or configured to include a memory cell array having a plurality of memory cells, arranged in a matrix of rows and columns, wherein each memory cell of a given row of memory cells shares a source region and/or a drain region with an adjacent memory cell of an adjacent row of memory cells, the present inventions may be employed in conjunction with the source/drain processing described and illustrated in U.S. patent application Ser. No. 12/332,413 and U.S. Provisional Application Ser. No. 61/007,103 (Inventor: Liu); the contents of these applications are incorporated by reference herein in their entirety. (See, for example, FIG. 33).

Importantly, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations are not discussed separately herein.

As such, the above embodiments of the present inventions are merely exemplary embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the exemplary embodiments of the inventions has been presented for the purposes of illustration and description. Many modifications and variations are possible in light of the above teaching. It is intended that the scope of the inventions not be limited solely to the description above.

For example, in certain embodiments of the present inventions, the work functions of the transistors of the memory cells of the memory section may be substantially similar or the same as the work functions of the transistors in the logic section. In these embodiments, the gate material of the transistors of the memory cells of the memory section and the transistors of the logic section may be comprised of a mid-gap gate material with a work function of between 4 ev and 5 eV and, in a preferred embodiment, approximately 4.5 eV. Such embodiments may facilitate or simplify process integration.

Further, although exemplary embodiments and/or processes have been described above according to a particular order, that order should not be interpreted as limiting but is merely exemplary. Moreover, implementing and/or including certain processes and/or materials may be unnecessary and/or may be omitted. For example, certain masks, dopants and other materials may be eliminated or introduced at different stages of the process. (for example, in one embodiment, concurrently with the deposition of semiconductor layer 40, or thereafter—as illustrated in FIG. 13C, a dopant is implanted or introduced into semiconductor layer 40 to increase the work function of the material.

As noted above, in one embodiment, an acceptor type doping species or p-type dopant (such as, for example, boron, gallium, or other element in group 13 of the periodic table as well as compounds (for example, boron difluoride, $BF_2$) having acceptor type characteristics) may be implanted in semiconductor layer 40 (for example, polycrystalline silicon) to increase the work function of the gate material of the transistors of the memory cells. In this way, the conductivity of semiconductor layer 40 is adjusted such that the negative charge carriers in layer 40 are reduced (relative to, for example, an intrinsic semiconductor material). The gate may be comprised of other materials—indeed, any material having a work function greater than n+ polycrystalline silicon (for example, a work function that is greater than 4 eV). In one embodiment, the gate material includes or is a metal—such as palladium (Pd), platinum (Pt), gold (Au), molybdenum nitride (MoN), tungsten nitride (WN), titanium nitride (TiN), iridium (Ir), iridium oxide ($IrO_2$), ruthenium (Ru), ruthenium oxide ($RuO_2$). Under those circumstances where a material (other than p+ polycrystalline silicon) having a work function that is greater than 4 eV and/or 5 eV is more readily implemented into the process flow, for example, more easily than p+ polycrystalline silicon, it may be advantageous to employ such material in addition to p+ polycrystalline silicon or in lieu thereof. Moreover, where such material is a metal or metal compound, such material may provide less polycrystalline depletion effects because it is a metal layer thereby providing a larger gate capacitance and potentially greater reliability and less variability (which may present better or enhanced manufacturability).

Notably, electrically floating body transistor 14 of memory cell 12 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical transistor device are typically not interchangeable. This notwithstanding, the drain region of the electrically floating n-channel transistor of the memory cell (whether the source and drain regions are interchangeable or not) is that region of the transistor that is connected to the bit line which is coupled to data sense circuitry (for example, a sense amplifier and/or an analog-to-digital converter).

The term "depositing" and other forms thereof (i.e., deposit, deposition and/or deposited) in the claims, means, among other things, depositing, creating, forming and/or growing a material (for example, a layer of material). Further, in the claims, the term "etching" and other forms thereof (i.e., etch and/or etched) in the claims, means, among other things, etching, removing and/or patterning a material (for example, all or a portion of a layer of material). In addition, the term "forming" and other forms thereof (i.e., form, formation and/or formed) in the claims means, among other things, fabricating, providing, etching, creating, depositing, implanting, manufacturing and/or growing a region (for example, in a material or a layer of a material).

What is claimed is:

1. A method of manufacture of an integrated circuit device including (i) a memory section including a plurality of memory cells, wherein each memory cell thereof includes at least one n-channel transistor having a gate, gate dielectric and first, second and body regions, and (ii) a logic section including a plurality of n-channel transistors having a gate, gate dielectric and first, second and body regions, the method comprising:
    depositing a gate dielectric material on or above a semiconductor substrate;
    depositing a gate semiconductor material on or over the gate dielectric material;
    implanting or introducing one or more acceptor-type doping species into at least portions of the gate semiconductor material within the memory section;
    forming the gates of the n-channel transistors of the plurality of memory cells of the memory section from at least the gate semiconductor material having one or more acceptor-type doping species implanted or introduced therein, wherein the gates of the n-channel transistors of the plurality of memory cells include work functions based at least partially on a work function of one or more materials comprising the gates of the n-channel transistors of the plurality of memory cells of the memory section;
    forming the gates of the n-channel transistors of the logic section from at least the gate semiconductor material within the logic section; and
    introducing one or more donor-type doping species into at least portions of the gate semiconductor material in the logic section,
    wherein the gates of the n-channel transistors of the logic section include work functions based at least partially on a work function of one or more materials comprising the gates of the n-channel transistors of the logic section, and wherein the work functions of the gates of the n-channel transistors of the plurality of memory cells of the memory section are greater than the work functions of the gates of the plurality of n-channel transistors of the logic section such that a threshold voltage of the n-channel transistors of the plurality of memory cells of the memory section is less than a threshold voltage of the plurality of n-channel transistors of the logic section resulting in a reduction in applied voltages and power consumption for operations on the n-channel transistors of the plurality of memory cells of the memory section as compared to the plurality of n-channel transistors of the logic section.

2. The method of manufacture of claim 1 wherein the one or more acceptor-type doping species are implanted or introduced into at least portions of the gate semiconductor material in the memory section concurrently with the deposition of the gate semiconductor material on or over the gate dielectric material.

3. The method of manufacture of claim 1 wherein the one or more acceptor-type doping species are implanted or introduced into at least portions of the gate semiconductor material in the memory section after the deposition of the gate semiconductor material on or over the gate dielectric material.

4. The method of manufacture of claim 1 wherein the gate semiconductor material is a silicon material.

5. The method of manufacture of claim 1 further including forming a mask on or over the gate semiconductor material within the logic section before implanting or introducing one or more acceptor-type doping species into at least portions of the gate semiconductor material in the memory section.

6. The method of manufacture of claim 1 wherein the work function of the gates of the n-channel transistors of the plurality of memory cells of the memory section are greater than or equal to 4 eV.

7. A method of manufacture of an integrated circuit device including (i) a memory section including a plurality of memory cells, wherein each memory cell thereof includes at least one n-channel transistor having a gate, gate dielectric and first, second and body regions, and (ii) a logic section including a plurality of n-channel transistors having a gate, gate dielectric and first, second and body regions, the method comprising:
    depositing a gate dielectric material on or above a semiconductor substrate;
    depositing a gate semiconductor material on or over the gate dielectric material;
    implanting or introducing one or more acceptor-type doping species into at least portions of the gate semiconductor material within the memory section;
    depositing a first material on or above the gate semiconductor material having one or more acceptor-type doping species implanted or introduced therein;
    depositing a second material on or above the first material;
    forming the gates of the n-channel transistors of the plurality of memory cells of the memory section from: (i) at least the gate semiconductor material having one or more acceptor-type doping species implanted or introduced therein, (ii) the first material and (iii) the second material, wherein the gates of the n-channel transistors of the plurality of memory cells include work functions based at least partially on a work function of (i) the gate semiconductor material having one or more acceptor-type doping species implanted or introduced therein, (ii) the first material and (iii) the second material;

forming the gates of the n-channel transistors of the logic section from at least the gate semiconductor material within the logic section; and introducing one or more donor-type doping species into at least portions of the gate semiconductor material in the logic section, wherein the gates of the n-channel transistors of the logic section include work functions based at least partially on a work function of one or more materials comprising the gates of the n-channel transistors of the logic section;

wherein the work functions of the gates of the n-channel transistors of the plurality of memory cells of the memory section are greater than the work functions of the gates of the plurality of n-channel transistors of the logic section such that a threshold voltage of the n-channel transistors of the plurality of memory cells of the memory section is less than a threshold voltage of the plurality of n-channel transistors of the logic section resulting in a reduction in applied voltages and power consumption for operations on the n-channel transistors of the plurality of memory cells of the memory section as compared to the plurality of n-channel transistors of the logic section.

8. The method of manufacture of claim 7 wherein the first material is a barrier-type material.

9. The method of manufacture of claim 8 wherein the first material is titanium nitride, tantalum nitride or tungsten nitride.

10. The method of manufacture of claim 8 wherein the second material includes a metal material.

11. The method of manufacture of claim 10 wherein the metal material includes a copper, chromium, gold, silver, molybdenum, platinum, palladium, tungsten or titanium.

12. The method of manufacture of claim 10 wherein the metal material includes a metal stack, complex metal, conducting alloy and/or complex metal stack.

13. The method of manufacture of claim 10 wherein the one or more acceptor-type doping species are implanted or introduced into at least portions of the gate semiconductor material in the memory section concurrently with the deposition of the gate semiconductor material on or over the gate dielectric material.

14. The method of manufacture of claim 10 wherein the one or more acceptor-type doping species are implanted or introduced into at least portions of the gate semiconductor material in the memory section after the deposition of the gate semiconductor material on or over the gate dielectric material.

15. The method of manufacture of claim 10 further including masking the gate semiconductor material within the logic section while implanting or introducing one or more acceptor-type doping species into at least portions of the gate semiconductor material in the memory section.

16. The method of manufacture of claim 10 further including implanting or introducing one or more donor-type doping species into at least portions of the gate semiconductor material in the logic section after forming the gates of the n-channel transistors of the logic section.

17. The method of manufacture of claim 10 wherein the gate semiconductor material is a silicon material.

18. The method of manufacture of claim 10 wherein the work functions of the gates of the n-channel transistors of the plurality of memory cells of the memory section are greater than or equal to 4 eV.

19. An integrated circuit device comprising:

a memory section including a plurality of memory cells, wherein each memory cell thereof includes:
   at least one n-channel transistor having a gate, gate dielectric and first, second and body regions, wherein:
      (i) the body region of each transistor is electrically floating, and
      (ii) the gate of the at least one n-channel transistor of each memory cell includes:
         (a) a gate semiconductor material, disposed on or over the gate dielectric material, including one or more acceptor-type doping species disposed therein, and
         (b) a work function based at least partially on the gate semiconductor material including one or more acceptor-type doping species disposed therein; and a logic section including at least one n-channel transistor having a gate, gate dielectric and first, second and body regions, wherein the gate of the at least one n-channel transistor of the logic section includes:
   (i) a gate semiconductor material disposed on or over the gate dielectric material, including one or more donor-type doping species disposed therein, and
   (ii) a work function based at least partially on the gate semiconductor material of the at least one n-channel transistor of the logic section; and wherein the work functions of the gates of the n-channel transistors of the plurality of memory cells of the memory section are greater than the work function of the gate of the at least one n-channel transistor of the logic section such that a threshold voltage of the n-channel transistors of the plurality of memory cells of the memory section is less than a threshold voltage of the at least one n-channel transistor of the logic section resulting in a reduction in applied voltages and power consumption for operations on the n-channel transistors of the plurality of memory cells of the memory section as compared to the at least one n-channel transistor of the logic section.

20. The integrated circuit device of claim 19 wherein the gate semiconductor material is a silicon material.

21. The integrated circuit device of claim 19 wherein the one or more donor-type doping species are disposed in the gate semiconductor material of the gate of the at least one n-channel transistor of the logic section after formation of the gate of the at least one n-channel transistor of the logic section.

22. The integrated circuit device of claim 19 wherein:
the gates of the n-channel transistors of the memory cells of the memory section include:
   a first material on or above the gate semiconductor material having one or more acceptor-type doping species implanted or introduced therein, and
   a second material on or above the first material; and
the gate of the at least one n-channel transistor of the logic section includes:
   the first material on or above the gate semiconductor material, and
   the second material on or above the first material.

23. The integrated circuit device of claim 22 wherein the first material is a barrier-type material.

24. The integrated circuit device of claim 23 wherein the barrier-type material is titanium nitride, tantalum nitride and/or tungsten nitride.

25. The integrated circuit device of claim 23 wherein the second material is a metal material.

26. The integrated circuit device of claim 25 wherein the metal material includes a metal stack, complex metal, conducting alloy and/or complex metal stack.

27. The integrated circuit device of claim 25 wherein the second material includes copper, chromium, gold, silver, molybdenum, platinum, palladium, tungsten and/or titanium.

28. An integrated circuit device comprising:
a memory section including a plurality of memory cells, wherein each memory cell thereof includes:
at least one n-channel transistor having a gate, gate dielectric and first, second and body regions, wherein:
(i) the body region of each transistor is electrically floating and wherein the data state of the memory cell is stored in the electrically floating body region of the associated n-channel transistor, and
(ii) the gate of the at least one n-channel transistor of each memory cell includes:
(a) a gate semiconductor material, disposed on or over the gate dielectric material, including one or more donor-type doping species disposed therein, and
(b) a work function based at least partially on the gate semiconductor material of the at least one n-channel transistor of the memory section; and
a logic section including at least one n-channel transistor having a gate, gate dielectric and first, second and body regions, wherein the gate of the at least one n-channel transistor of the logic section includes:
(i) a gate semiconductor material disposed on or over the gate dielectric material, and
(ii) a work function based at least partially on the gate semiconductor material of the at least one n-channel transistor of the logic section;
wherein the work functions of the gates of the n-channel transistors of the plurality of memory cells of the memory section are greater than the work function of the gate of the at least one n-channel transistor of the logic section such that a threshold voltage of the n-channel transistors of the plurality of memory cells of the memory section is less than a threshold voltage of the at least one n-channel transistor of the logic section resulting in a reduction in applied voltages and power consumption for operations on the n-channel transistors of the plurality of memory cells of the memory section as compared to the at least one n-channel transistor of the logic section.

29. The integrated circuit device of claim 28 wherein the gate semiconductor material of the gate of the n-channel transistors of the memory cells of the memory section include one or more acceptor-type doping species disposed therein.

30. The integrated circuit device of claim 28 wherein the work functions of the gates of the n-channel transistors of the plurality of memory cells of the memory section are greater than or equal to 4 eV.

31. The integrated circuit device of claim 30 wherein:
the gates of the n-channel transistors of the memory cells of the memory section include:
a first material on or above the gate semiconductor material of the n-channel transistors of the memory cells, and
a second material on or above the first material of the n-channel transistors of the memory cells; and
the gate of the at least one n-channel transistor of the logic section includes:
a first material on or above the gate semiconductor material of the at least one n-channel transistor of the logic section, and
a second material on or above the first material of the at least one n-channel transistor of the logic section.

32. The integrated circuit device of claim 31 wherein the first materials are barrier-type materials.

33. The integrated circuit device of claim 32 wherein the barrier-type materials are selected from the group consisting of titanium nitride, tantalum nitride and tungsten nitride.

34. The integrated circuit device of claim 32 wherein the second materials are metal material.

35. The integrated circuit device of claim 34 wherein the metal materials include metal stacks, complex metals, conducting alloys and/or complex metal stacks.

36. The integrated circuit device of claim 34 wherein the second materials are selected from the group consisting of copper, chromium, gold, silver, molybdenum, platinum, palladium, tungsten and titanium.

37. The integrated circuit device of claim 31 wherein the work functions of the gates of the n-channel transistors of the plurality of memory cells of the memory section are greater than or equal to 4 eV.

38. The method of manufacture of claim 1, wherein the operations comprise at least one of: a write operation on the n-channel transistors of the plurality of memory cells of the memory section; and a data state hold operation on the n-channel transistors of the plurality of memory cells of the memory section.

* * * * *